United States Patent
Toyoda

(10) Patent No.: US 9,465,220 B2
(45) Date of Patent: *Oct. 11, 2016

(54) ILLUMINATION OPTICAL APPARATUS, EXPOSURE APPARATUS, AND EXPOSURE METHOD WITH OPTICAL INTEGRATOR AND POLARIZATION MEMBER THAT CHANGES POLARIZATION STATE OF LIGHT

(71) Applicant: NIKON CORPORATION, Tokyo (JP)

(72) Inventor: Mitsunori Toyoda, Sendai (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/889,965

(22) Filed: May 8, 2013

(65) Prior Publication Data

US 2013/0242394 A1  Sep. 19, 2013

Related U.S. Application Data

(63) Continuation of application No. 13/137,002, filed on Jul. 14, 2011, which is a continuation of application No. 12/461,852, filed on Aug. 26, 2009, now abandoned, which is a continuation of application No. 11/319,057, filed on Dec. 28, 2005, now abandoned, which is a continuation-in-part of application No. PCT/JP2004/016247, filed on Nov. 2, 2004.

(30) Foreign Application Priority Data

Nov. 20, 2003 (JP) ................... 2003-390674

(51) Int. Cl.
G02B 27/09 (2006.01)
G02B 27/28 (2006.01)
(Continued)

(52) U.S. Cl.
CPC ......... *G02B 27/0927* (2013.01); *G02B 5/3025* (2013.01); *G02B 27/0944* (2013.01); *G02B27/28* (2013.01); *G02B 27/4233* (2013.01); *G02B 27/4261* (2013.01); *G03F 7/70158* (2013.01); *G03F 7/70566* (2013.01)

(58) Field of Classification Search
CPC ........... G03F 7/70191; G03F 7/70566; G03F 7/70158; G02B 27/4261
USPC ........................................................ 355/71
See application file for complete search history.

(56) References Cited

U.S. PATENT DOCUMENTS 3,146,294 A  8/1964 Koester et al.
3,180,216 A  4/1965 Osterberg
(Continued)

FOREIGN PATENT DOCUMENTS

CN  1453645 A  11/2003
CN  1501175 A  6/2004
(Continued)

OTHER PUBLICATIONS

Jul. 15, 2013 Office Action issued in Chinese Patent Application No. 200910173718.X (with translation).
(Continued)

*Primary Examiner* — Chia-How Michael Liu
(74) *Attorney, Agent, or Firm* — Oliff PLC

(57) ABSTRACT

An illumination optical apparatus illuminates a pattern on a mask with illumination light. The illumination optical apparatus includes an optical integrator arranged in an optical path of the illumination light, and a polarization member made of optical material with optical rotatory power, which is arranged in the optical path on an incidence side of the optical integrator, and which changes a polarization state of the illumination light. The illumination light from the polarization member is irradiated onto the pattern through a pupil plane of the illumination optical apparatus.

49 Claims, 26 Drawing Sheets

(51) Int. Cl.
*G02B 27/42* (2006.01)
*G03F 7/20* (2006.01)
*G02B 5/30* (2006.01)

(56) References Cited

U.S. PATENT DOCUMENTS

| | | |
|---|---|---|
| 3,758,201 A | 9/1973 | MacNeille |
| 3,892,469 A | 7/1975 | Lotspeich |
| 3,892,470 A | 7/1975 | Lotspeich |
| 4,103,260 A | 7/1978 | Buchman |
| 4,175,830 A | 11/1979 | Marie |
| 4,198,123 A | 4/1980 | Kremen |
| 4,211,471 A | 7/1980 | Marie |
| 4,286,843 A | 9/1981 | Reytblatt |
| 4,346,164 A | 8/1982 | Tabarelli et al. |
| 4,370,026 A | 1/1983 | Dubroeucq et al. |
| 4,744,615 A | 5/1988 | Fan et al. |
| 4,755,027 A | 7/1988 | Schäfer |
| 4,952,815 A | 8/1990 | Nishi |
| 4,981,342 A | 1/1991 | Fiala |
| 5,072,126 A | 12/1991 | Progler |
| 5,216,541 A | 6/1993 | Takesue et al. |
| 5,251,222 A | 10/1993 | Hester et al. |
| 5,253,110 A | 10/1993 | Ichihara et al. |
| 5,272,501 A | 12/1993 | Nishi et al. |
| 5,312,513 A | 5/1994 | Florence et al. |
| 5,345,292 A | 9/1994 | Shiozawa et al. |
| 5,365,371 A | 11/1994 | Kamon |
| 5,382,999 A | 1/1995 | Kamon |
| 5,436,761 A | 7/1995 | Kamon |
| 5,448,336 A | 9/1995 | Shiraishi |
| 5,459,000 A | 10/1995 | Unno |
| 5,467,166 A | 11/1995 | Shiraishi |
| 5,473,465 A | 12/1995 | Ye |
| 5,541,026 A | 7/1996 | Matsumoto |
| 5,559,583 A | 9/1996 | Tanabe |
| 5,610,683 A | 3/1997 | Takahashi |
| 5,610,684 A | 3/1997 | Shiraishi |
| 5,621,498 A | 4/1997 | Inoue et al. |
| 5,627,626 A | 5/1997 | Inoue et al. |
| 5,631,721 A | 5/1997 | Stanton et al. |
| 5,663,785 A | 9/1997 | Kirk et al. |
| 5,673,103 A | 9/1997 | Inoue et al. |
| 5,675,401 A | 10/1997 | Wangler et al. |
| 5,677,755 A | 10/1997 | Oshida et al. |
| 5,677,757 A | 10/1997 | Taniguchi et al. |
| 5,684,567 A | 11/1997 | Shiozawa |
| 5,691,803 A | 11/1997 | Song et al. |
| 5,707,501 A | 1/1998 | Inoue et al. |
| 5,739,898 A | 4/1998 | Ozawa et al. |
| 5,838,408 A | 11/1998 | Inoue et al. |
| 5,841,500 A | 11/1998 | Patel |
| 5,933,219 A | 8/1999 | Unno |
| 5,969,441 A | 10/1999 | Loopstra et al. |
| 6,031,658 A | 2/2000 | Riza |
| 6,191,829 B1 | 2/2001 | Hashimoto |
| 6,191,880 B1 | 2/2001 | Schuster |
| 6,208,407 B1 | 3/2001 | Loopstra |
| 6,211,944 B1 | 4/2001 | Shiraishi |
| 6,229,647 B1 | 5/2001 | Takahashi et al. |
| 6,233,041 B1 | 5/2001 | Shiraishi |
| 6,238,063 B1 | 5/2001 | Tanitsu et al. |
| 6,252,647 B1 | 6/2001 | Shiraishi |
| 6,252,712 B1 | 6/2001 | Furter et al. |
| 6,259,512 B1 | 7/2001 | Mizouchi |
| 6,304,317 B1 | 10/2001 | Taniguchi et al. |
| 6,333,776 B1 | 12/2001 | Taniguchi |
| 6,341,007 B1 | 1/2002 | Nishi et al. |
| 6,361,909 B1 | 3/2002 | Gau et al. |
| 6,366,404 B1 | 4/2002 | Hiraiwa et al. |
| 6,373,614 B1 | 4/2002 | Miller |
| 6,392,800 B2 | 5/2002 | Schuster |
| 6,400,441 B1 | 6/2002 | Nishi et al. |
| 6,404,482 B1 | 6/2002 | Shiraishi |
| 6,406,148 B1 | 6/2002 | Marshall et al. |
| 6,452,662 B2 | 9/2002 | Mulkens et al. |
| 6,466,303 B1 | 10/2002 | Omura et al. |
| 6,483,573 B1 | 11/2002 | Schuster |
| 6,498,869 B1 | 12/2002 | Yao |
| 6,522,483 B2 | 2/2003 | Kreuzer |
| 6,535,273 B1 | 3/2003 | Maul |
| 6,538,247 B2 | 3/2003 | Iizuka |
| 6,549,269 B1 | 4/2003 | Nishi et al. |
| 6,577,379 B1 | 6/2003 | Boettiger et al. |
| 6,583,931 B2 | 6/2003 | Hiraiwa et al. |
| 6,590,634 B1 | 7/2003 | Nishi et al. |
| 6,597,430 B1 | 7/2003 | Nishi et al. |
| 6,606,144 B1 | 8/2003 | Omura |
| 6,636,295 B2 | 10/2003 | Shiozawa |
| 6,646,690 B1 | 11/2003 | Takezawa |
| 6,661,499 B2 | 12/2003 | Omura et al. |
| 6,665,119 B1 | 12/2003 | Kurtz et al. |
| 6,674,513 B2 | 1/2004 | Omura |
| 6,674,514 B2 | 1/2004 | Shinoda |
| 6,680,798 B2 | 1/2004 | Kreuzer |
| 6,698,891 B2 | 3/2004 | Kato |
| 6,710,855 B2 | 3/2004 | Shiraishi |
| 6,762,824 B2 | 7/2004 | Mori |
| 6,769,273 B1 | 8/2004 | Nakagawa et al. |
| 6,771,350 B2 | 8/2004 | Nishinaga |
| 6,774,984 B2 | 8/2004 | Gerhard |
| 6,831,731 B2 | 12/2004 | Omura et al. |
| 6,836,365 B2 | 12/2004 | Goto |
| 6,836,380 B2 | 12/2004 | Kreuzer |
| 6,842,223 B2 | 1/2005 | Tyminski |
| 6,844,982 B2 | 1/2005 | Omura |
| 6,856,379 B2 | 2/2005 | Schuster |
| 6,864,961 B2 | 3/2005 | Omura |
| 6,870,668 B2 | 3/2005 | Ozawa |
| 6,876,437 B2 | 4/2005 | Kawahara |
| 6,885,493 B2 | 4/2005 | Ljungblad et al. |
| 6,891,655 B2 | 5/2005 | Grebinski et al. |
| 6,900,915 B2 | 5/2005 | Nanjyo et al. |
| 6,913,373 B2 | 7/2005 | Tanaka et al. |
| 6,934,009 B2 | 8/2005 | Terashi |
| 6,958,806 B2 | 10/2005 | Mulder et al. |
| 6,965,484 B2 | 11/2005 | Shaver |
| 6,970,233 B2 | 11/2005 | Blatchford |
| 6,977,718 B1 | 12/2005 | LaFontaine |
| 6,999,157 B2 | 2/2006 | Kohno |
| 7,009,686 B2 | 3/2006 | Kawashima et al. |
| 7,031,077 B2 | 4/2006 | Kreuzer |
| 7,038,763 B2 | 5/2006 | Mulder et al. |
| 7,061,583 B2 | 6/2006 | Mulkens et al. |
| 7,095,546 B2 | 8/2006 | Mala et al. |
| 7,098,992 B2 | 8/2006 | Ohtsuki et al. |
| 7,130,025 B2 | 10/2006 | Tsuji |
| 7,145,720 B2 | 12/2006 | Krahmer et al. |
| 7,217,503 B2 | 5/2007 | Saitoh et al. |
| 7,239,446 B2 | 7/2007 | Kreuzer |
| 7,245,353 B2 | 7/2007 | Mulkens et al. |
| 7,245,355 B2 | 7/2007 | Mulkens et al. |
| 7,295,286 B2 | 11/2007 | Matsuura |
| 7,345,740 B2 | 3/2008 | Wagner et al. |
| 7,408,616 B2 | 8/2008 | Gruner et al. |
| 7,433,046 B2 | 10/2008 | Everett et al. |
| 7,446,858 B2 | 11/2008 | Kudo et al. |
| 7,508,493 B2 | 3/2009 | Takeuchi et al. |
| 7,847,921 B2 | 12/2010 | Gruner et al. |
| 2001/0012154 A1 | 8/2001 | Schuster |
| 2001/0019404 A1 | 9/2001 | Schuster et al. |
| 2001/0035942 A1 | 11/2001 | Hara et al. |
| 2001/0046038 A1 | 11/2001 | Mulkens et al. |
| 2001/0052968 A1 | 12/2001 | Shiozawa |
| 2002/0001134 A1 | 1/2002 | Shinoda |
| 2002/0008863 A1 | 1/2002 | Taniguchi et al. |
| 2002/0024008 A1 | 2/2002 | Iizuka |
| 2002/0027719 A1 | 3/2002 | Kreuzer |
| 2002/0080338 A1 | 6/2002 | Taniguchi |
| 2002/0085176 A1 | 7/2002 | Hiraiwa et al. |
| 2002/0085276 A1 | 7/2002 | Tanitsu et al. |
| 2002/0101572 A1 | 8/2002 | Shiraishi |
| 2002/0126380 A1 | 9/2002 | Schuster |
| 2002/0152452 A1 | 10/2002 | Socha |

(56) References Cited

U.S. PATENT DOCUMENTS

| | | |
|---|---|---|
| 2002/0167653 A1 | 11/2002 | Mulkens et al. |
| 2002/0176166 A1 | 11/2002 | Schuster |
| 2002/0177048 A1 | 11/2002 | Saitoh et al. |
| 2002/0177054 A1 | 11/2002 | Saitoh et al. |
| 2002/0186462 A1 | 12/2002 | Gerhard |
| 2002/0191288 A1 | 12/2002 | Gruner et al. |
| 2002/0196416 A1 | 12/2002 | Shiraishi |
| 2003/0007158 A1 | 1/2003 | Hill |
| 2003/0011756 A1 | 1/2003 | Omura et al. |
| 2003/0025890 A1 | 2/2003 | Nishinaga |
| 2003/0038225 A1 | 2/2003 | Mulder et al. |
| 2003/0038931 A1 | 2/2003 | Toyoda et al. |
| 2003/0043356 A1 | 3/2003 | Shiraishi |
| 2003/0053036 A1 | 3/2003 | Fujishima et al. |
| 2003/0086071 A1 | 5/2003 | McGuire, Jr. |
| 2003/0098959 A1 | 5/2003 | Hagiwara et al. |
| 2003/0103196 A1 | 6/2003 | Hirukawa |
| 2003/0128349 A1 | 7/2003 | Unno |
| 2003/0160949 A1 | 8/2003 | Komatsuda et al. |
| 2003/0174400 A1 | 9/2003 | Patel et al. |
| 2003/0206289 A1 | 11/2003 | Matsuyama |
| 2003/0214571 A1 | 11/2003 | Ishikawa et al. |
| 2003/0227607 A1 | 12/2003 | Kato et al. |
| 2004/0004771 A1 | 1/2004 | Omura |
| 2004/0012764 A1 | 1/2004 | Mulder et al. |
| 2004/0053148 A1 | 3/2004 | Morohoshi |
| 2004/0057034 A1 | 3/2004 | Zinn et al. |
| 2004/0057036 A1 | 3/2004 | Kawashima et al. |
| 2004/0100629 A1 | 5/2004 | Stokowski et al. |
| 2004/0104654 A1 | 6/2004 | Lee et al. |
| 2004/0119954 A1 | 6/2004 | Kawashima et al. |
| 2004/0120044 A1 | 6/2004 | Kreuzer |
| 2004/0150806 A1 | 8/2004 | Brunotte et al. |
| 2004/0160582 A1 | 8/2004 | Lof et al. |
| 2004/0169924 A1 | 9/2004 | Flagello et al. |
| 2004/0174512 A1 | 9/2004 | Toyoda et al. |
| 2004/0184019 A1 | 9/2004 | Totzeck et al. |
| 2004/0207386 A1 | 10/2004 | Durr |
| 2004/0227923 A1 | 11/2004 | Flagello et al. |
| 2004/0240073 A1 | 12/2004 | Gerhard |
| 2005/0024612 A1 | 2/2005 | Hirukawa et al. |
| 2005/0041232 A1 | 2/2005 | Yamada et al. |
| 2005/0094268 A1 | 5/2005 | Fiolka et al. |
| 2005/0095749 A1 | 5/2005 | Krellmann et al. |
| 2005/0122499 A1 | 6/2005 | Omura et al. |
| 2005/0128458 A1 | 6/2005 | Blatchford |
| 2005/0146704 A1 | 7/2005 | Gruner et al. |
| 2005/0168790 A1 | 8/2005 | Latypov et al. |
| 2005/0237509 A1 | 10/2005 | Blatchford |
| 2005/0237527 A1 | 10/2005 | Mori |
| 2005/0264885 A1 | 12/2005 | Albert |
| 2005/0270608 A1 | 12/2005 | Shiozawa et al. |
| 2006/0012769 A1 | 1/2006 | Suzuki |
| 2006/0050261 A1 | 3/2006 | Brotsack |
| 2006/0055834 A1 | 3/2006 | Tanitsu et al. |
| 2006/0072095 A1 | 4/2006 | Kudo et al. |
| 2006/0077370 A1 | 4/2006 | Mulkens et al. |
| 2006/0092398 A1 | 5/2006 | McCarthy |
| 2006/0132748 A1 | 6/2006 | Fukuhara |
| 2006/0139611 A1 | 6/2006 | Wagner et al. |
| 2006/0146384 A1 | 7/2006 | Schultz et al. |
| 2006/0158624 A1 | 7/2006 | Toyoda |
| 2006/0164711 A1 | 7/2006 | Govil et al. |
| 2006/0170901 A1 | 8/2006 | Tanitsu et al. |
| 2006/0171138 A1 | 8/2006 | Muramatsu et al. |
| 2006/0203214 A1 | 9/2006 | Shiraishi |
| 2006/0232841 A1 | 10/2006 | Toishi et al. |
| 2006/0291057 A1 | 12/2006 | Fiolka et al. |
| 2007/0008511 A1 | 1/2007 | De Boeij et al. |
| 2007/0019179 A1 | 1/2007 | Fiolka et al. |
| 2007/0058151 A1 | 3/2007 | Eurlings et al. |
| 2007/0081114 A1 | 4/2007 | Fiolka et al. |
| 2007/0146676 A1 | 6/2007 | Tanitsu et al. |
| 2007/0183017 A1 | 8/2007 | Hembd |
| 2007/0201338 A1 | 8/2007 | Yaoita et al. |
| 2007/0263199 A1 | 11/2007 | Fiolka et al. |
| 2007/0296936 A1 | 12/2007 | Kato et al. |
| 2007/0296941 A1 | 12/2007 | Omura |
| 2008/0021948 A1 | 1/2008 | Wilson et al. |
| 2008/0024747 A1 | 1/2008 | Kudo et al. |
| 2008/0030706 A1 | 2/2008 | Yamamoto |
| 2008/0030707 A1 | 2/2008 | Tanaka et al. |
| 2008/0068572 A1 | 3/2008 | Kudo et al. |
| 2008/0316459 A1 | 12/2008 | Fiolka et al. |
| 2008/0316598 A1 | 12/2008 | Fiolka et al. |
| 2009/0002675 A1 | 1/2009 | Fiolka et al. |
| 2009/0073411 A1 | 3/2009 | Tanitsu |
| 2009/0073414 A1 | 3/2009 | Tanitsu et al. |
| 2009/0073441 A1 | 3/2009 | Tanitsu et al. |
| 2009/0091730 A1 | 4/2009 | Tanaka |
| 2009/0097007 A1 | 4/2009 | Tanaka |
| 2009/0109417 A1 | 4/2009 | Tanitsu |
| 2009/0116093 A1 | 5/2009 | Tanitsu |
| 2009/0122292 A1 | 5/2009 | Shiraishi |
| 2009/0128886 A1 | 5/2009 | Hirota |
| 2009/0147233 A1 | 6/2009 | Toyoda |
| 2009/0147234 A1 | 6/2009 | Toyoda |
| 2009/0147235 A1 | 6/2009 | Toyoda |
| 2009/0185154 A1 | 7/2009 | Tanitsu |
| 2009/0185156 A1 | 7/2009 | Kudo et al. |
| 2009/0284729 A1 | 11/2009 | Shiraishi |
| 2009/0316132 A1 | 12/2009 | Tanitsu et al. |
| 2009/0323041 A1 | 12/2009 | Toyoda |
| 2010/0141921 A1 | 6/2010 | Omura |
| 2010/0141926 A1 | 6/2010 | Omura |
| 2010/0142051 A1 | 6/2010 | Omura |
| 2011/0037962 A1 | 2/2011 | Tanitsu |
| 2011/0069296 A1 | 3/2011 | Gruner et al. |
| 2011/0205519 A1 | 8/2011 | Kanayamaya et al. |
| 2011/0273692 A1 | 11/2011 | Toyoda |
| 2011/0273693 A1 | 11/2011 | Toyoda |
| 2011/0273697 A1 | 11/2011 | Tanitsu et al. |
| 2011/0273698 A1 | 11/2011 | Toyoda |
| 2011/0299055 A1 | 12/2011 | Toyoda |

FOREIGN PATENT DOCUMENTS

| | | |
|---|---|---|
| CN | 1573571 A | 2/2005 |
| DE | 206 607 | 2/1984 |
| DE | 221 563 A1 | 4/1985 |
| DE | 224 448 A1 | 7/1985 |
| DE | 242 880 A1 | 2/1987 |
| DE | 100 29 938 A1 | 7/2001 |
| DE | 101 23 725 A1 | 11/2002 |
| DE | 102 06 061 A1 | 9/2003 |
| DE | 103 43 333 A1 | 4/2005 |
| EP | 0 023 231 A1 | 2/1981 |
| EP | 0 208 552 A2 | 1/1987 |
| EP | 0 230 931 A2 | 8/1987 |
| EP | 0 564 264 A1 | 10/1993 |
| EP | 0 656 555 A1 | 6/1995 |
| EP | 0 764 858 | 8/1996 |
| EP | 0 744 664 A2 | 11/1996 |
| EP | 0 779 530 A1 | 6/1997 |
| EP | 0 937 999 A1 | 8/1999 |
| EP | 1 014 196 A2 | 6/2000 |
| EP | 1 071 292 A2 | 1/2001 |
| EP | 1 139 521 A1 | 10/2001 |
| EP | 1 211 561 A2 | 6/2002 |
| EP | 1 260 849 A1 | 11/2002 |
| EP | 1 280 007 A2 | 1/2003 |
| EP | 1 489 462 A2 | 12/2004 |
| EP | 1 577 709 A2 | 9/2005 |
| EP | 1 662 553 A1 | 5/2006 |
| EP | 1 674 935 A2 | 6/2006 |
| EP | 1 681 710 A1 | 7/2006 |
| EP | 1 693 885 A1 | 8/2006 |
| EP | 1 798 758 A1 | 6/2007 |
| EP | 1 840 945 A1 | 10/2007 |
| EP | 1 953 805 A1 | 8/2008 |
| FR | 2 474 708 | 7/1981 |
| GB | 856621 | 12/1960 |
| JP | A-44-4993 | 2/1969 |
| JP | A-56-6666 | 1/1981 |

(56) References Cited

FOREIGN PATENT DOCUMENTS

| | | |
|---|---|---|
| JP | A-57-117238 | 7/1982 |
| JP | A-57-152129 | 9/1982 |
| JP | A-57-153433 | 9/1982 |
| JP | A-58-49932 | 3/1983 |
| JP | U-58-45502 | 3/1983 |
| JP | A-58-115945 | 7/1983 |
| JP | A-58-202448 | 11/1983 |
| JP | A-59-19912 | 2/1984 |
| JP | A-59-155843 | 9/1984 |
| JP | A-59-226317 | 12/1984 |
| JP | A-61-44429 | 3/1986 |
| JP | A-61-45923 | 3/1986 |
| JP | A-61-91662 | 5/1986 |
| JP | U-61-94342 | 6/1986 |
| JP | A-61-156736 | 7/1986 |
| JP | A-61-196532 | 8/1986 |
| JP | A-61-217434 | 9/1986 |
| JP | A-61-251025 | 11/1986 |
| JP | A-61-270049 | 11/1986 |
| JP | A-62-2539 | 1/1987 |
| JP | A-62-2540 | 1/1987 |
| JP | A-62-17705 | 1/1987 |
| JP | A-62-65326 | 3/1987 |
| JP | A-62-100161 | 5/1987 |
| JP | A-62-120026 | 6/1987 |
| JP | A-62-121417 | 6/1987 |
| JP | A-62-122215 | 6/1987 |
| JP | A-62-153710 | 7/1987 |
| JP | A-62-183522 | 8/1987 |
| JP | A-62-188316 | 8/1987 |
| JP | A-62-203526 | 9/1987 |
| JP | A-62-265722 | 11/1987 |
| JP | A-63-12134 | 1/1988 |
| JP | A-63-36526 | 2/1988 |
| JP | A-63-73628 | 4/1988 |
| JP | A-63-128713 | 6/1988 |
| JP | A-63-131008 | 6/1988 |
| JP | A-63-141313 | 6/1988 |
| JP | A-63-157419 | 6/1988 |
| JP | A-63-160192 | 7/1988 |
| JP | A-63-231217 | 9/1988 |
| JP | A-63-275912 | 11/1988 |
| JP | A-63-292005 | 11/1988 |
| JP | A-64-18002 | 1/1989 |
| JP | A-64-26704 | 2/1989 |
| JP | A-64-68926 | 3/1989 |
| JP | A-1-91419 | 4/1989 |
| JP | A-1-115033 | 5/1989 |
| JP | A-1-147516 | 6/1989 |
| JP | A-1-202833 | 8/1989 |
| JP | A-1-214042 | 8/1989 |
| JP | U-1-127379 | 8/1989 |
| JP | A-1-255404 | 10/1989 |
| JP | A-1-258550 | 10/1989 |
| JP | A-1-276043 | 11/1989 |
| JP | A-1-278240 | 11/1989 |
| JP | A-1-286478 | 11/1989 |
| JP | A-1-292343 | 11/1989 |
| JP | A-1-314247 | 12/1989 |
| JP | A-1-319964 | 12/1989 |
| JP | A-2-42382 | 2/1990 |
| JP | A-2-65149 | 3/1990 |
| JP | A-2-65222 | 3/1990 |
| JP | A-2-97239 | 4/1990 |
| JP | A-2-106917 | 4/1990 |
| JP | A-2-116115 | 4/1990 |
| JP | A-2-139146 | 5/1990 |
| JP | A-2-166717 | 6/1990 |
| JP | A-2-261073 | 10/1990 |
| JP | A-2-264901 | 10/1990 |
| JP | A-2-285320 | 11/1990 |
| JP | A-2-287308 | 11/1990 |
| JP | A-2-298431 | 12/1990 |
| JP | A-2-311237 | 12/1990 |
| JP | A-3-41399 | 2/1991 |
| JP | A-3-64811 | 3/1991 |
| JP | A-3-72298 | 3/1991 |
| JP | A-3-94445 | 4/1991 |
| JP | A-3-132663 | 6/1991 |
| JP | A-3-134341 | 6/1991 |
| JP | A-3-167419 | 7/1991 |
| JP | A-3-168640 | 7/1991 |
| JP | A-3-211812 | 9/1991 |
| JP | A-3-263810 | 11/1991 |
| JP | A-4-11613 | 1/1992 |
| JP | A-4-32154 | 2/1992 |
| JP | A-4-065603 | 3/1992 |
| JP | A-4-96315 | 3/1992 |
| JP | A-04-101148 | 4/1992 |
| JP | A-4-101148 | 4/1992 |
| JP | A-4-130710 | 5/1992 |
| JP | A-4-132909 | 5/1992 |
| JP | A-4-133414 | 5/1992 |
| JP | A-4-152512 | 5/1992 |
| JP | A-4-179115 | 6/1992 |
| JP | A-4-186244 | 7/1992 |
| JP | U-4-80052 | 7/1992 |
| JP | A-4-211110 | 8/1992 |
| JP | A-04-225357 | 8/1992 |
| JP | A-4-225357 | 8/1992 |
| JP | A-4-235558 | 8/1992 |
| JP | A-4-265805 | 9/1992 |
| JP | A-4-273245 | 9/1992 |
| JP | A-4-273427 | 9/1992 |
| JP | A-4-280619 | 10/1992 |
| JP | A-4-282539 | 10/1992 |
| JP | A-4-296092 | 10/1992 |
| JP | A-4-297030 | 10/1992 |
| JP | A-4-305915 | 10/1992 |
| JP | A-4-305917 | 10/1992 |
| JP | U-4-117212 | 10/1992 |
| JP | A-4-330961 | 11/1992 |
| JP | A-4-343307 | 11/1992 |
| JP | A-4-350925 | 12/1992 |
| JP | A-5-21314 | 1/1993 |
| JP | A-5-45886 | 2/1993 |
| JP | A-5-62877 | 3/1993 |
| JP | A-5-090128 | 4/1993 |
| JP | A-5-90128 | 4/1993 |
| JP | A-05-109601 | 4/1993 |
| JP | A-5-109601 | 4/1993 |
| JP | A-5-127086 | 5/1993 |
| JP | A-5-129184 | 5/1993 |
| JP | A-5-134230 | 5/1993 |
| JP | 5-160002 | 6/1993 |
| JP | A-5-160002 | 6/1993 |
| JP | A-5-175098 | 7/1993 |
| JP | 5-217840 | 8/1993 |
| JP | A-5-199680 | 8/1993 |
| JP | A-5-217837 | 8/1993 |
| JP | A-5-217840 | 8/1993 |
| JP | A-5-226225 | 9/1993 |
| JP | A-5-241324 | 9/1993 |
| JP | A-5-243364 | 9/1993 |
| JP | A-5-259069 | 10/1993 |
| JP | A-5-283317 | 10/1993 |
| JP | A-5-304072 | 11/1993 |
| JP | A-5-319774 | 12/1993 |
| JP | A-5-323583 | 12/1993 |
| JP | A-5-326370 | 12/1993 |
| JP | A-6-29204 | 2/1994 |
| JP | A-6-42918 | 2/1994 |
| JP | A-6-53120 | 2/1994 |
| JP | A-06-53120 | 2/1994 |
| JP | A-6-97269 | 4/1994 |
| JP | A-6-104167 | 4/1994 |
| JP | A-6-118623 | 4/1994 |
| JP | A-6-120110 | 4/1994 |
| JP | B2-6-29102 | 4/1994 |
| JP | A-6-36054 | 5/1994 |
| JP | A-6-124126 | 5/1994 |
| JP | A-06-124872 | 5/1994 |
| JP | A-6-124872 | 5/1994 |
| JP | A-06-124873 | 5/1994 |

(56) References Cited

FOREIGN PATENT DOCUMENTS

| | | |
|---|---|---|
| JP | A-6-124873 | 5/1994 |
| JP | A-6-140306 | 5/1994 |
| JP | A-6-148399 | 5/1994 |
| JP | 6-163350 | 6/1994 |
| JP | A-6-163350 | 6/1994 |
| JP | A-6-168866 | 6/1994 |
| JP | A-6-177007 | 6/1994 |
| JP | A-6-181157 | 6/1994 |
| JP | A-6-186025 | 7/1994 |
| JP | A-06-188169 | 7/1994 |
| JP | A-6-188169 | 7/1994 |
| JP | A-6-196388 | 7/1994 |
| JP | A-6-204113 | 7/1994 |
| JP | A-06-204121 | 7/1994 |
| JP | A-6-204121 | 7/1994 |
| JP | A-6-229741 | 8/1994 |
| JP | 6-267825 | 9/1994 |
| JP | A-6-241720 | 9/1994 |
| JP | A-6-244082 | 9/1994 |
| JP | A-6-267825 | 9/1994 |
| JP | A-06-281869 | 10/1994 |
| JP | A-6-283403 | 10/1994 |
| JP | A-06-291023 | 10/1994 |
| JP | A-6-310399 | 11/1994 |
| JP | A-6-325894 | 11/1994 |
| JP | A-6-326174 | 11/1994 |
| JP | A-6-349701 | 12/1994 |
| JP | A-7-57992 | 3/1995 |
| JP | A-7-057993 | 3/1995 |
| JP | A-7-69621 | 3/1995 |
| JP | A-7-92424 | 4/1995 |
| JP | 7-122469 | 5/1995 |
| JP | A-7-122469 | 5/1995 |
| JP | A-7-132262 | 5/1995 |
| JP | A-7-134955 | 5/1995 |
| JP | A-7-135158 | 5/1995 |
| JP | A-7-135165 | 5/1995 |
| JP | 7-147223 | 6/1995 |
| JP | A-7-147223 | 6/1995 |
| JP | A-7-161622 | 6/1995 |
| JP | A-7-167998 | 7/1995 |
| JP | A-7-168286 | 7/1995 |
| JP | A-7-174974 | 7/1995 |
| JP | A-7-176468 | 7/1995 |
| JP | A-7-183201 | 7/1995 |
| JP | A-7-183214 | 7/1995 |
| JP | A-7-190741 | 7/1995 |
| JP | 07-220995 | 8/1995 |
| JP | A-7-201723 | 8/1995 |
| JP | A-7-220989 | 8/1995 |
| JP | A-7-220990 | 8/1995 |
| JP | A-7-220995 | 8/1995 |
| JP | A-7-221010 | 8/1995 |
| JP | A-7-230945 | 8/1995 |
| JP | A-7-239212 | 9/1995 |
| JP | A-7-243814 | 9/1995 |
| JP | A-7-245258 | 9/1995 |
| JP | A-7-263315 | 10/1995 |
| JP | A-07-263315 | 10/1995 |
| JP | A-07-283119 | 10/1995 |
| JP | A-7-283119 | 10/1995 |
| JP | A-7-297272 | 11/1995 |
| JP | A-7-307268 | 11/1995 |
| JP | A-7-318847 | 12/1995 |
| JP | A-7-335748 | 12/1995 |
| JP | A-8-10971 | 1/1996 |
| JP | A-8-17709 | 1/1996 |
| JP | A-8-22948 | 1/1996 |
| JP | A-8-37149 | 2/1996 |
| JP | A-8-37227 | 2/1996 |
| JP | A-8-46751 | 2/1996 |
| JP | A-8-63231 | 3/1996 |
| JP | A-8-115868 | 5/1996 |
| JP | A-8-136475 | 5/1996 |
| JP | A-8-151220 | 6/1996 |
| JP | A-8-162397 | 6/1996 |
| JP | A-8-166475 | 6/1996 |
| JP | A-8-171054 | 7/1996 |
| JP | A-8-195375 | 7/1996 |
| JP | A-8-203803 | 8/1996 |
| JP | A-8-279549 | 10/1996 |
| JP | A-8-288213 | 11/1996 |
| JP | A-8-297699 | 11/1996 |
| JP | A-8-316125 | 11/1996 |
| JP | A-8-316133 | 11/1996 |
| JP | 8-335552 | 12/1996 |
| JP | A-8-330224 | 12/1996 |
| JP | A-8-334695 | 12/1996 |
| JP | A-8-335552 | 12/1996 |
| JP | A-9-7933 | 1/1997 |
| JP | A-9-15834 | 1/1997 |
| JP | A-9-22121 | 1/1997 |
| JP | A-9-61686 | 3/1997 |
| JP | A-9-82626 | 3/1997 |
| JP | A-9-83877 | 3/1997 |
| JP | A-9-92593 | 4/1997 |
| JP | A-9-108551 | 4/1997 |
| JP | A-9-115794 | 5/1997 |
| JP | A-9-134870 | 5/1997 |
| JP | A-9-148406 | 6/1997 |
| JP | A-9-151658 | 6/1997 |
| JP | A-9-160004 | 6/1997 |
| JP | A-09-160219 | 6/1997 |
| JP | A-9-160219 | 6/1997 |
| JP | A-9-162106 | 6/1997 |
| JP | A-9-178415 | 7/1997 |
| JP | A-9-184787 | 7/1997 |
| JP | A-9-184918 | 7/1997 |
| JP | A-9-186082 | 7/1997 |
| JP | A-9-190969 | 7/1997 |
| JP | A-9-213129 | 8/1997 |
| JP | A-9-219358 | 8/1997 |
| JP | A-9-227294 | 9/1997 |
| JP | A-9-232213 | 9/1997 |
| JP | A-9-243892 | 9/1997 |
| JP | A-9-246672 | 9/1997 |
| JP | A-9-251208 | 9/1997 |
| JP | A-9-281077 | 10/1997 |
| JP | A-9-325255 | 12/1997 |
| JP | A-9-326338 | 12/1997 |
| JP | A-10-002865 | 1/1998 |
| JP | A-10-3039 | 1/1998 |
| JP | A-10-20195 | 1/1998 |
| JP | A-10-32160 | 2/1998 |
| JP | A-10-38517 | 2/1998 |
| JP | A-10-38812 | 2/1998 |
| JP | A-10-55713 | 2/1998 |
| JP | A-10-62305 | 3/1998 |
| JP | A-10-64790 | 3/1998 |
| JP | A-10-79337 | 3/1998 |
| JP | A-10-82611 | 3/1998 |
| JP | A-10-503300 | 3/1998 |
| JP | A-10-92735 | 4/1998 |
| JP | A-10-97969 | 4/1998 |
| JP | A-10-104427 | 4/1998 |
| JP | A-10-116760 | 5/1998 |
| JP | A-10-116778 | 5/1998 |
| JP | A-10-135099 | 5/1998 |
| JP | A-H10-116779 | 5/1998 |
| JP | A-H10-125572 | 5/1998 |
| JP | A-H10-134028 | 5/1998 |
| JP | A-10-163099 | 6/1998 |
| JP | A-10-163302 | 6/1998 |
| JP | A-10-169249 | 6/1998 |
| JP | 10-208993 | 7/1998 |
| JP | A-10-189427 | 7/1998 |
| JP | A-10-189700 | 7/1998 |
| JP | A-10-206714 | 8/1998 |
| JP | A-10-208993 | 8/1998 |
| JP | A-10-209018 | 8/1998 |
| JP | A-10-214783 | 8/1998 |
| JP | A-10-228661 | 8/1998 |
| JP | A-10-255319 | 9/1998 |
| JP | A-10-294268 | 11/1998 |

(56) References Cited

FOREIGN PATENT DOCUMENTS

| | | |
|---|---|---|
| JP | A-10-303114 | 11/1998 |
| JP | A-10-340846 | 12/1998 |
| JP | A-11-3849 | 1/1999 |
| JP | A-11-3856 | 1/1999 |
| JP | A-11-8194 | 1/1999 |
| JP | A-11-14876 | 1/1999 |
| JP | A-11-16816 | 1/1999 |
| JP | A-11-40657 | 2/1999 |
| JP | A-11-54426 | 2/1999 |
| JP | A-11-74185 | 3/1999 |
| JP | A-11-87237 | 3/1999 |
| JP | A-11-111601 | 4/1999 |
| JP | A-11-111818 | 4/1999 |
| JP | A-11-111819 | 4/1999 |
| JP | A-11-121328 | 4/1999 |
| JP | A-11-135400 | 5/1999 |
| JP | A-11-142556 | 5/1999 |
| JP | A-11-150062 | 6/1999 |
| JP | A-11-159571 | 6/1999 |
| JP | A-11-162831 | 6/1999 |
| JP | A-11-163103 | 6/1999 |
| JP | A-11-164543 | 6/1999 |
| JP | A-11-166990 | 6/1999 |
| JP | A-11-98 | 7/1999 |
| JP | A-11-176727 | 7/1999 |
| JP | A-11-176744 | 7/1999 |
| JP | A-11-195602 | 7/1999 |
| JP | A-11-204390 | 7/1999 |
| JP | A-11-204432 | 7/1999 |
| JP | A-11-218466 | 8/1999 |
| JP | A-11-219882 | 8/1999 |
| JP | A-11-233434 | 8/1999 |
| JP | A-11-238680 | 8/1999 |
| JP | A-11-239758 | 9/1999 |
| JP | A-11-260686 | 9/1999 |
| JP | A-11-260791 | 9/1999 |
| JP | A-11-264756 | 9/1999 |
| JP | A-11-283903 | 10/1999 |
| JP | A-11-288879 | 10/1999 |
| JP | A-11-307610 | 11/1999 |
| JP | A-11-312631 | 11/1999 |
| JP | A-11-354624 | 12/1999 |
| JP | A-2000-3874 | 1/2000 |
| JP | A-2000-12453 | 1/2000 |
| JP | A-2000-21742 | 1/2000 |
| JP | A-2000-21748 | 1/2000 |
| JP | A-2000-29202 | 1/2000 |
| JP | A-2000-32403 | 1/2000 |
| JP | A-2000-36449 | 2/2000 |
| JP | A-2000-58436 | 2/2000 |
| JP | A-2000-58441 | 2/2000 |
| JP | A-2000-81320 | 3/2000 |
| JP | A-2000-92815 | 3/2000 |
| JP | A-2000-97616 | 4/2000 |
| JP | A-2000-106340 | 4/2000 |
| JP | A-2000-114157 | 4/2000 |
| JP | A-2000-121491 | 4/2000 |
| JP | A-2000-147346 | 5/2000 |
| JP | A-2000-154251 | 6/2000 |
| JP | A-2000-180371 | 6/2000 |
| JP | A-2000-206279 | 7/2000 |
| JP | A-2000-208407 | 7/2000 |
| JP | A-2000-240717 | 9/2000 |
| JP | A-2000-243684 | 9/2000 |
| JP | A-2000-252201 | 9/2000 |
| JP | A-2000-283889 | 10/2000 |
| JP | A-2000-286176 | 10/2000 |
| JP | 2000-311853 | 11/2000 |
| JP | A-2000-311853 | 11/2000 |
| JP | A-2000-323403 | 11/2000 |
| JP | A-2001-7015 | 1/2001 |
| JP | A-2001-20951 | 1/2001 |
| JP | A-2001-23996 | 1/2001 |
| JP | A-2001-37201 | 2/2001 |
| JP | A-2001-44097 | 2/2001 |
| JP | A-2001-74240 | 3/2001 |
| JP | A-2001-83472 | 3/2001 |
| JP | A-2001-85307 | 3/2001 |
| JP | A-2001-97734 | 4/2001 |
| JP | A-2001-100311 | 4/2001 |
| JP | A-2001-110707 | 4/2001 |
| JP | A-2001-118773 | 4/2001 |
| JP | A-2001-135560 | 5/2001 |
| JP | A-2001-144004 | 5/2001 |
| JP | A-2001-167996 | 6/2001 |
| JP | A-2001-176766 | 6/2001 |
| JP | A-2001-203140 | 7/2001 |
| JP | A-2001-218497 | 8/2001 |
| JP | A-2001-228401 | 8/2001 |
| JP | A-2001-228404 | 8/2001 |
| JP | A-2001-230323 | 8/2001 |
| JP | A-2001-242269 | 9/2001 |
| JP | A-2001-265581 | 9/2001 |
| JP | A-2001-267227 | 9/2001 |
| JP | 2001-284228 | 10/2001 |
| JP | A-2001-272764 | 10/2001 |
| JP | A-2001-274083 | 10/2001 |
| JP | A-2001-282526 | 10/2001 |
| JP | A-2001-296105 | 10/2001 |
| JP | A-2001-297976 | 10/2001 |
| JP | A-2001-304332 | 10/2001 |
| JP | A-2001-307982 | 11/2001 |
| JP | A-2001-307983 | 11/2001 |
| JP | A-2001-313250 | 11/2001 |
| JP | B2-3246615 | 11/2001 |
| JP | A-2001-338868 | 12/2001 |
| JP | A-2001-345262 | 12/2001 |
| JP | A-2002-14005 | 1/2002 |
| JP | A-2002-15978 | 1/2002 |
| JP | A-2002-16124 | 1/2002 |
| JP | A-2002-43213 | 2/2002 |
| JP | A-2002-57097 | 2/2002 |
| JP | 2002-075859 A | 3/2002 |
| JP | A-2002-66428 | 3/2002 |
| JP | A-2002-71513 | 3/2002 |
| JP | A-2002-075816 | 3/2002 |
| JP | A-2002-75816 | 3/2002 |
| JP | A-2002-75835 | 3/2002 |
| JP | A-2002-91922 | 3/2002 |
| JP | A-2002-93686 | 3/2002 |
| JP | A-2002-93690 | 3/2002 |
| JP | A-2002-100561 | 4/2002 |
| JP | A-2002-118058 | 4/2002 |
| JP | A-2002-141270 | 5/2002 |
| JP | A-2002-158157 | 5/2002 |
| JP | A-2002-162655 | 6/2002 |
| JP | A-2002-170495 | 6/2002 |
| JP | A-2002-190438 | 7/2002 |
| JP | A-2002-195912 | 7/2002 |
| JP | A-2002-198284 | 7/2002 |
| JP | A-2002-202221 | 7/2002 |
| JP | A-2002-203763 | 7/2002 |
| JP | A-2002-208562 | 7/2002 |
| JP | A-2002-520810 | 7/2002 |
| JP | A-2002-222754 | 8/2002 |
| JP | A-2002-227924 | 8/2002 |
| JP | A-2002-231619 | 8/2002 |
| JP | 2002-261004 | 9/2002 |
| JP | A-2002-258487 | 9/2002 |
| JP | A-2002-261004 | 9/2002 |
| JP | A-2002-263553 | 9/2002 |
| JP | A-2002-277742 | 9/2002 |
| JP | A-2002-289505 | 10/2002 |
| JP | A-2002-305140 | 10/2002 |
| JP | A-2002-323658 | 11/2002 |
| JP | A-2002-324743 | 11/2002 |
| JP | A-2002-329651 | 11/2002 |
| JP | A-2002-334836 | 11/2002 |
| JP | 2002-359176 A | 12/2002 |
| JP | A-2002-353105 | 12/2002 |
| JP | A-2002-357715 | 12/2002 |
| JP | A-2002-359174 | 12/2002 |
| JP | A-2002-362737 | 12/2002 |
| JP | A-2002-365783 | 12/2002 |

(56) References Cited

FOREIGN PATENT DOCUMENTS

| | | |
|---|---|---|
| JP | A-2002-367523 | 12/2002 |
| JP | A-2002-367886 | 12/2002 |
| JP | A-2002-373849 | 12/2002 |
| JP | A-2003-15040 | 1/2003 |
| JP | A-2003-015314 | 1/2003 |
| JP | A-2003-17003 | 1/2003 |
| JP | A-2003-17404 | 1/2003 |
| JP | A-2003-28673 | 1/2003 |
| JP | A-2003-35822 | 2/2003 |
| JP | A-2003-43223 | 2/2003 |
| JP | A-2003-45219 | 2/2003 |
| JP | A-2003-45712 | 2/2003 |
| JP | A-2003-59799 | 2/2003 |
| JP | A-2003-59803 | 2/2003 |
| JP | A-2003-59821 | 2/2003 |
| JP | A-2003-059821 | 2/2003 |
| JP | A-2003-59826 | 2/2003 |
| JP | A-2003-68600 | 3/2003 |
| JP | A-2003-068600 | 3/2003 |
| JP | A-2003-68604 | 3/2003 |
| JP | A-2003-75703 | 3/2003 |
| JP | A-2003-81654 | 3/2003 |
| JP | A-2003-84445 | 3/2003 |
| JP | A-2003-090978 | 3/2003 |
| JP | A-2003-98651 | 4/2003 |
| JP | A-2003-100597 | 4/2003 |
| JP | A-2003-114387 | 4/2003 |
| JP | A-2003-124095 | 4/2003 |
| JP | A-2003-130132 | 5/2003 |
| JP | A-2003-149363 | 5/2003 |
| JP | A-2003-151880 | 5/2003 |
| JP | A-2003-161882 | 6/2003 |
| JP | A-2003-163158 | 6/2003 |
| JP | A-2003-166856 | 6/2003 |
| JP | A2003-173957 | 6/2003 |
| JP | A-2003-188087 | 7/2003 |
| JP | A-2003-224961 | 8/2003 |
| JP | A-2003-229347 | 8/2003 |
| JP | A-2003-233001 | 8/2003 |
| JP | A-2003-234285 | 8/2003 |
| JP | A-2003-238577 | 8/2003 |
| JP | A-2003-240906 | 8/2003 |
| JP | A-2003-249443 | 9/2003 |
| JP | A-2003-258071 | 9/2003 |
| JP | A-2003-262501 | 9/2003 |
| JP | A-2003-263119 | 9/2003 |
| JP | A-2003-272837 | 9/2003 |
| JP | A-2003-273338 | 9/2003 |
| JP | A-2003-282423 | 10/2003 |
| JP | A-2003-297727 | 10/2003 |
| JP | A-2003-532281 | 10/2003 |
| JP | A-2003-532282 | 10/2003 |
| JP | A-2003-311923 | 11/2003 |
| JP | A-2004-7417 | 1/2004 |
| JP | A-2004-14642 | 1/2004 |
| JP | A-2004-14876 | 1/2004 |
| JP | A-2004-15187 | 1/2004 |
| JP | A-2004-22708 | 1/2004 |
| JP | A-2004-38247 | 2/2004 |
| JP | A-2004-39952 | 2/2004 |
| JP | A-2004-40039 | 2/2004 |
| JP | A-2004-45063 | 2/2004 |
| JP | A-2004-63847 | 2/2004 |
| JP | A-2004-71851 | 3/2004 |
| JP | A-2004-078136 | 3/2004 |
| JP | A-2004-85612 | 3/2004 |
| JP | A-2004-87987 | 3/2004 |
| JP | A-2004-087987 | 3/2004 |
| JP | A-2004-95653 | 3/2004 |
| JP | U-3102327 | 3/2004 |
| JP | A-2004-98012 | 4/2004 |
| JP | A-2004-101362 | 4/2004 |
| JP | A-2004-103674 | 4/2004 |
| JP | A-2004-111569 | 4/2004 |
| JP | A-2004-119497 | 4/2004 |
| JP | A-2004-119717 | 4/2004 |
| JP | A-2004-128307 | 4/2004 |
| JP | A-2004-134682 | 4/2004 |
| JP | A-2004-140145 | 5/2004 |
| JP | A-2004-145269 | 5/2004 |
| JP | A-2004-146702 | 5/2004 |
| JP | A-2004-152705 | 5/2004 |
| JP | A-2004-153064 | 5/2004 |
| JP | A-2004-153096 | 5/2004 |
| JP | A-2004-163555 | 6/2004 |
| JP | A-2004-165249 | 6/2004 |
| JP | A-2004-165416 | 6/2004 |
| JP | A-2004-172471 | 6/2004 |
| JP | A-2004-177468 | 6/2004 |
| JP | A-2004-179172 | 6/2004 |
| JP | A-2004-187401 | 7/2004 |
| JP | A-2004-193252 | 7/2004 |
| JP | A-2004-193425 | 7/2004 |
| JP | A-2004-198748 | 7/2004 |
| JP | A-2004-205698 | 7/2004 |
| JP | A-2004-207696 | 7/2004 |
| JP | A-2004-207711 | 7/2004 |
| JP | A-2004-260115 | 7/2004 |
| JP | A-2004-520618 | 7/2004 |
| JP | A-2004-221253 | 8/2004 |
| JP | A-2004-224421 | 8/2004 |
| JP | A-2004-228497 | 8/2004 |
| JP | A-2004-241666 | 8/2004 |
| JP | A-2004-247527 | 9/2004 |
| JP | A-2004-258670 | 9/2004 |
| JP | A-2004-259828 | 9/2004 |
| JP | A-2004-259966 | 9/2004 |
| JP | A-2004-259985 | 9/2004 |
| JP | A-2004-260043 | 9/2004 |
| JP | A-2004-260081 | 9/2004 |
| JP | A-2004-294202 | 10/2004 |
| JP | A-2004-301825 | 10/2004 |
| JP | A-2004-302043 | 10/2004 |
| JP | A-2004-303808 | 10/2004 |
| JP | A-2004-304135 | 10/2004 |
| JP | A-2004-307264 | 11/2004 |
| JP | A-2004-307265 | 11/2004 |
| JP | A-2004-307266 | 11/2004 |
| JP | A-2004-307267 | 11/2004 |
| JP | A-2004-319724 | 11/2004 |
| JP | A-2004-320017 | 11/2004 |
| JP | A-2004-327660 | 11/2004 |
| JP | A-2004-335808 | 11/2004 |
| JP | A-2004-335864 | 11/2004 |
| JP | A-2004-336922 | 11/2004 |
| JP | A-2004-342987 | 12/2004 |
| JP | A-2004-349645 | 12/2004 |
| JP | A-2004-356410 | 12/2004 |
| JP | A-2005-5295 | 1/2005 |
| JP | A-2005-5395 | 1/2005 |
| JP | A-2005-5521 | 1/2005 |
| JP | A-2005-005521 | 1/2005 |
| JP | A-2005-11990 | 1/2005 |
| JP | A-2005-012190 | 1/2005 |
| JP | A-2005-12228 | 1/2005 |
| JP | A-2005-19628 | 1/2005 |
| JP | A-2005-19864 | 1/2005 |
| JP | A-2005-26634 | 1/2005 |
| JP | A-2005-51147 | 2/2005 |
| JP | A-2005-55811 | 3/2005 |
| JP | A-2005-64210 | 3/2005 |
| JP | A-2005-64391 | 3/2005 |
| JP | A-2005-79222 | 3/2005 |
| JP | A-2005-79584 | 3/2005 |
| JP | A-2005-79587 | 3/2005 |
| JP | A-2005-86148 | 3/2005 |
| JP | A-2005-91023 | 4/2005 |
| JP | A-2005-93324 | 4/2005 |
| JP | A-2005-093522 | 4/2005 |
| JP | A-2005-93948 | 4/2005 |
| JP | A-2005-97057 | 4/2005 |
| JP | A-2005-108925 | 4/2005 |
| JP | A-2005-108934 | 4/2005 |
| JP | A-2005-114882 | 4/2005 |

(56) References Cited

FOREIGN PATENT DOCUMENTS

| | | |
|---|---|---|
| JP | A-2005-116570 | 4/2005 |
| JP | A-2005-116571 | 4/2005 |
| JP | A-2005-116831 | 4/2005 |
| JP | A-2005-123586 | 5/2005 |
| JP | A-2005-127460 | 5/2005 |
| JP | A-2005-136404 | 5/2005 |
| JP | A-2005/050718 | 6/2005 |
| JP | A-2005-140999 | 6/2005 |
| JP | A-2005-150759 | 6/2005 |
| JP | A-2005-156592 | 6/2005 |
| JP | A-2005-166871 | 6/2005 |
| JP | A-2005-167254 | 6/2005 |
| JP | A-2005-175176 | 6/2005 |
| JP | A-2005-175177 | 6/2005 |
| JP | A-2005-191344 | 7/2005 |
| JP | A-2005-203483 | 7/2005 |
| JP | A-2005-209705 | 8/2005 |
| JP | A-2005-209706 | 8/2005 |
| JP | A-2005-524112 | 8/2005 |
| JP | A-2005-233979 | 9/2005 |
| JP | A-2005-234359 | 9/2005 |
| JP | A-2005-236088 | 9/2005 |
| JP | A-2005-243770 | 9/2005 |
| JP | A-2005-243904 | 9/2005 |
| JP | A-2005-251549 | 9/2005 |
| JP | A-2005-257740 | 9/2005 |
| JP | A-2005-259789 | 9/2005 |
| JP | A-2005-259830 | 9/2005 |
| JP | A-2005-268700 | 9/2005 |
| JP | A-2005-268741 | 9/2005 |
| JP | A-2005-268742 | 9/2005 |
| JP | A-2005-276932 | 10/2005 |
| JP | A-2005-302826 | 10/2005 |
| JP | A-2005-303167 | 10/2005 |
| JP | A-2005-311020 | 11/2005 |
| JP | A-2005-315918 | 11/2005 |
| JP | A-2005-340605 | 12/2005 |
| JP | A-2005-366813 | 12/2005 |
| JP | A-2006-1821 | 1/2006 |
| JP | A-2006-5197 | 1/2006 |
| JP | A-2006-17895 | 1/2006 |
| JP | A-2006-19702 | 1/2006 |
| JP | A-2006-019702 | 1/2006 |
| JP | A-2006-24706 | 1/2006 |
| JP | A-2006-24819 | 1/2006 |
| JP | A-2006-32750 | 2/2006 |
| JP | A-2006-41302 | 2/2006 |
| JP | A-2006-54364 | 2/2006 |
| JP | A-2006-73584 | 3/2006 |
| JP | A-2006-73951 | 3/2006 |
| JP | A-2006-80281 | 3/2006 |
| JP | A-2006-86141 | 3/2006 |
| JP | A-2006-86442 | 3/2006 |
| JP | A-2006-100363 | 4/2006 |
| JP | A-2006-100686 | 4/2006 |
| JP | A-2006-113437 | 4/2006 |
| JP | A-2006-513442 | 4/2006 |
| JP | A-2006-120985 | 5/2006 |
| JP | A-2006-128192 | 5/2006 |
| JP | A-2006-135165 | 5/2006 |
| JP | A-2006-140366 | 6/2006 |
| JP | A-2006-170811 | 6/2006 |
| JP | A-2006-170899 | 6/2006 |
| JP | A-2006-177865 | 7/2006 |
| JP | A-2006-184414 | 7/2006 |
| JP | A-2006-194665 | 7/2006 |
| JP | A-2006-250587 | 9/2006 |
| JP | A-2006-253572 | 9/2006 |
| JP | A-2006-269762 | 10/2006 |
| JP | A-2006-278820 | 10/2006 |
| JP | A-2006-289684 | 10/2006 |
| JP | A-2006-524349 | 10/2006 |
| JP | A-2006-332355 | 12/2006 |
| JP | A-2006-349946 | 12/2006 |
| JP | A-2006-351586 | 12/2006 |
| JP | A-2007-5830 | 1/2007 |
| JP | A-2007-43980 | 2/2007 |
| JP | A-2007-48819 | 2/2007 |
| JP | A-2007-51300 | 3/2007 |
| JP | A-2007-87306 | 4/2007 |
| JP | A-2007-93546 | 4/2007 |
| JP | A-2007-103153 | 4/2007 |
| JP | A-2007-113939 | 5/2007 |
| JP | A-2007-119851 | 5/2007 |
| JP | A-2007-120333 | 5/2007 |
| JP | A-2007-120334 | 5/2007 |
| JP | A-2007-142313 | 6/2007 |
| JP | A-2007-144864 | 6/2007 |
| JP | A-2007-515768 | 6/2007 |
| JP | A-2007-170938 | 7/2007 |
| JP | A-2007-187649 | 7/2007 |
| JP | A-2007-207821 | 8/2007 |
| JP | A-2007-227637 | 9/2007 |
| JP | A-2007-235041 | 9/2007 |
| JP | A-2007-274881 | 10/2007 |
| JP | A-2007-280623 | 10/2007 |
| JP | A-2007-295702 | 11/2007 |
| JP | A-2008-3740 | 1/2008 |
| JP | A-2008-58580 | 3/2008 |
| JP | A-2008-64924 | 3/2008 |
| JP | A-2008-103737 | 5/2008 |
| JP | A-2008-180492 | 8/2008 |
| JP | A-2009-17540 | 1/2009 |
| JP | A-2009-60339 | 3/2009 |
| JP | A-2010-514716 | 5/2010 |
| JP | A-2010-226117 | 10/2010 |
| JP | A-2011-233911 | 11/2011 |
| JP | A-4976094 | 7/2012 |
| JP | B2-4976015 | 7/2012 |
| JP | 2003068607 A | 4/2015 |
| KR | 1995-0009365 A | 4/1995 |
| KR | 10-1997-0016641 A | 4/1997 |
| KR | 10-2011-0036050 | 4/1997 |
| KR | 10-2000-0048227 | 7/2000 |
| KR | 10-2000-0076783 A | 12/2000 |
| KR | 10-2001-0051438 A | 6/2001 |
| KR | A-2001-0053240 | 6/2001 |
| KR | 10-2002-0042462 A | 6/2002 |
| KR | 10-2003-0036105 | 5/2003 |
| KR | 10-0474578 A | 6/2005 |
| KR | 10-2006-0132598 | 12/2006 |
| KR | 10-839686 B1 | 6/2008 |
| KR | 10-869390 B1 | 11/2008 |
| KR | 10-2010-0061551 | 6/2010 |
| KR | 10-1020378 B1 | 3/2011 |
| KR | 10-1020455 B1 | 3/2011 |
| TW | 480585 B | 3/2002 |
| TW | 516097 | 1/2003 |
| TW | 518662 | 1/2003 |
| TW | 200301848 A | 7/2003 |
| TW | 094100817 | 8/2005 |
| WO | WO 97/11411 A1 | 3/1997 |
| WO | WO 98/15952 A1 | 4/1998 |
| WO | WO 98/24115 A1 | 6/1998 |
| WO | WO 98/59364 A1 | 12/1998 |
| WO | WO 99/23692 A1 | 5/1999 |
| WO | WO 99/27568 A1 | 6/1999 |
| WO | WO 99/31716 A1 | 6/1999 |
| WO | WO 99/34255 A1 | 7/1999 |
| WO | WO 99/49366 AI | 9/1999 |
| WO | WO 99/49504 A1 | 9/1999 |
| WO | WO 99/50712 A1 | 10/1999 |
| WO | WO 99/66370 A1 | 12/1999 |
| WO | WO 00/02092 | 1/2000 |
| WO | WO 00/011706 | 3/2000 |
| WO | WO 00/67303 | 11/2000 |
| WO | WO 00/67303 A1 | 11/2000 |
| WO | WO 01/03170 A1 | 1/2001 |
| WO | WO 01/10137 A1 | 2/2001 |
| WO | WO 01/20733 A1 | 3/2001 |
| WO | WO 01/22480 A1 | 3/2001 |
| WO | WO 01/23935 A1 | 4/2001 |
| WO | WO 01/27978 A1 | 4/2001 |
| WO | WO 01/35451 A1 | 5/2001 |

(56) References Cited

FOREIGN PATENT DOCUMENTS

| | | |
|---|---|---|
| WO | WO 01/59502 A1 | 8/2001 |
| WO | WO 01/65296 A1 | 9/2001 |
| WO | WO 01/81977 A2 | 11/2001 |
| WO | WO 02/16993 A1 | 2/2002 |
| WO | WO 02/063664 A1 | 8/2002 |
| WO | WO 02/069049 A2 | 9/2002 |
| WO | WO 02/080185 A1 | 10/2002 |
| WO | WO 02/084720 A2 | 10/2002 |
| WO | WO 02/084850 A1 | 10/2002 |
| WO | WO 02/093209 A2 | 11/2002 |
| WO | WO 02/101804 A1 | 12/2002 |
| WO | WO 03/003429 A1 | 1/2003 |
| WO | WO 03/023832 A1 | 3/2003 |
| WO | WO 03/063212 A1 | 7/2003 |
| WO | WO 03/077036 A1 | 9/2003 |
| WO | WO 03/085708 A1 | 10/2003 |
| WO | WO 2004/051717 | 6/2004 |
| WO | WO 2004/051717 A1 | 6/2004 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/071070 A2 | 8/2004 |
| WO | WO 2004/086468 A1 | 10/2004 |
| WO | WO 2004/086470 A1 | 10/2004 |
| WO | WO 2004/090956 A1 | 10/2004 |
| WO | WO 2004/091079 A1 | 10/2004 |
| WO | WO 2004/094940 A1 | 11/2004 |
| WO | WO 2004/104654 | 12/2004 |
| WO | WO 2004/105106 A1 | 12/2004 |
| WO | WO 2004/105107 A1 | 12/2004 |
| WO | WO 2004/107048 A2 | 12/2004 |
| WO | WO 2004/107417 A1 | 12/2004 |
| WO | WO 2004/109780 A1 | 12/2004 |
| WO | WO 2004/114380 A1 | 12/2004 |
| WO | WO 2005/006415 A1 | 1/2005 |
| WO | WO 2005/006418 A1 | 1/2005 |
| WO | WO 2005/008754 A1 | 1/2005 |
| WO | WO 2005/022615 A1 | 3/2005 |
| WO | WO 2005/026843 A2 | 3/2005 |
| WO | WO 2005/027207 A1 | 3/2005 |
| WO | WO 2005/029559 A1 | 3/2005 |
| WO | WO 2005/031467 | 4/2005 |
| WO | WO 2005/036619 A1 | 4/2005 |
| WO | WO 2005/036620 A1 | 4/2005 |
| WO | WO 2005/036622 A1 | 4/2005 |
| WO | WO 2005/036623 A1 | 4/2005 |
| WO | WO 2005/041276 A1 | 5/2005 |
| WO | WO 2005/041277 A1 | 5/2005 |
| WO | WO 2005/048325 A1 | 5/2005 |
| WO | WO 2005/048326 A1 | 5/2005 |
| WO | WO 2005/050718 A1 | 6/2005 |
| WO | WO 2005/057636 A1 | 6/2005 |
| WO | WO 2005/067013 A1 | 7/2005 |
| WO | WO 2005/069081 A2 | 7/2005 |
| WO | WO 2005/071717 A1 | 8/2005 |
| WO | WO 2005/076045 A1 | 8/2005 |
| WO | WO 2005/076321 A1 | 8/2005 |
| WO | WO 2005/076323 A1 | 8/2005 |
| WO | WO 2005/081291 A1 | 9/2005 |
| WO | WO 2005/081292 A1 | 9/2005 |
| WO | WO 2005/104195 A1 | 11/2005 |
| WO | WO 2006/006730 A1 | 1/2006 |
| WO | WO 2006/016551 A1 | 2/2006 |
| WO | WO 2006/019124 A1 | 2/2006 |
| WO | WO 2006/025341 A1 | 3/2006 |
| WO | WO 2006/028188 A1 | 3/2006 |
| WO | WO 2006/030727 A1 | 3/2006 |
| WO | WO 2006/030910 A1 | 3/2006 |
| WO | WO 2006-035775 A1 | 4/2006 |
| WO | WO 2006/049134 A1 | 5/2006 |
| WO | WO 2006/051909 A1 | 5/2006 |
| WO | WO 2006/064851 A1 | 6/2006 |
| WO | WO 2006/068233 A1 | 6/2006 |
| WO | WO 2006/077958 A1 | 7/2006 |
| WO | WO 2006/080285 A1 | 8/2006 |
| WO | WO 2006/085524 A1 | 8/2006 |
| WO | WO 2006/100889 A1 | 9/2006 |
| WO | WO 2006/118108 A1 | 11/2006 |
| WO | WO 2007/003563 A1 | 1/2007 |
| WO | WO 2007/018127 A1 | 2/2007 |
| WO | WO 2007/055120 A1 | 5/2007 |
| WO | WO 2007/055237 A1 | 5/2007 |
| WO | WO 2007/055373 A1 | 5/2007 |
| WO | WO 2007/066692 A1 | 6/2007 |
| WO | WO 2007/066758 A1 | 6/2007 |
| WO | WO 2007/097198 A1 | 8/2007 |
| WO | WO 2007/132862 A1 | 11/2007 |
| WO | WO 2007/141997 A1 | 12/2007 |
| WO | WO 2008/041575 A1 | 4/2008 |
| WO | WO 2008/059748 A1 | 5/2008 |
| WO | WO 2008/061681 A2 | 5/2008 |
| WO | WO 2006/343023 | 6/2008 |
| WO | WO 2008/065977 A1 | 6/2008 |
| WO | WO 2008/074673 A2 | 6/2008 |
| WO | WO 2008/075613 A1 | 6/2008 |
| WO | WO 2008/078688 A1 | 7/2008 |
| WO | WO 2008/090975 A1 | 7/2008 |
| WO | WO 2008/139848 A1 | 11/2008 |
| WO | WO 2009/153925 A1 | 12/2009 |
| WO | WO 2009/157154 A1 | 12/2009 |
| WO | WO 2010/001537 A1 | 1/2010 |

OTHER PUBLICATIONS

Jul. 22, 2013 Notice of Allowance issued in U.S. Appl. No. 12/289,515.
Aug. 1, 2013 Office Action issued in U.S. Appl. No. 12/318,216.
Aug. 6, 2013 Office Action issued in U.S. Appl. No. 13/889,798.
U.S. Appl. No. 12/382,277, filed Mar. 12, 2009, Kudo et al.
Tsuruta, T. "Applied Optics II," Baifukan Co., Ltd. pp. 166-167, Jul. 1990.
Brunner, Timothy A., et al. "High NA Lithographic Imaging at Brewster's Angle." SPIE (U.S.A.), vol. 4691, pp. 1-24, 2002.
Mar. 21, 2008 Chinese Office Action in corresponding Chinese Application No. 2004800341246 (with English Translation).
Nov. 6, 2009 Office Action issued in Chinese Patent Application No. 2008102114957 (with English Translation).
Sep. 11, 2009 Office Action issued in Chinese Patent Application No. 2008102114976 (with English Translation).
Translation of Final Notice of Preliminary Rejection issued in Korean Patent Application No. 10-2008-7019081; May 31, 2010.
Translation of Preliminary Rejection issued in Korean Patent Application No. 10-2008-7019082; May 31, 2010.
Office Action issued in Chinese Patent Application No. 200810211496.1 mailed on Aug. 23, 2010 (with English Translation).
Notice of Allowance issued in U.S. Appl. No. 11/410,952 mailed on Sep. 20, 2010.
Extended European Search Report issued in European Patent Application No. 10174843.2 on Sep. 29, 2010.
Extended European Search Report issued in European Patent Application No. 05703646.9 on Oct. 4, 2010.
Jul. 20, 2010 Korean Office Action issued in Korean Patent Application No. 10-2010-7008438 (with English Translation).
Jul. 20, 2010 Korean Office Action issued in Korean Patent Application No. 10-2010-7008441 (with English Translation).
Jul. 20, 2010 Korean Office Action issued in Korean Patent Application No. 10-2010-7008444 (with English Translation).
Jan. 14, 2011 Office Action issued in U.S. Appl. No. 12/461,852.
Feb. 28, 2011 Office Action issued in Korean Patent Application No. 10-2010-7008441 (with English Translation).

(56) References Cited

OTHER PUBLICATIONS

Feb. 24, 2011 Office Action issued in Chinese Patent Application No. 201010128876.6 (with English Translation).
Feb. 24, 2011 Office Action issued in Chinese Patent Application No. 200910173717.5 (with English Translation).
Mar. 8, 2011 Office Action issued in Chinese Patent Application No. 200910173716.0 (with English Translation).
Mar. 23. 2011 Office Action issued in Chinese Patent Application No. 200910173718.X (with English Translation).
Apr. 26, 2011 Office Action issued in Chinese Patent Application No. 200710110951.4 (with English Translation).
Apr. 25, 2011 Office Action issued in Korean Patent Application No. 10-2011-7001502 (with English Translation).
Apr. 20, 2011 Office Action issued in Chinese Patent Application No. 200710110949.7 (with English Translation).
Apr. 26, 2011 Office Action issued in Chinese Patent Application No. 200710110950.X (with English Translation).
Apr. 28, 2011 Office Action issued in Korean Patent Application No. 10-2006-7012265 (with English Translation).
Apr. 28, 2011 Office Action issued in Korean Patent Application No. 10-2010-7001898 (with English Translation).
May 11, 2011 Office Action issued in European Patent Application No. 04724369.6.
Apr. 25, 2011 Office Action issued in Korean Patent Application No. 10-2010-7008438 (with English Translation).
Apr. 28, 2011 Office Action issued in Korean Patent Application No. 10-2010-7001907 (with English Translation).
Apr. 28, 2011 Office Action issued in Korean Patent Application No. 10-2009-7023904 (with English Translation).
Jun. 14, 2011 Office Action issued in Korean Patent Application No. 10-2011-7006842 (with English Translation).
Jun. 23, 2011 Office Action issued in Chinese Patent Application No. 200910173714.1 (with English Translation).
Jul. 5, 2011 Office Action issued in Chinese Patent Application No. 201010128136.2 (with English Translation).
Jul. 26, 2011 Office Action issued in Korean Patent Application No. 10-2006-7018069 (with English Translation).
Aug. 11, 2011 Office Action issued in Korean Patent Application No. 10-2010-7000893 (with English Translation).
Aug. 4, 2011 Office Action issued in Taiwanese Patent Application No. 093131767 (with English Translation).
Sep. 13, 2011 Office Action issued in European Patent Application No. 04 799 453.8.
Sep. 30, 2011 Office Action issued in Korean Patent Application No. 10-2005-7018973 (with English Translation).
Oct. 10, 2011 Office Action issued in Chinese Patent Application No. 200710110952.9 (with English Translation).
Oct. 18, 2011 Office Action issued in Japanese Patent Application No. 2005-515570 (with English Translation).
Oct. 18, 2011 Office Action issued in Japanese Patent Application No. 2006-262589 (with English Translation).
Nov. 25, 2011 Office Action issued in European Patent Application No. 06711853.9.
Nov. 15, 2011 Office Action issued in European Patent Application No. 09167707.0.
Nov. 10, 2011 Office Action issued in European Patent Application No. 07017146.7.
Dec. 12, 2011 Office Action issued in European Application No. 10 174 843.2.
Nov. 22, 2011 Office Action in Chinese Patent Application No. 200910173718.X (with English Translation).
Jan. 18, 2012 Office Action issued in European Patent Application No. 10 174 843.2.
Feb. 22, 2012 Office Action issued in Chinese Patent Application No. 200910173715.6 (with English Translation).
Feb. 15, 2011 Office Action issued in European Patent Application No. 05 703 646.9.
Mar. 29, 2011 Office Action issued in Japanese Patent Application No. P2007-251263 (with English Translation).
Apr. 5, 2011 Office Action issued in Japanese Patent Application No. 2009-149426 (with English Translation).
Apr. 26, 2011 Office Action issued in U.S. Appl. No. 11/902,282.
Apr. 15, 2011 Office Action issued in European Patent Application No. 04 817 303.3.
May 24, 2011 Office Action issued in U.S. Appl. No. 12/382,277.
Jun. 10, 2011 Office Action issued in U.S. Appl. No. 12/289,515.
Jun. 9, 2011 Office Action issued in U.S. Appl. No. 11/902,277.
Jun. 15, 2011 Notice of Allowance issued in U.S. Appl. No. 12/289,518.
Jul. 8, 2011 Office Action issued in U.S. Appl. No. 12/318,216.
Jul. 20, 2011 Office Action issued in Taiwanese Patent Application No. 094100817 (with English Translation).
Jul. 13, 2011 Notice of Allowance issued in U.S. Appl. No. 11/410,952.
Sep. 1, 2011 Office Action issued in U.S. Appl. No. 11/902,277.
Sep. 6, 2011 Notice of Allowance issued in U.S. Appl. No. 11/644,966.
Nov. 15, 2011 Office Action issued in Korean Patent Application No. 10-2009-7010159 (with English Translation).
Nov. 15, 2011 Office Action issued in Korean Patent Application No. 10-2009-7010158 (with English Translation).
Nov. 30, 2011 Office Action issued in U.S. Appl. No. 11/902,282.
Dec. 14, 2011 Office Action issued in U.S. Appl. No. 11/902,277.
Dec. 16, 2011 Office Action issued in U.S. Appl. No. 13/067,958.
Dec. 15, 2011 Office Action issued in U.S. Appl. No. 12/382,277.
Nov. 17, 2011 Search Report issued in Taiwanese Patent Application No. 096119463 (with English Translation).
Jan. 19, 2012 Office Action issued in U.S. Appl. No. 12/458,635.
Feb. 10, 2012 Office Action issued in European Patent Application No. 10 012 876.8.
Feb. 13, 2012 Office Action issued in Taiwanese Patent Application No. 094100817 (with English Translation).
Mar. 6, 2012 Notice of Allowance issued in U.S. Appl. No. 12/289,515.
Mar. 30, 2012 Office Action issued in U.S. Appl. No. 12/318,216.
Third Party Submission Information Statement issued in Korean Patent Application No. 10-869390, dated Feb. 8, 2011 (with English Translation).
Nov. 12, 2008 Patent Register of Korean Patent Application No. 10-0869390.
Third Party Submission Information Statement issued in Korean Patent Application No. 10-839686, dated Feb. 8, 2011 (with English Translation).
Jun. 12, 2008 Patent Registration of Korean Patent Application No. 10-0839686.
Third Party Submission Information Statement issued in Korean Patent Application No. 10-1020455, dated Mar. 9, 2011 (with English Translation).
Feb. 28, 2011 Patent Register of Korean Patent Application No. 10-1020455.
Third Party Submission Information Statement issued in Korean Patent Application No. 10-1020378, dated Mar. 9, 2011 (with English Translation).
Feb. 28, 2011 Patent Register of Korean Patent Application No. 10-1020378.
Nov. 29, 2011 Written Rebuttal against the Written Answer filed by the Respondent in Korean Patent Application No. 10-2006-7008368 (with English Translation).
Nov. 29, 2011 Written Rebuttal against the Written Answer filed by the Respondent in Korean Patent Application No. 10-2007-7022489 (with English Translation).
Nov. 29, 2011 Written Rebuttal against the Written Answer filed by the Respondent in Korean Patent Application No. 10-2008-7019081 (with English Translation).
Nov. 29, 2011 Written Rebuttal against the Written Answer filed by the Respondent in Korean Patent Application No. 10-2008-7019082 (with English Translation).
"Polarizer," Wikipedia, http://en.Wikipedia.org/wiki/Polarizer, dated Oct. 18, 2011 pp. 1-11.
Korean Language Dictionary, $5^{th}$ Edition, Jan. 10, 2002, MinJungseorim, Seoul, Korea (with English Translation).

(56) References Cited

OTHER PUBLICATIONS

Carl Zeiss SMT GmbH, "Lithographic Systems", http://www.zeiss.com.
Wave Plate, Wikipedia, The Free Encyclopedia, http://en.Wikipedia.org/wiki/Wave_plate, Feb. 7, 2011, pp. 16-1-16-16.
Marc D. Himel et al., "Design and Fabrication of Customized Illumination Patterns for Low k1 Lithography: A Diffractive Approach", Proceedings of SPIE, vol. 4346, pp. 11-1-11-7.
Nov. 28, 2011 Office Action issued in U.S. Appl. No. 12/801,043.
Jan. 25, 2012 Office Action issued in U.S. Appl. No. 12/801,043.
Mar. 8, 2012 Office Action issued in Taiwanese Patent Application No. 093131767 (with English Translation).
Jun. 16, 2010 Office Action issued in U.S. Appl. No. 11/410,952.
Mar. 31, 2011 Notice of Allowance issued in U.S. Appl. No. 11/410,952.
Apr. 6, 2011 Office Action issued in Taiwanese Patent Application No. 093131323 (with English Translation).
Apr. 8, 2011 Office Action issued in Chinese Patent Application No. 200810211496.1 (with English Translation).
Aug. 11, 2011 Office Action issued in Korean Patent Application No. 10-2010-7000897 (with English Translation).
Japanese Office Action issued in Japanese Application No. JP 2005-515570 dated Jan. 17, 2012 (w/ Translation).
Japanese Office Action issued in Japanese Application No. JP 2006-262589 dated Jan. 17, 2012 (w/ Translation).
Apr. 3, 2013 Office Action issued in Chinese Patent Application No. 200910173716.0 (with translation).
Apr. 18, 2013 Office Action issued in Korean Patent Application No. 10-2012-7003793 (with translation).
May 2, 2013 Office Action issued in Taiwanese Patent Application No. 101102214 (with translation).
May 14, 2013 Office Action issued in Japanese Patent Application No. 2011-130545 (with translation).
Apr. 23, 2013 Chinese Office Action issued in Chinese Patent Application No. 201010128876.6 (with translation).
May 16, 2013 Office Action issued in Taiwanese Patent Application No. 098115513 (with translation).
Jun. 13, 2013 Search Report issued in European Patent Application No. 13156325.6.
May 29, 2013 Office Action issued in European Patent Application No. 04799453.8.
Jun. 4, 2013 Office Action issued in Chinese Patent Application No. 200710110950.X (with translation).
Jul. 23, 2013 Office Action issued in U.S. Appl. No. 12/458,635.
Jul. 15, 2013 Office Action issued in U.S. Appl. No. 13/067,958.
Jul. 23, 2013 Office Action issued in U.S. Appl. No. 11/410,952.
Jun. 18, 2013 Search Report issued in European Patent Application No. 13156322.3.
Jun. 21, 2013 Search Report issued in European Patent Application No. 13156324.9.
May 28, 2013 Office Action issued in Japanese Patent Application No. 2011-144669 (with translation).
May 28, 2013 Office Action issued in Japanese Patent Application No. 2010-094216 (with translation).
May 21, 2012 Office Action issued in Chinese Patent Application No. 201010128876.6 (with translation).
Jun. 1, 2012 Office Action issued in European Patent Application No. 09 015 058.2.
May 9, 2012 Office Action issued in Chinese Patent Application No. 200810211496.1 (with translation).
May 4, 2012 Office Action issued in Taiwanese Patent Application No. 096138500 (with translation).
Apr. 26, 2012 Office Action issued in Chinese Patent Application No. 200910126047.1. (with translation).
Apr. 30, 2012 Office Action issued in Korean Patent Application No. 10-2006-7012265 (with translation).
Apr. 30, 2012 Office Action issued in Korean Patent Application No. 10-2010-7001898 (with translation).
Apr. 30, 2012 Office Action issued in Korean Patent Application No. 10-2010-7001907 (with translation).
Apr. 24, 2012 Office Action issued in Japanese Patent Application No. 2009-149426 (with translation).
Apr. 5, 2012 Notice of Allowance issued in U.S. Appl. No. 11/644,966.
Jun. 8, 2012 Office Action issued in Korean Patent Application No. 10-2007-7005320 (with translation).
Jun. 28, 2012 Office Action issued in Korean Patent Application No. 10-2012-7008342 (with translation).
Jun. 11, 2012 Office Action issued in Korean Patent Application No. 10-2012-7003793 (with translation).
Levinson, Harry J., "Principles of Lithography," Bellingham, WA: SPIE Press, 2001, pp. 205-206.
Apr. 24, 2009 Chinese Office Action issued in Chinese Patent Application No. 2006800006868 (with translation).
Feb. 23, 2010 Japanese Office Action issued in Japanese Patent Application No. 2006-262589 (with translation).
Feb. 23, 2010 Japanese Office Action issued in Japanese Patent Application No. 2005-515570 (with translation).
Apr. 22, 2010 Japanese Office Action issued in Japanese Patent Application No. 2006-553907 (with translation).
Aug. 3, 2010 Japanese Office Action issued in Japanese Patent Application No. 2005-515570 (with translation).
Aug. 3, 2010 Notice of Allowance issued in Japanese Patent Application No. 2006-553907.
Aug. 3, 2010 Japanese Office Action issued in Japanese Patent Application No. 2006-262589 (with translation).
Feb. 1, 2011 Chinese Office Action issued in Chinese Patent Application No. 200810126659.6 (with translation).
Oct. 8, 2010 Chinese Office Action issued in Chinese Patent Application No. 200810126659.6 (with translation).
Oct. 26, 2010 Japanese Office Action issued in Japanese Patent Application No. 2005-517637 (with translation).
Oct. 26, 2010 Japanese Office Action issued in Japanese Patent Application No. 2006-262588 (with translation).
Oct. 26, 2010 Japanese Office Action issued in Japanese Patent Application No. 2006-262590 (with translation).
Nov. 12, 2010 Chinese Office Action issued in Chinese Patent Application No. 200710110948.2 (with translation).
Nov. 12, 2010 Chinese Office Action issued in Chinese Patent Application No. 200910126047.1 (with translation).
Nov. 30, 2010 Notice of Allowance issued in Korean Patent Application No. 10-2008-7019081.
Nov. 30, 2010 Notice of Allowance issued in Korean Patent Application No. 10-2008-7019082.
Jan. 24, 2011 Korean Office Action issued in Korean Patent Application No. 2009-7010158 (with translation).
Jan. 24, 2011 Korean Office Action issued in Korean Patent Application No. 2005-7018973 (with translation).
Jan. 25, 2011 Korean Office Action issued in Korean Patent Application No. 2009-7010159 (with translation).
Jan. 26, 2011 Chinese Office Action issued in Chinese Patent Application No. 200910173715.6 (with translation).
Feb. 1, 2011 Japanese Office Action issued in Japanese Patent Application No. 2005-517637 (with translation).
Feb. 1, 2011 Japanese Office Action issued in Japanese Patent Application No. 2006-262588 (with translation).
Feb. 1, 2011 Japanese Office Action issued in Japanese Patent Application No. 2006-262590 (with translation).
Dec. 7, 2010 Extended European Search Report issued in European Patent Application No. 10 01 2876.
May 14, 2008 International Preliminary Report on Patentability issued in International Patent Application No. PCT/JP2006/321607.
May 14, 2008 Written Opinion of the International Searching Authority issued in International Patent Application No. PCT/JP2006/321607 (with translation).
Oct. 4, 2010 International Search Report issued in International Patent Application No. PCT/JP2010/061300.
Oct. 4, 2010 Written Opinion of the International Searching Authority issued in International Patent Application No. PCT/JP2010/061300.
Jan. 25, 2010 Extended European Search Report issued in European Patent Application No. 09 01 5058.

(56) References Cited

OTHER PUBLICATIONS

Jan. 28, 2010 Extended European Search Report issued in European Patent Application No. 06 71 1853.
Feb. 25, 2010 Extended European Search Report issued in European Patent Application No. 06 82 2564.
Nov. 3, 2010 Extended European Search Report issued in European Patent Application No. 09 01 5058.
Feb. 15, 2011 U.S. Office Action issued in U.S. Appl. No. 11/902,277.
Jun. 25, 2008 U.S. Office Action issued in U.S. Appl. No. 11/902,282.
Jun. 25, 2008 U.S. Office Action issued in U.S. Appl. No. 11/902,277.
Jul. 3, 2008 U.S. Office Action issued in U.S. Appl. No. 11/319,057.
Sep. 15, 2008 U.S. Office Action issued in U.S. Appl. No. 11/644,966.
Jan. 8, 2009 U.S. Office Action issued in U.S. Appl. No. 11/410,952.
Feb. 9, 2009 U.S. Office Action issued in U.S. Appl. No. 11/902,282.
Feb. 26, 2009 U.S. Office Action issued in U.S. Appl. No. 11/319,057.
Feb. 26, 2009 U.S. Office Action issued in U.S. Appl. No. 11/347,421.
Apr. 15, 2009 U.S. Office Action issued in U.S. Appl. No. 11/902,277.
Jun. 25, 2009 U.S. Office Action issued in U.S. Appl. No. 11/644,966.
Oct. 29, 2009 U.S. Office Action issued in U.S. Appl. No. 12/289,515.
Nov. 25, 2009 U.S. Office Action issued in U.S. Appl. No. 11/410,952.
Dec. 1, 2009 U.S. Office Action issued in U.S. Appl. No. 11/902,277.
Dec. 14, 2009 U.S. Office Action issued in U.S. Appl. No. 11/902,282.
Jan. 7, 2010 U.S. Office Action issued in U.S. Appl. No. 12/289,518.
Mar. 26, 2010 U.S. Office Action issued in U.S. Appl. No. 11/902,282.
Mar. 26, 2010 U.S. Office Action issued in U.S. Appl. No. 11/902,277.
Apr. 15, 2010 U.S. Office Action issued in U.S. Appl. No. 10/587,254.
Apr. 21, 2010 U.S. Office Action issued in U.S. Appl. No. 12/289,518.
Jul. 12, 2010 U.S. Office Action issued in U.S. Appl. No. 12/461,801.
Jul. 20, 2010 U.S. Notice of Allowance issued in U.S. Appl. No. 12/289,515.
Sep. 27, 2010 U.S. Office Action issued in U.S. Appl. No. 10/587,254.
Oct. 18, 2010 U.S. Office Action issued in U.S. Appl. No. 12/382,277.
Jan. 6, 2011 U.S. Office Action issued in U.S. Appl. No. 11/902,282.
Jan. 11, 2011 U.S. Office Action issued in U.S. Appl. No. 12/461,801.
Jan. 14, 2011 U.S. Office Action issued in U.S. Appl. No. 12/320,468.
Jan. 14, 2011 U.S. Office Action issued in U.S. Appl. No. 12/320,480.
Feb. 8, 2011 U.S. Office Action issued in U.S. Appl. No. 12/320,465.
Kanayamaya et al. U.S. Appl. No. 12/835,860, filed Jul. 14, 2010.
Oct. 18, 2007 European Search Report issued in European Patent Application No. 07017146.7.
Apr. 2, 2007 European Search Report issued in European Patent Application No. 04724369.6.
Oct. 1, 2008 Supplemental European Search Report issued in European Patent Application No. 04817303.3.
Apr. 24, 2008 Supplemental European Search Report issued in European Patent Application No. 08002882.2.
Jun. 25, 2010 European Search Report issued in European Patent Application No. 09167707.0.
Oct. 13, 2009 European Search Report issued in European Patent Application No. 09167707.0.
Feb. 23, 2009 Office Action issued in European Patent Application No. 08002882.2.
Mar. 31, 2009 Office Action issued in European Patent Application No. 04 799 453.8.
May 26, 2010 Office Action issued in European Patent Application No. 07 017 146.7.
May 12, 2009 Office Action issued in European Patent Application No. 04 724 369.6.
Jul. 12, 2010 Office Action issued in European Patent Application No. 06 711 853.9.
Oct. 8, 2010 Office Action issued in European Patent Application No. 06822564.8.
Oct. 7, 2009 Office Action issued in European Patent Application No. 04 799 453.8.
Sep. 25, 2007 Office Action issued in European Patent Application No. 04 799 453.8.
Jan. 18, 2010 Office Action issued in Korean Patent Application No. 10-2008-7019081 (with translation).
Nov. 15, 2007 Office Action issued in Korean Patent Application No. 10-2007-7022489 (with translation).
Apr. 3, 2008 Office Action issued in Korean Patent Application No. 10-2006-7008368 (with translation).
Jan. 4, 2008 Office Action issued in Korean Patent Application No. 10-2006-7008368 (with translation).
Feb. 2, 2007 Office Action issued in Korean Patent Application No. 10-2006-7008368 (with translation).
Jan. 18, 2010 Office Action issued in Korean Patent Application No. 10-2008-7019082 (with translation).
Dec. 3, 2010 Office Action issued in Korean Patent Application No. 10-2008-7029536 (with translation).
Nov. 19, 2010 Office Action issued in Korean Patent Application No. 10-2008-7029535 (with translation).
Oct. 27, 2010 Office Action issued in Korean Patent Application No. 10-2005-7009937 (with translation).
Nov. 30, 2010 Notice of Allowance issued in Korean Patent Application No. 10-2008-7019081 (with translation).
Nov. 30, 2010 Notice of Allowance issued in Korean Patent Application No. 10-2008-7019082 (with translation).
Mar. 27, 2009 Office Action issued in Chinese Patent Application No. 2007101956440 (with translation).
Dec. 14, 2010 Office Action issued in Chinese Patent Application No. 200380104450.5 (with translation).
Jun. 13, 2008 Office Action issued in Chinese Patent Application No. 2003801044505 (with translation).
Jan. 18, 2008 Office Action issued in Chinese Patent Application No. 2003801044505 (with translation).
Jun. 29, 2007 Office Action issued in Chinese Patent Application No. 2003801044505 (with translation).
Oct. 24, 2008 Office Action issued in Chinese Patent Application No. 2007101109529 (with translation).
Nov. 13, 2009 Office Action issued in Chinese Patent Application No. 200810211496.1 (with translation).
Jul. 25, 2008 Office Action issued in Chinese Patent Application No. 200710110949.7 (with translation).
Aug. 21, 2009 Office Action issued in Chinese Patent Application No. 200810126659.6 (with translation).
May 5, 2010 Office Action issued in Chinese Patent Application No. 200810126659.6 (with translation).
Dec. 4, 2009 Office Action issued in Chinese Patent Application No. 2007101109529 (with translation).
Apr. 13, 2010 Office Action issued in Chinese Patent Application No. 2007101109529 (with translation).
Jun. 5, 2009 Office Action issued in Chinese Patent Application No. 2007101109497 (with translation).
Jun. 5, 2009 Office Action issued in Chinese Patent Application No. 2007101109482 (with translation).
Jul. 25, 2008 Office Action issued in Chinese Patent Application No. 2007101109482 (with translation).

(56) References Cited

OTHER PUBLICATIONS

Jun. 5, 2009 Office Action issued in Chinese Patent Application No. 2007101109529 (with translation).
Jun. 5, 2009 Office Action issued in Chinese Patent Application No. 2007101109514 (with translation).
Jul. 25, 2008 Office Action issued in Chinese Patent Application No. 2007101109514 (with translation).
Jun. 5, 2009 Office Action issued in Chinese Patent Application No. 200710110950X (with translation).
Jul. 25, 2008 Office Action issued in Chinese Patent Application No. 200710110950X (with translation).
Jun. 5, 2009 Office Action issued in Chinese Patent Application No. 2007101956421 (with translation).
Apr. 28, 2010 Office Action issued in Chinese Patent Application No. 200710195642.1 (with translation).
Dec. 18, 2009 Office Action issued in Chinese Patent Application No. 2007101956421 (with translation).
Dec. 18, 2009 Office Action issued in Chinese Patent Application No. 2007101956417 (with translation).
Jun. 5, 2009 Office Action issued in Chinese Patent Application No. 2007101956417 (with translation).
Dec. 18, 2009 Office Action issued in Chinese Patent Application No. 2007101956440 (with translation).
Aug. 7, 2009 Office Action issued in Chinese Patent Application No. 2007101956440 (with translation).
Jan. 8, 2010 Office Action issued in Chinese Patent Application No. 2003801044505 (with translation).
Oct. 26, 2004 Office Action issued in Chinese Patent Application No. 200480031414.5 (with translation).
Jun. 10, 2010 Office Action issued in Chinese Patent Application No. 200810211497.6 (with translation).
Feb. 6, 1996 Office Action issued in Taiwanese Patent Application No. 093109836 (with translation).
Jul. 27, 2009 Office Action issued in Taiwanese Patent Application No. 092133642 (with translation).
Mar. 17, 2008 Office Action issued in Taiwanese Patent Application No. 092133642 (with translation).
Jul. 13, 2006 Office Action issued in Taiwanese Patent Application No. 092133642 (with translation).
May 4, 2005 Office Action issued in Taiwanese Patent Application No. 092133642 (with translation).
Dec. 3, 2004 Office Action issued in Taiwanese Patent Application No. 092133642 (with translation).
Jan. 28, 2010 Office Action issued in Japanese Patent Application No. 2008-077129 (with translation).
Jun. 14, 2010 Office Action issued in Japanese Patent Application No. 2010-006125 (with translation).
Apr. 15, 2010 Office Action issued in Japanese Patent Application No. 2007-251263 (with translation).
Mar. 24, 2011 Office Action issued in Japanese Patent Application No. 2007-251263 (with translation).
Jan. 28, 2010 Office Action issued in Japanese Patent Application No. 2005-515005 (with translation).
Feb. 20, 2009 Office Action issued in Japanese Patent Application No. 2005-505207 (with translation).
Mar. 8, 2010 Office Action issued in Japanese Patent Application No. 2005-505207 (with translation).
Aug. 5, 2009 Office Action issued in Japanese Patent Application No. 2004-570728 (with translation).
Nov. 9, 2009 Office Action issued in Japanese Patent Application No. 2003-402584 (with translation).
Nov. 10, 2009 Office Action issued in Japanese Patent Application No. 2003-390672 (with translation).
Sep. 27, 2011 Office Action issued in Japanese Patent Application No. 2010-003941 (with translation).
Feb. 14, 2012 Office Action issued in Japanese Patent Application No. 2010-003941 (with translation).
Sep. 27, 2011 Office Action issued in Japanese Patent Application No. 2010-003938 (with translation).
Feb. 14, 2012 Office Action issued in Japanese Patent Application No. 2010-003938 (with translation).
Mar. 6, 2012 Office Action issued in Japanese Patent Application No. 2007-544099 (with translation).
Sep. 20, 2011 Office Action issued in Japanese Patent Application No. 2009-225810 (with translation).
May 31, 2011 Office Action issued in Japanese Patent Application No. 2009-225810 (with translation).
Jul. 14, 2008 Notice of Allowance issued in U.S. Appl. No. 11/246,642.
Feb. 20, 2007 Office Action issued in U.S. Appl. No. 11/246,642.
May 17, 2007 Office Action issued in U.S. Appl. No. 11/246,642.
Dec. 4, 2007 Office Action issued in U.S. Appl. No. 11/246,642.
Jun. 20, 2008 Corrected Notice of Allowance issued in U.S. Appl. No. 11/140,103.
Apr. 25, 2007 Office Action issued in U.S. Appl. No. 11/140,103.
Jul. 12, 2007 Office Action issued in U.S. Appl. No. 11/140,103.
Feb. 14, 2008 Office Action issued in U.S. Appl. No. 11/140,103.
Nov. 6, 2008 Office Action issued in U.S. Appl. No. 12/155,301.
Apr. 16, 2009 Office Action issued in U.S. Appl. No. 12/155,301.
Sep. 14, 2009 Office Action issued in U.S. Appl. No. 12/155,301.
Apr. 22, 2010 Office Action issued in U.S. Appl. No. 12/155,301.
Aug. 31, 2011 Office Action issued in U.S. Appl. No. 12/093,303.
Jan. 4, 2010 Notice of Allowance issued in U.S. Appl. No. 11/644,966.
Apr. 14, 2010 Notice of Allowance issued in U.S. Appl. No. 11/644,966.
Aug. 2, 2010 Notice of Allowance issued in U.S. Appl. No. 11/644,966.
Feb. 8, 2011 Notice of Allowance issued in U.S. Appl. No. 11/644,966.
Apr. 22, 2008 Office Action issued in U.S. Appl. No. 11/644,966.
Nov. 12, 2008 Office Action issued in U.S. Appl. No. 11/410,952.
Nov. 30, 2010 Notice of Allowance issued in U.S. Appl. No. 12/289,518.
Nov. 18, 2010 Notice of Allowance issued in U.S. Appl. No. 12/289,515.
Mar. 23, 2011 Notice of Allowance issued in U.S. Appl. No. 12/289,515.
Sep. 18, 2012 Office Action issued in Japanese Patent Application No. 2010-094216 (with translation).
Jun. 27, 2012 Office Action issued in Korean Patent Application No. 10-2009-7010158 (with translation).
Oct. 8, 2012 Office Action issued in Chinese Patent Application No. 200910173716.0 (with translation).
Oct. 10, 2012 Office Action issued in Chinese Patent Application No. 200910173717.5 (with translation).
Sep. 4, 2012 Office Action issued in Japanese Patent Application No. 2010-087010 (with translation).
Jul. 30, 2012 Office Action issued in Korean Patent Application No. 10-2006-7018069 (with translation).
Jun. 4, 2012 Office Action issued in Chinese Patent Application No. 200710110950.X (with translation).
Sep. 11, 2012 Office Action issued in Taiwanese Patent Application No. 097117896 (with translation).
Oct. 26, 2012 Office Action issued in Taiwanese Patent Application No. 097117893 (with translation).
Oct. 17, 2012 Notice of Allowance issued in Korean Patent Application No. 10-2010-7001907 (with translation).
Jun. 29, 2012 Office Action issued in Chinese Patent Application No. 200910173714.1 (with translation).
Aug. 20, 2012 Notice of Allowance issued in Taiwanese Patent Application No. 097117881 (with translation).
Dec. 27, 2012 Office Action issued in Taiwanese Patent Application No. 095100035 (with translation).
Dec. 26, 2012 Office Action issued in Taiwanese Patent Application No. 097151814 (with translation).
Dec. 26, 2012 Office Action issued in Taiwanese Patent Application No. 097151805 (with translation).
Dec. 27, 2012 Office Action issued in Taiwanese Patent Application No. 097151801 (with translation).
Oct. 30, 2012 Office Action issued in Korean Patent Application No. 10-2012-7023534 (with translation).

(56) References Cited

OTHER PUBLICATIONS

Dec. 5, 2012 Office Action issued in Taiwanese Patent Application No. 096138500 (with translation).
Dec. 18, 2012 Office Action issued in Japanese Patent Application No. 2009-149426 (with translation).
Jan. 2, 2013 Office Action issued in Korean Patent Application No. 10-2007-7005320 (with translation).
Jan. 7, 2013 Office Action issued in Chinese Patent Application No. 200910173715.6 (with translation).
Jan. 14, 2013 Office Action issued in Chinese Patent Application No. 201010128876.6 (with translation).
Jan. 16, 2013 Office Action issued in Chinese Patent Application No. 200910173714.1 (with translation).
Jan. 14, 2013 Office Action issued in Chinese Patent Application No. 200910126047.1 (with translation).
Jan. 18, 2013 Office Action issued in Chinese Patent Application No. 200810211496.1 (with translation).
Feb. 24, 2013 Office Action issued in Korean Patent Application No. 10-2012-7034127 (with translation).
Feb. 19, 2013 Office Action issued in Japanese Patent Application No. 2010-087010 (with translation).
Feb. 19, 2013 Office Action issued in Japanese Patent Application No. 2011-138703 (with translation).
Feb. 27, 2013 Office Action issued in Korean Patent Application No. 10-2012-7034128 (with translation).
Sep. 18, 2012 Office Action issued in Chinese Patent Application No. 200910173718.X (with translation).
Nov. 21, 2012 Office Action issued in European Patent Application No. 05703646.9.
Sep. 20, 2012 Office Action issued in European Patent Application No. 04 817 303.3.
Aug. 20, 2012 Written Opinion Against the Written Answer issued in Korean Patent Application No. 10-0869390 (with translation).
Aug. 20, 2012 Written Opinion Against the Written Answer issued in Korean Patent Application No. 10-0839686 (with translation).
Aug. 20, 2012 Written Opinion Against the Written Answer issued in Korean Patent Application No. 10-1020455 (with translation).
Aug. 20, 2012 Written Opinion Against the Written Answer issued in Korean Patent Application No. 10-1020378 (with translation).
Jul. 17, 2012 Office Action issued in U.S. Appl. No. 11/902,277.
Jul. 19, 2012 Office Action issued in U.S. Appl. No. 11/902,282.
Jul. 17, 2012 Office Action issued in U.S. Appl. No. 12/382,277.
Feb. 25, 2013 Office Action issued in U.S. Appl. No. 12/382,277.
Aug. 3, 2012 Office Action issued in U.S. Appl. No. 13/137,342.
Aug. 6, 2012 Office Action issued in U.S. Appl. No. 13/137,004.
Aug. 7, 2012 Office Action issued in U.S. Appl. No. 13/137,003.
Oct. 12, 2012 Office Action issued in U.S. Appl. No. 12/458,635.
Nov. 9, 2012 Office Action issued in U.S. Appl. No. 11/644,966.
Dec. 12, 2012 Notice of Allowance issued in U.S. Appl. No. 12/289,515.
Jan. 15, 2013 Notice of Allowance issued in U.S. Appl. No. 13/067,958.
Nov. 6, 2012 Written Opinion against the Written Answer submitted in Korean Patent Application No. 10-839686, Appeal No. 2011Dang301 (with translation).
Nov. 6, 2012 Written Opinion against the Written Answer submitted in Korean Patent Application No. 10-869390, Appeal No. 2011Dang302 (with translation).
Nov. 26, 2012 Written Opinion against the Written Answer submitted in Korean Patent Application No. 10-1020455, Appeal No. 2011Dang510 (with translation).
Nov. 26, 2012 Written Opinion against the Written Answer submitted in Korean Patent Application No. 10-1020378, Appeal No. 2011Dang511 (with translation).
Jan. 9, 2013 Technical Presentation Document submitted in Invalidation Trial against Korean Patent Application No. 839686, Appeal No. 2011Dang301 (with translation).
Jan. 9, 2013 Technical Presentation Document submitted in Invalidation Trial against Korean Patent Application No. 10-869390, Appeal No. 2011Dang302 (with translation).
Jan. 30, 2013 Technical Presentation Document and Supplemental Presentation submitted in Invalidation trial against Korean Patent Application No. 10-1020455, Appeal No. 2011 Dang510 (with translation).
Jan. 30, 2013 Technical Presentation Document and Supplemental Presentation submitted in Invalidation trial against Korean Patent Application No. 10-1020378, Appeal No. 2011 Dang511 (with translation).
Feb. 6, 2013 Written Opinion submitted in Korean Patent Application No. 10-2006-7008368 (with translation).
Feb. 6, 2013 Written Opinion submitted in Korean Patent Application No. 10-2007-7022489 (with translation).
Feb. 6, 2013 Written Opinion submitted in Korean Patent Application No. 10-2008-7019081 (with translation).
Feb. 6, 2013 Written Opinion submitted in Korean Patent Application No. 10-2008-7019082 (with translation).
Feb. 22, 2013 Statement against the Reference Opinion in Korean Patent Application No. 10-2006-7008368 (with translation).
Feb. 22, 2013 Statement against the Reference Opinion in Korean Patent Application No. 10-2007-7022489 (with translation).
Feb. 22, 2013 Statement against the Reference Opinion in Korean Patent Application No. 10-2008-7019081 (with translation).
Feb. 22, 2013 Statement against the Reference Opinion in Korean Patent Application No. 10-2008-7019082 (with translation).
Halliday, et al., "Fundamentals of Physics: Extended, with Modern Physics", John Wiley & Sons, Inc., Jul. 25, 1995 (with partial translation).
Jan. 29, 2013 Written Opinion submitted in Korean Patent Application No. 10-0839686 Appeal No. 2011 Dang301 (with translation).
Jan. 29, 2013 Written Opinion submitted in Korean Patent Application No. 10-0869390 Appeal No. 2011 Dang302 (with translation).
Hecht, "Optics Fourth Edition," Addison Wesley, 2002, Preface, "Polarization", pp. 325-358, and "Diffraction," pp. 443-485.
Hecht, "Optics Second Edition," Addison Wesley, 1974 "Polarization", pp. 395-449, and "Diffraction", pp. 573-630 (with translation).
Bass et al., "Handbook of Optics, Fundamentals, Techniques and Design", Second Edition vol. 1, McGraw-Hill, 1995, pp. 5.22-5.25.
Herzig, "Micro-Optics, Elements, Systems and Applications", Taylor & Francis, 1997, pp. vii-29.
Sep. 18, 2012 Office Action issued in Japanese Patent Application No. 2011-144669 (with translation).
Jul. 1, 2013 Preparatory Document (1), Patent Invalidation Action 2013HEO3937 issued in Korean Patent Application No. 10-2006-7008368 (with translation).
Jul. 1, 2013 Preparatory Document (1), Patent Invalidation Action 2013HEO3920 issued in Korean Patent Application No. 10-2007-7022489 (with translation).
Jul. 1, 2013 Preparatory Document (1), Patent Invalidation Action 2013HEO3944 issued in Korean Patent Application No. 10-2008-7019081 (with translation).
Jul. 1, 2013 Preparatory Document (1), Patent Invalidation Action 2013HEO3951 issued in Korean Patent Application No. 10-2008-7019082 (with translation).
Jul. 1, 2013 Definition of Technical Terms (with translation).
Doosan Encyclopedia, Optic axis (with translation).
Bass et al., "Handbook of Optics", McGraw-Hill, 1995.
Buhrer, "Four waveplate dual tuner for birefringent filters and multiplexers", Applied Optics vol. 26, No. 17, Sep. 1, 1987, pp. 3628-3632.
Niziev et al., "Influence of Beam Polarization on Laser Cutting Efficiency", Journal of Physics D Applied Physics 32, 1999, pp. 1455-1461.
Bagini et al., "The Simon-Mukunda polarization gadget", Eur. J. Phys. 17, 1996, pp. 279-284.
McGuire Jr., et al., "Analysis of spatial pseudodepolarizers in imaging systems", Optical Engineering, vol. 29 No. 12, 1990, pp. 1478-1484.
Sep. 11, 2013 Office Action issued in U.S. Appl. No. 13/890,603.

(56) References Cited

OTHER PUBLICATIONS

Aug. 23, 2013 Reply Brief, Patent Invalidation Action 2013HEO3975 issued in Korean Patent Application No. 10-2007-7022489 (with translation).
Aug. 23, 2013 Reply Brief, Patent Invalidation Action 2013HEO3982 issued in Korean Patent Application No. 10-2008-7019081 (with translation).
Mar. 14, 2014 Office Action issued in U.S. Appl. No. 13/889,798.
Jan. 23, 2014 "Submission Document for Korean Patent Invalidation Action No. 2013HEO3920" issued in Korean Patent Application No. 10-2007-7022489 (with English translation).
Jan. 23, 2014 "Submission Document for Korean Patent Invalidation Action No. 2013HEO3937" issued in Korean Patent Application No. 10-2006-7008368 (with English translation).
Jan. 23, 2014 "Submission Document for Korean Patent Invalidation Action No. 2013HEO3944" issued in Korean Patent Application No. 10-2008-7019081 (with English translation).
Jan. 23, 2014 "Submission Document for Korean Patent Invalidation Action No. 2013HEO3951" issued in Korean Patent Application No. 10-2008-7019082 (with English translation).
Jan. 23, 2014 "Submission Document for Korean Patent Invalidation Action No. 2013HEO3975" issued in Korean Patent Application No. 10-2007-7022489 (with English translation).
Jan. 23, 2014 "Submission Document for Korean Patent Invalidation Action No. 2013HEO3982" issued in Korean Patent Application No. 10-2008-7019081 (with English translation).
Apr. 4, 2014 Office Action issued in Chinese Patent Application No. 200910173718.X (with translation).
Apr. 29, 2014 Office Action issued in European Patent Application No. 13156325.6.
Apr. 29, 2014 Office Action issued in European Patent Application No. 13156324.9.
Apr. 29, 2014 Office Action issued in European Patent Application No. 13156322.3.
Apr. 16, 2014 Office Action issued in U.S. Appl. No. 12/458,635.
Apr. 23, 2014 Submission Document for Korean Patent Invalidation Action No. 2013HEO3920 (with English translation).
Apr. 23, 2014 Submission Document for Korean Patent Invalidation Action No. 2013HEO3937 (with English translation).
Apr. 23, 2014 Submission Document for Korean Patent Invalidation Action No. 2013HEO3944 (with English translation).
Apr. 23, 2014 Submission Document for Korean Patent Invalidation Action No. 2013HEO3951 (with English translation).
Apr. 23, 2014 Submission Document for Korean Patent Invalidation Action No. 2013HEO3975 (with English translation).
Apr. 23, 2014 Submission Document for Korean Patent Invalidation Action No. 2013HEO3982 (with English translation).
Feb. 13, 2014 Office Action issued in Chinese Patent Application No. 200910126047.1 (with English translation).
Dec. 4, 2013 Chinese Office Action issued in Chinese Patent Application No. 200710110950.X (with translation).
Dec. 17, 2013 Korean Office Action issued in Korean Patent Application No. 10-2013-7026632 (with translation).
Dec. 18, 2013 Korean Office Action issued in Korean patent Application No. 10-2012-7034127 (with translation).
Oct. 10, 2013 Office Action issued in U.S. Appl. No. 13/890,547.
Oct. 15, 2013 Office Action issued in U.S. Appl. No. 13/137,342.
Oct. 16, 2013 Office Action issued in U.S. Appl. No. 13/137,003.
Oct. 17, 2013 Notice of Allowance issued in Korean Patent Application No. 10-2012-7008342 (with translation).
Oct. 29, 2013 Office Action issued in U.S. Appl. No. 13/890,142.
Oct. 21, 2013 Office Action issued in U.S. Appl. No. 13/137,002.
Oct. 17, 2013 Notice of Allowance issued in U.S. Appl. No. 11/902,277.
Oct. 18, 2013 Office Action issued in U.S. Appl. No. 11/902,282.
Oct. 29, 2013 Office Action issued in U.S. Appl. No. 13/890,547.
Nov. 5, 2013 Office Action issued in Japanese Patent Application No. 2012-080675 (with translation).
Nov. 5, 2013 Office Action issued in Japanese Patent Application No. 2012-080678 (with translation).
Nov. 20, 2013 Office Action issued in U.S. Appl. No. 12/289,515.
H.G. Oh, "Notarial Certificate of affiant Professor H.G. Oh", Oct. 22, 2013, pp. 1-29-1-15 (with translation).
Totzek, "Declaration of Dr. Michael Totzeck", Oct. 8, 2013 pp. 1-32 (with translation).
"Korean patent office guidelines for examination", 2010 (with partial translation).
Oct. 25, 2013 Preparatory Document (2-1), Korean Invalidation Action 2013HEO03937 (with translation).
Oct. 25, 2013 Preparatory Document (2-2) Korean Invalidation Action 2013HEO03937 (with translation).
Dec. 13, 2013 Office Action issued in European Patent Application No. 09015058.2.
Nov. 7, 2013 Office Action issued in U.S. Appl. No. 12/289,518.
Nov. 8, 2013 Office Action issued in U.S. Appl. No. 13/912,832.
Nov. 12, 2013 Office Action issued in U.S. Appl. No. 13/889,860.
Feb. 2, 2015 Office Action issued in U.S. Appl. No. 13/912,832.
Feb. 5, 2015 Office Action issued in U.S. Appl. No. 12/289,515.
Feb. 10, 2015 Office Action issued in Korean Patent Application No. 10-2014-7003559.
Feb. 11, 2015 Office Action issued in Korean Patent Application No. 10-2010-7008441.
May 15, 2014 Decision Rendered by Division II of Korean Patent Court for Korean Patent Invalidation Action No. 2013HEO3920 (with English translation).
May 15, 2014 Decision Rendered by Division II of Korean Patent Court for Korean Patent Invalidation Action No. 2013HEO3937 (with English translation).
May 15, 2014 Decision Rendered by Division II of Korean Patent Court for Korean Patent Invalidation Action No. 2013HEO3944 (with English translation).
May 15, 2014 Decision Rendered by Division II of Korean Patent Court for Korean Patent Invalidation Action No. 2013HEO3951 (with English translation).
May 15, 2014 Decision Rendered by Division II of Korean Patent Court for Korean Patent Invalidation Action No. 2013HEO3975 (with English translation).
May 15, 2014 Decision Rendered by Division II of Korean Patent Court for Korean Patent Invalidation Action No. 2013HEO3982 (with English translation).
Jun. 5, 2014 Office Action issued in U.S. Appl. No. 13/890,603.
Jun. 24, 2014 Office Action issued in European Patent Application No. EP 04817303.3.
Jun. 26, 2014 Search Report issued in European Patent Application No. EP 13165334.7.
Jun. 26, 2014 Search Report issued in European Patent Application No. EP 13165335.4.
Jun. 26, 2014 Search Report issued in European Patent Application No. EP 13165338.8.
Jun. 26, 2014 Search Report issued in European Patent Application No. EP 13165340.4.
Sep. 10, 2014 Office Action issued in U.S. Appl. No. 13/890,547.
Jan. 6, 2014 Office Action issued in Chinese Patent Application No. 200910173717.5.
Feb. 5, 2014 Office Action issued in U.S. Appl. No. 12/382,277.
Feb. 6, 2014 Office Action issued in U.S. Appl. No. 13/890,142.
Feb. 6, 2014 Office Action issued in U.S. Appl. No. 13/890,547.
Jan. 29, 2015 Office Action issued in U.S. Appl. No. 13/889,860.
The Second Division of Korean Patent Court, "Preparatory Document (3), Re: Patent Invalidation Action 2013HEO3920, Plaintiff: Carl Zeiss SMT GmbH, Defendant: Nikon Corporation" Dec. 13, 2013.
The Second Division of Korean Patent Court, "Preparatory Document (2), Re: Patent Invalidation Action 2013HEO3920, Plaintiff: Carl Zeiss SMT GmbH, Defendant: Nikon Corporation" Oct. 30, 2013.
The Second Divison of Korean Patent Court, "Preparatory document (3), Re: Patent Invalidation Action 2013HEO3937, Plaintiff: Carl Zeiss SMT GmbH, Defendant: Nikon Corporation" Dec. 13, 2013.

(56) References Cited

OTHER PUBLICATIONS

The Second Division of Korean Patent Court, "Preparatory Document (3), Re: Patent Invalidation Action 2013HEO3944, Plaintiff: Carl Zeiss SMT GmbH, Defendant: Nikon Corporation" Dec. 13, 2013.
The Second Division of Korean Patent Court, "Preparatory Document (2), Re: Patent Invaliation Action 2013HEO3944, Plaintiff: Carl Zeiss SMT GmbH, Defendant: Nikon Corporation" Oct. 30, 2013.
The Second Division of Korean Patent Court, "Preparatory Document (3), Re: Patent Invalidation Action 2013HEO3951, Plaintiff: Carl Zeiss SMT GmbH, Defendant: Nikon Corporation" Dec. 13, 2013.
The Second Division of Korean Patent Court, "Preparatory Document (2), Re: Patent Invalidation Action 2013HEO3951, Plaintiff: Carl Zeiss SMT GmbH, Defendant: Nikon Corporation" Oct. 30, 2013.
The Second Division of Korean Patent Court, "Reference Document, Re: Patent Invalidation Action 2013HEO3975, Plaintiff: Nikon Corporation, Defendant: Carl Zeiss SMT GmbH" Jan. 14, 2014.
Jun. 6, 2014 Office Action issued in Taiwanese Patent Application No. 101103772 (with translation).
Jul. 16, 2014 Office Action issued in U.S. Appl. No. 12/289,515.
Jun. 25, 2014 Office Action issued in U.S. Appl. No. 13/889,860.
Jun. 27, 2014 Office Action issued in U.S. Appl. No. 13/912,832.
Sep. 12, 2014 Office Action issued in U.S. Appl. No. 13/890,142.
Sep. 11, 2014 Office Action issued in U.S. Appl. No. 12/382,277.
Oct. 21, 2014 Office Action issued in Japanese Application No. P2013-272100.
Nov. 5, 2014 Office Action issued in Chinese Patent Application No. 200910126047.01.
Dec. 2, 2014 Office Action issued in Japanese Application No. 2013-272068.
Aug. 28, 2014 Office Action issued in Korean Patent Application No. 10-2012-7034128 (with translation).
Dec. 10, 2014 Office Action issued in U.S. Appl. No. 12/289,518.
Jun. 3, 2014 Office Action issued in Japanese Patent Application No. P2013-157042 (with translation).
Jun. 3, 2014 Office Action issued in Japanese Patent Application No. P2013-157044 (with translation).
Aug. 6, 2014 Office Action issued in U.S. Appl. No. 13/137,003 in the name of Toyoda.
Aug. 6, 2014 Office Action issued in U.S. Appl. No. 13/137,002 in the name of Toyoda.
Aug. 6, 2014 Office Action issued in U.S. Appl. No. 13/137,342 in the name of Toyoda.
Jun. 13, 2014 Office Action issued in Taiwanese Patent Application No. 101133189 (with translation).
Jun. 13, 2014 Office Action issued in Taiwanese Patent Application No. 101141665 (with translation).
Aug. 11, 2014 Office Action issued in Taiwanese Patent Application No. 101102214 (with translation).
Mar. 24, 2015 Office Action issued in Japanese Patent Application No. 2014-087750.
Apr. 6, 2015 Office Action issued in U.S. Appl. No. 14/048,563.
Apr. 24, 2015 Office Action issued in U.S. Appl. No. 13/890,142.
Apr. 21, 2015 Office Action issued in U.S. Appl. No. 13/890,547.
Apr. 27, 2015 Office Action issued in Korean Patent Application No. 10-2014-7009172.
Jun. 23, 2015 Office Action issued in Japanese Application No. 2014-158994.
Jul. 20, 2015 Notice of Allowance issue in U.S. Appl. No. 13/067,958.
Jul. 16, 2015 Office Action issued in U.S. Appl. No. 13/912,832.
Jul. 15, 2015 Office Action issued in U.S. Appl. No. 12/289,515.
Jul. 16, 2015 Office Action issued in U.S. Appl. No. 13/889,860.
Aug. 4, 2015 Office Action issued in Japanese Application No. 2014-197119.
Aug. 4, 2015 Office Action issued in Japanese Application No. 2014-216961.
Aug. 4, 2015 Office Action issued in Japanese Application No. 2014-216964.
Oct. 6, 2015 Office Action issued in Japanese Application No. 2014-256977.
Oct. 22, 2015 Office Action issued in U.S. Appl. No. 14/713,428.
Oct. 22, 2015 Office Action issued in U.S. Appl. No. 14/048,563.
Oct. 8, 2015 Office Action issued in Korean Application No. 10-2010-7008441.
Nov. 16, 2015 Office Action issued in Korean Application No. 10-2014-7003559.
Jan. 5, 2016 Office Action issued in Japanese Application No. 2015-018675.
Dec. 1, 2015 Office Action issued in Korean Application No. 10-2014-7036570.
Jan. 21, 2016 Advisory Action issued in U.S. Appl. No. 13/889,860.
Jan. 21, 2016 Advisory Action received in U.S. Appl. No. 12/289,515.
Dec. 30, 2015 Office Action issued in Taiwanese Application No. 102142028.
Feb. 1, 2016 Office Action issued in Korean Application No. 10-2015-7005285.
Jan. 12, 2016 Office Action issued in Taiwanese Application No. 103116064.
Mar. 23, 2016 Office Action issued in U.S. Appl. No. 13/890,142.
Mar. 24, 2016 Office Action issued in U.S. Appl. No. 13/890,547.
Jan. 27, 2016 Office Action issued in Taiwanese Application No. 103116066.
May 24, 2016 Office Action issued in Japanese Application No. JP2015-165058.
May 17, 2016 Office Action issued in U.S. Appl. No. 14/713,385.
Jun. 14, 2016 Office Action issued in Japanese Patent Application No. 2014-256977.

ILLUMINATION OPTICAL APPARATUS, EXPOSURE APPARATUS, AND EXPOSURE METHOD WITH OPTICAL INTEGRATOR AND POLARIZATION MEMBER THAT CHANGES POLARIZATION STATE OF LIGHT

CROSS-REFERENCE TO RELATED APPLICATIONS

This is a continuation of application Ser. No. 13/137,002 filed on Jul. 14, 2011, which is a continuation of application Ser. No. 12/461,852 filed on Aug. 26, 2009 (abandoned), which is a continuation of application Ser. No. 11/319,057 filed on Dec. 28, 2005 (abandoned), which is a continuation-in-part of Application No. PCT/JP2004/016247 filed on Nov. 2, 2004, which claims the benefit of Japanese Application No. 2003-390674 filed on Nov. 20, 2003. The disclosures of the prior applications are incorporated by reference herein in their entireties.

BACKGROUND OF THE INVENTION

1. Field of the Invention

The present invention relates to a beam transforming element, illumination optical apparatus, exposure apparatus, and exposure method and, more particularly, to an illumination optical apparatus suitably applicable to exposure apparatus used in production of microdevices such as semiconductor elements, image pickup elements, liquid crystal display elements, and thin-film magnetic heads by lithography.

2. Related Background Art

In the typical exposure apparatus of this type, a beam emitted from a light source travels through a fly's eye lens as an optical integrator to form a secondary light source as a substantial surface illuminant consisting of a number of light sources. Beams from the secondary light source (generally, an illumination pupil distribution formed on or near an illumination pupil of the illumination optical apparatus) are limited through an aperture stop disposed near the rear focal plane of the fly's eye lens and then enter a condenser lens.

The beams condensed by the condenser lens superposedly illuminate a mask on which a predetermined pattern is formed. The light passing through the pattern of the mask is focused on a wafer through a projection optical system. In this manner, the mask pattern is projected for exposure (or transcribed) onto the wafer. The pattern formed on the mask is a highly integrated pattern, and, in order to accurately transcribe this microscopic pattern onto the wafer, it is indispensable to obtain a uniform illuminance distribution on the wafer.

For example, Japanese Patent No. 3246615 owned by the same Applicant of the present application discloses the following technology for realizing the illumination condition suitable for faithful transcription of the microscopic pattern in arbitrary directions: the secondary light source is formed in an annular shape on the rear focal plane of the fly's eye lens and the beams passing the secondary light source of the annular shape are set to be in a linearly polarized state with a direction of polarization along the circumferential direction thereof (hereinafter referred to as a "azimuthal polarization state").

SUMMARY OF THE INVENTION

An object of the present invention is to form an illumination pupil distribution of an annular shape in a azimuthal polarization state while well suppressing the loss of light quantity. Another object of the present invention is to transcribe a microscopic pattern in an arbitrary direction under an appropriate illumination condition faithfully and with high throughput, by forming an illumination pupil distribution of an annular shape in a azimuthal polarization state while well suppressing the loss of light quantity.

In order to achieve the above objects, a first aspect of the present embodiment is to provide a beam transforming element for forming a predetermined light intensity distribution on a predetermined surface on the basis of an incident beam, comprising:

a first basic element made of an optical material with optical activity, for forming a first region distribution of the predetermined light intensity distribution on the basis of the incident beam; and a second basic element made of an optical material with optical activity, for forming a second region distribution of the predetermined light intensity distribution on the basis of the incident beam, wherein the first basic element and the second basic element have their respective thicknesses different from each other along a direction of transmission of light.

A second aspect of the present embodiment is to provide a beam transforming element for, based on an incident beam, forming a predetermined light intensity distribution of a shape different from a sectional shape of the incident beam, on a predetermined surface, comprising:

a diffracting surface or a refracting surface for forming the predetermined light intensity distribution on the predetermined surface, wherein the predetermined light intensity distribution is a distribution in at least a part of a predetermined annular region, which is a predetermined annular region centered around a predetermined point on the predetermined surface, and wherein a beam from the beam transforming element passing through the predetermined annular region has a polarization state in which a principal component is linearly polarized light having a direction of polarization along a circumferential direction (azymuthally direction) of the predetermined annular region.

A third aspect of the present invention is to provide an illumination optical apparatus for illuminating a surface to be illuminated, based on a beam from a light source, comprising:

the beam transforming element of the first aspect or the second aspect for transforming the beam from the light source in order to form an illumination pupil distribution on or near an illumination pupil of the illumination optical apparatus.

A fourth aspect of the present embodiment is to provide an exposure apparatus comprising the illumination optical apparatus of the third aspect for illuminating a pattern, the exposure apparatus being arranged to project the pattern onto a photosensitive substrate.

A fifth aspect of the present embodiment is to provide an exposure method comprising: an illumination step of illuminating a pattern by use of the illumination optical apparatus of the third aspect; and an exposure step of projecting the pattern onto a photosensitive substrate.

The illumination optical apparatus of the present embodiment, different from the conventional technology giving rise to the large loss of light quantity at the aperture stop, is able to form the illumination pupil distribution of the annular shape in the azimuthal polarization state, with no substantial loss of light quantity, by diffraction and optical rotating action of the diffractive optical element as the beam transforming element. Namely, the illumination optical apparatus of the present invention is able to form the illumination pupil distribution of the annular shape in the azimuthal polarization state while well suppressing the loss of light quantity.

Since the exposure apparatus and exposure method using the illumination optical apparatus of the present embodiment are arranged to use the illumination optical apparatus capable of forming the illumination pupil distribution of the annular shape in the azimuthal polarization state while well suppressing the loss of light quantity, they are able to transcribe a microscopic pattern in an arbitrary direction under an appropriate illumination condition faithfully and with high throughput and, in turn, to produce good devices with high throughput.

The present invention will be more fully understood from the detailed description given hereinbelow and the accompanying drawings, which are given by way of illustration only and are not to be considered as limiting the embodiment.

Further scope of applicability of the embodiment will become apparent from the detailed description given hereinafter. However, it should be understood that the detailed description and specific examples, while indicating preferred embodiments of the invention, are given by way of illustration only, since various changes and modifications within the spirit and scope of the invention will be apparent to those skilled in the art from this detailed description.

DETAILED DESCRIPTION OF THE PREFERRED EMBODIMENTS

Embodiments of the present invention will be described based on the accompanying drawings.

Figure 1:
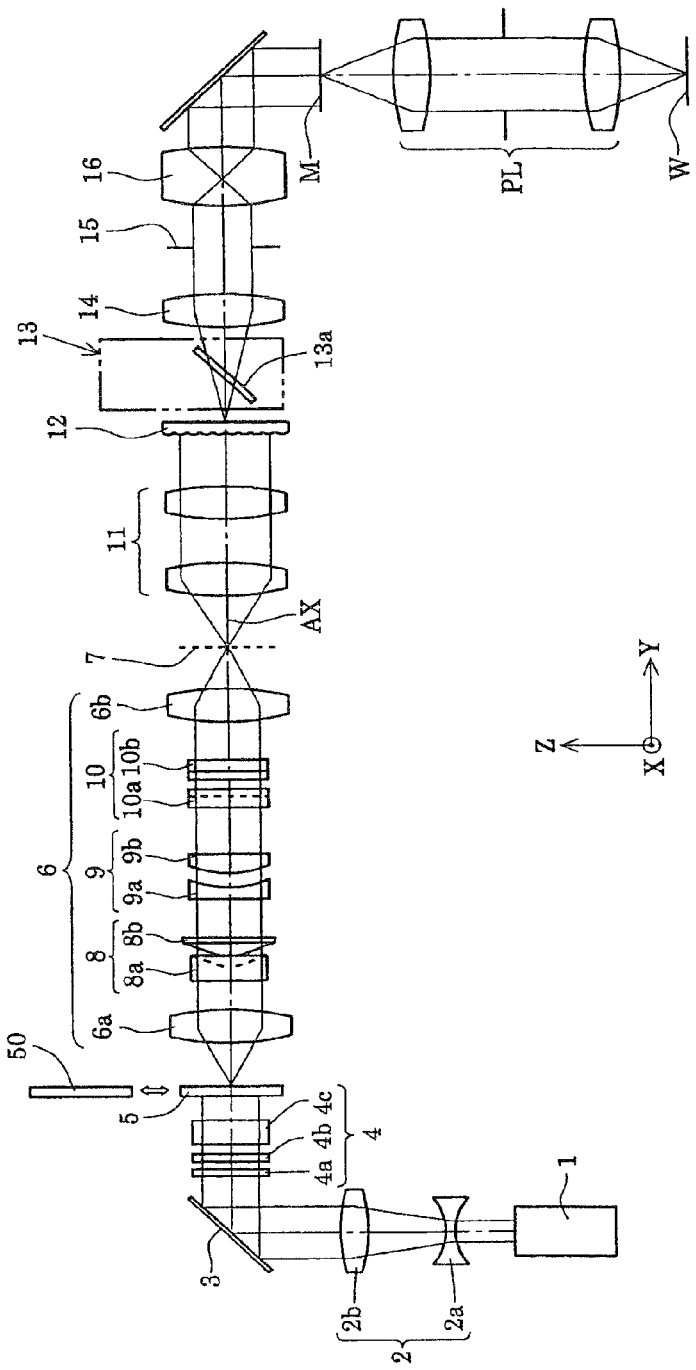
FIG. 1 is an illustration schematically showing a configuration of an exposure apparatus with an illumination optical apparatus according to an embodiment of the present invention.

FIG. 1 is an illustration schematically showing a configuration of an exposure apparatus with an illumination optical apparatus according to an embodiment of the present invention. In FIG. 1, the Z-axis is defined along a direction of a normal to a wafer W being a photosensitive substrate, the Y-axis along a direction parallel to the plane of FIG. 1 in the plane of the wafer W, and the X-axis along a direction of a normal to the plane of FIG. 1 in the plane of wafer W. The exposure apparatus of the present embodiment is provided with a light source 1 for supplying exposure light (illumination light).

The light source 1 can be, for example, a KrF excimer laser light source for supplying light with the wavelength of 248 nm, an ArF excimer laser light source for supplying light with the wavelength of 193 nm, or the like. A nearly parallel beam emitted along the Z-direction from the light source 1 has a cross section of a rectangular shape elongated along the X-direction, and is incident to a beam expander 2 consisting of a pair of lenses 2a and 2b. The lenses 2a and 2*b* have a negative refracting power and a positive refracting power, respectively, in the plane of FIG. 1 (or in the YZ plane). Therefore, the beam incident to the beam expander 2 is enlarged in the plane of FIG. 1 and shaped into a beam having a cross section of a predetermined rectangular shape.

The nearly parallel beam passing through the beam expander 2 as a beam shaping optical system is deflected into the Y-direction by a bending mirror 3, and then travels through a quarter wave plate 4*a*, a half wave plate 4*b*, a depolarizer (depolarizing element) 4*c*, and a diffractive optical element 5 for annular illumination to enter an afocal lens 6. Here the quarter wave plate 4*a*, half wave plate 4*b*, and depolarizer 4*c* constitute a polarization state converter 4, as described later. The afocal lens 6 is an afocal system (afocal optic) set so that the front focal position thereof approximately coincides with the position of the diffractive optical element 5 and so that the rear focal position thereof approximately coincides with the position of a predetermined plane 7 indicated by a dashed line in the drawing.

In general, a diffractive optical element is constructed by forming level differences with the pitch of approximately the wavelength of exposure light (illumination light) in a substrate and has the action of diffracting an incident beam at desired angles. Specifically, the diffractive optical element 5 for annular illumination has the following function: when a parallel beam having a rectangular cross section is incident thereto, it forms a light intensity distribution of an annular shape in its far field (or Fraunhofer diffraction region). Therefore, the nearly parallel beam incident to the diffractive optical element 5 as a beam transforming element forms a light intensity distribution of an annular shape on the pupil plane of the afocal lens 6 and then emerges as a nearly parallel beam from the afocal lens 6.

In an optical path between front lens unit 6*a* and rear lens unit 6*b* of the afocal lens 6 there are a conical axicon system 8, a first cylindrical lens pair 9, and a second cylindrical lens pair 10 arranged in order from the light source side on or near the pupil plane of the afocal lens, and the detailed configuration and action thereof will be described later. For easier description, the fundamental configuration and action will be described below, in disregard of the action of the conical axicon system 8, first cylindrical lens pair 9, and second cylindrical lens pair 10.

The beam through the afocal lens 6 travels through a zoom lens 11 for variation of σ-value and then enters a micro fly's eye lens (or fly's eye lens) 12 as an optical integrator. The micro fly's eye lens 12 is an optical element consisting of a number of micro lenses with a positive refracting power arranged lengthwise and breadthwise and densely. In general, a micro fly's eye lens is constructed, for example, by forming a micro lens group by etching of a plane-parallel plate.

Here each micro lens forming the micro fly's eye lens is much smaller than each lens element forming a fly's eye lens. The micro fly's eye lens is different from the fly's eye lens consisting of lens elements spaced from each other, in that a number of micro lenses (micro refracting surfaces) are integrally formed without being separated from each other. In the sense that lens elements with a positive refracting power are arranged lengthwise and breadthwise, however, the micro fly's eye lens is a wavefront splitting optical integrator of the same type as the fly's eye lens. Detailed explanation concerning the micro fly's eye lens capable of being used in the present invention is disclosed, for example, in U.S. Pat. No. 6,913,373(B2) which is incorporated herein by reference in its entirety.

The position of the predetermined plane 7 is arranged near the front focal position of the zoom lens 11, and the entrance surface of the micro fly's eye lens 12 is arranged near the rear focal position of the zoom lens 11. In other words, the zoom lens 11 arranges the predetermined plane 7 and the entrance surface of the micro fly's eye lens 12 substantially in the relation of Fourier transform and eventually arranges the pupil plane of the afocal lens 6 and the entrance surface of the micro fly's eye lens 12 approximately optically conjugate with each other.

Accordingly, for example, an illumination field of an annular shape centered around the optical axis AX is formed on the entrance surface of the micro fly's eye lens 12, as on the pupil plane of the afocal lens 6. The entire shape of this annular illumination field similarly varies depending upon the focal length of the zoom lens 11. Each micro lens forming the micro fly's eye lens 12 has a rectangular cross section similar to a shape of an illumination field to be formed on a mask M (eventually, a shape of an exposure region to be formed on a wafer W).

Figure 2:
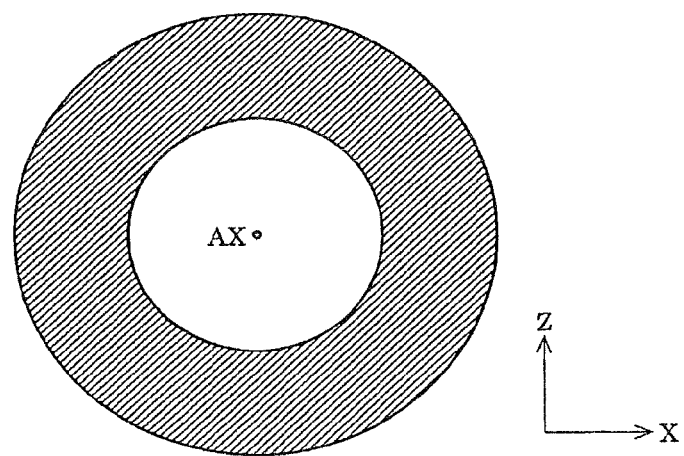
FIG. 2 is an illustration showing a secondary light source of an annular shape formed in annular illumination.

The beam incident to the micro fly's eye lens 12 is two-dimensionally split by a number of micro lenses to form on its rear focal plane (eventually on the illumination pupil) a secondary light source having much the same light intensity distribution as the illumination field formed by the incident beam, i.e., a secondary light source consisting of a substantial surface illuminant of an annular shape centered around the optical axis AX, as shown in FIG. 2. Beams from the secondary light source formed on the rear focal plane of the micro fly's eye lens 12 (in general, an illumination pupil distribution formed on or near the pupil plane 12*aa* of the illumination optical apparatus) travel through beam splitter 13*a* and condenser optical system 14 to superposedly illuminate a mask blind 15.

In this manner, an illumination field of a rectangular shape according to the shape and focal length of each micro lens forming the micro fly's eye lens 12 is formed on the mask blind 15 as an illumination field stop. The internal configuration and action of polarization monitor 13 incorporating a beam splitter 13*a* will be described later. Beam through a rectangular aperture (light transmitting portion) of the mask blind 15 are subject to light condensing action of imaging optical system 16 and thereafter superposedly illuminate the mask M on which a predetermined pattern is formed.

Namely, the imaging optical system 16 forms an image of the rectangular aperture of the mask blind 15 on the mask M. A beam passing through the pattern of mask M travels through a projection optical system PL to form an image of the mask pattern on the wafer W being a photosensitive substrate. In this manner, the pattern of the mask M is sequentially printed in each exposure area on the wafer W through full-wafer exposure or scan exposure with two-dimensional drive control of the wafer W in the plane (XY plane) perpendicular to the optical axis AX of the projection optical system PL.

In the polarization state converter 4, the quarter wave plate 4*a* is arranged so that its crystallographic axis is rotatable around the optical axis AX, and it transforms incident light of elliptical polarization into light of linear polarization. The half wave plate 4*b* is arranged so that its crystallographic axis is rotatable around the optical axis AX, and it changes the plane of polarization of linearly polarized light incident thereto. The depolarizer 4*c* is composed of a wedge-shaped crystalline quartz prism (not shown) and a wedge-shaped fused sillica prism (not shown) having complementary shapes. The crystalline quartz prism and the fussed sillica prism are constructed as an integral prism assembly so as to be set into and away from the illumination optical path.

Where the light source 1 is the KrF excimer laser light source or the ArF excimer laser light source, light emitted from these light sources typically has the degree of polarization of 95% or more and light of almost linear polarization is incident to the quarter wave plate 4a. However, if a right-angle prism as a back-surface reflector is interposed in the optical path between the light source 1 and the polarization state converter 4, the linearly polarized light will be changed into elliptically polarized light by virtue of total reflection in the right-angle prism unless the plane of polarization of the incident, linearly polarized light agrees with the P-polarization plane or S-polarization plane.

In the case of the polarization state converter 4, for example, even if light of elliptical polarization is incident thereto because of the total reflection in the right-angle prism, light of linear polarization transformed by the action of the quarter wave plate 4a will be incident to the half wave plate 4b. Where the crystallographic axis of the half wave plate 4b is set at an angle of 0° or 90° relative to the plane of polarization of the incident, linearly polarized light, the light of linear polarization incident to the half wave plate 4b will pass as it is, without change in the plane of polarization.

Where the crystallographic axis of the half wave plate 4b is set at an angle of 45° relative to the plane of polarization of the incident, linearly polarized light, the light of linear polarization incident to the half wave plate 4b will be transformed into light of linear polarization with change of polarization plane of 90°. Furthermore, where the crystallographic axis of the crystalline quartz prism in the depolarizer 4c is set at an angle of 45° relative to the polarization plane of the incident, linearly polarized light, the light of linear polarization incident to the crystalline quartz prism will be transformed (or depolarized) into light in an unpolarized state.

The polarization state converter 4 is arranged as follows: when the depolarizer 4c is positioned in the illumination optical path, the crystallographic axis of the crystalline quartz prism makes the angle of 45° relative to the polarization plane of the incident, linearly polarized light. Incidentally, where the crystallographic axis of the crystalline quartz prism is set at the angle of 0° or 90° relative to the polarization plane of the incident, linearly polarized light, the light of linear polarization incident to the crystalline quartz prism will pass as it is, without change of the polarization plane. Where the crystallographic axis of the half wave plate 4b is set at an angle of 22.5° relative to the polarization plane of incident, linearly polarized light, the light of linear polarization incident to the half wave plate 4b will be transformed into light in an unpolarized state including a linear polarization component directly passing without change of the polarization plane and a linear polarization component with the polarization plane rotated by 90°.

The polarization state converter 4 is arranged so that light of linear polarization is incident to the half wave plate 4b, as described above, and, for easier description hereinafter, it is assumed that light of linear polarization having the direction of polarization (direction of the electric field) along the Z-axis in FIG. 1 (hereinafter referred to as "Z-directionally polarized light") is incident to the half wave plate 4b. When the depolarizer 4c is positioned in the illumination optical path and when the crystallographic axis of the half wave plate 4b is set at the angle of 0° or 90° relative to the polarization plane (direction of polarization) of the Z-directionally polarized light incident thereto, the light of Z-directional polarization incident to the half wave plate 4b passes as kept as Z-directionally polarized light without change of the polarization plane and enters the crystalline quartz prism in the depolarizer 4c. Since the crystallographic axis of the crystalline quartz prism is set at the angle of 45° relative to the polarization plane of the Z-directionally polarized light incident thereto, the light of Z-directional polarization incident to the crystalline quartz prism is transformed into light in an unpolarized state.

The light depolarized through the crystalline quartz prism travels through the quartz prism as a compensator for compensating the traveling direction of the light and is incident into the diffractive optical element 5 while being in the depolarized state. On the other hand, if the crystallographic axis of the half wave plate 4b is set at the angle of 45° relative to the polarization plane of the Z-directionally polarized light incident thereto, the light of Z-directional polarization incident to the half wave plate 4b will be rotated in the polarization plane by 90° and transformed into light of linear polarization having the polarization direction (direction of the electric field) along the X-direction in FIG. 1 (hereinafter referred to as "X-directionally polarized light") and the X-directionally polarized light will be incident to the crystalline quartz prism in the depolarizer 4c. Since the crystallographic axis of the crystalline quartz prism is set at the angle of 45° relative to the polarization plane of the incident, X-directionally polarized light as well, the light of X-directional polarization incident to the crystalline quartz prism is transformed into light in the depolarized state, and the light travels through the quartz prism to be incident in the depolarized state into the diffractive optical element 5.

In contrast, when the depolarizer 4c is set away from the illumination optical path, if the crystallographic axis of the half wave plate 4b is set at the angle of 0° or 90° relative to the polarization plane of the Z-directionally polarized light incident thereto, the light of Z-directional polarization incident to the half wave plate 4b will pass as kept as Z-directionally polarized light without change of the polarization plane, and will be incident in the Z-directionally polarized state into the diffractive optical element 5. If the crystallographic axis of the half wave plate 4b is set at the angle of 45° relative to the polarization plane of the Z-directionally polarized light incident thereto on the other hand, the light of Z-directional polarization incident to the half wave plate 4b will be transformed into light of X-directional polarization with the polarization plane rotated by 90°, and will be incident in the X-directionally polarized state into the diffractive optical element 5.

In the polarization state converter 4, as described above, the light in the depolarized state can be made incident to the diffractive optical element 5 when the depolarizer 4c is set and positioned in the illumination optical path. When the depolarizer 4c is set away from the illumination optical path and when the crystallographic axis of the half wave plate 4b is set at the angle of 0° or 90° relative to the polarization plane of the Z-directionally polarized light incident thereto, the light in the Z-directionally polarized state can be made incident to the diffractive optical element 5. Furthermore, when the depolarizer 4c is set away from the illumination optical path and when the crystallographic axis of the half wave plate 4b is set at the angle of 45° relative to the polarization plane of the Z-directionally polarized light incident thereto, the light in the X-directionally polarized state can be made incident to the diffractive optical element 5.

In other words, the polarization state converter 4 is able to switch the polarization state of the incident light into the diffractive optical element 5 (a state of polarization of light to illuminate the mask M and wafer W in use of an ordinary diffractive optical element except for the diffractive optical element for azimuthally polarized annular illumination according to the present invention as will be described later) between the linearly polarized state and the unpolarized state through the action of the polarization state converter consisting of the quarter wave plate 4a, half wave plate 4b, and depolarizer 4c, and, in the case of the linearly polarized state, it is able to switch between mutually orthogonal polarization states (between the Z-directional polarization and the X-directional polarization).

Figure 3:
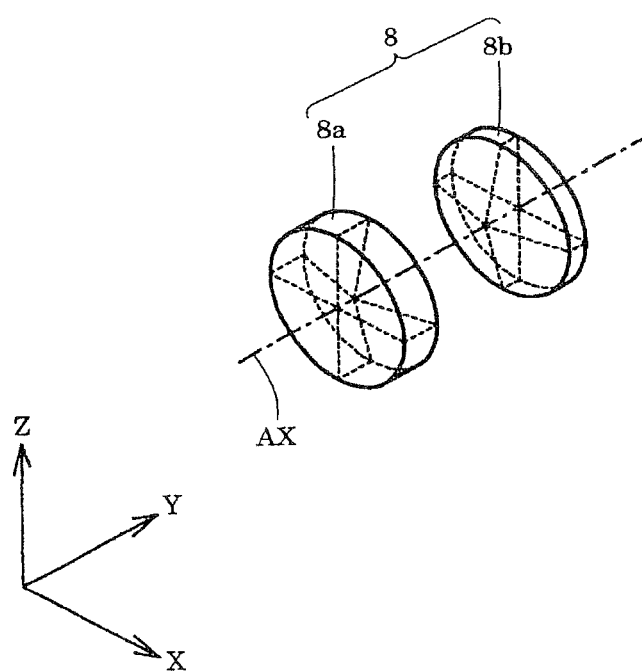
FIG. 3 is an illustration schematically showing a configuration of a conical axicon system disposed in an optical path between a front lens unit and a rear lens unit of an afocal lens in FIG. 1.

FIG. 3 is an illustration schematically showing the configuration of the conical axicon system disposed in the optical path between the front lens unit and the rear lens unit of the afocal lens in FIG. 1. The conical axicon system 8 is composed of a first prism member 8a whose plane is kept toward the light source and whose refracting surface of a concave conical shape is kept toward the mask, and a second prism member 8b whose plane is kept toward the mask and whose refracting surface of a convex conical shape is kept toward the light source, in order from the light source side.

The refracting surface of the concave conical shape of the first prism member 8a and the refracting surface of the convex conical shape of the second prism member 8b are formed in a complementary manner so as to be able to be brought into contact with each other. At least one of the first prism member 8a and the second prism member 8b is arranged movable along the optical axis AX, so that the spacing can be varied between the refracting surface of the concave conical shape of the first prism member 8a and the refracting surface of the convex conical shape of the second prism member 8b.

In a state in which the refracting surface of the concave conical shape of the first prism member 8a and the refracting surface of the convex conical shape of the second prism member 8b are in contact with each other, the conical axicon system 8 functions as a plane-parallel plate and has no effect on the secondary light source of the annular shape formed. However, when the refracting surface of the concave conical shape of the first prism member 8a and the refracting surface of the convex conical shape of the second prism member 8b are spaced from each other, the conical axicon system 8 functions a so-called beam expander. Therefore, the angle of the incident beam to the predetermined plane 7 varies according to change in the spacing of the conical axicon system 8.

Figure 4:
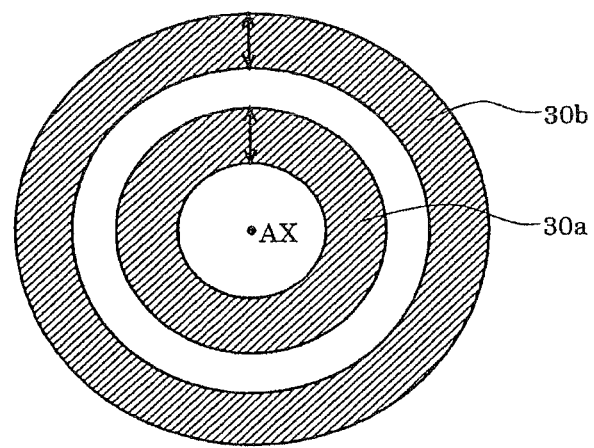
FIG. 4 is an illustration to illustrate the action of the conical axicon system on the secondary light source of the annular shape.

FIG. 4 is an illustration to illustrate the action of the conical axicon system on the secondary light source of the annular shape. With reference to FIG. 4, the secondary light source 30a of the minimum annular shape formed in a state where the spacing of the conical axicon system 8 is zero and where the focal length of the zoom lens 11 is set at the minimum (this state will be referred to hereinafter as a "standard state") is changed into secondary light source 30b of an annular shape with the outside diameter and inside diameter both enlarged and without change in the width (half of the difference between the inside diameter and the outside diameter: indicated by arrows in the drawing) when the spacing of the conical axicon system 8 is increased from zero to a predetermined value. In other words, an annular ratio (inside diameter/outside diameter) and size (outside diameter) both vary through the action of the conical axicon system 8, without change in the width of the secondary light source of the annular shape.

Figure 5:
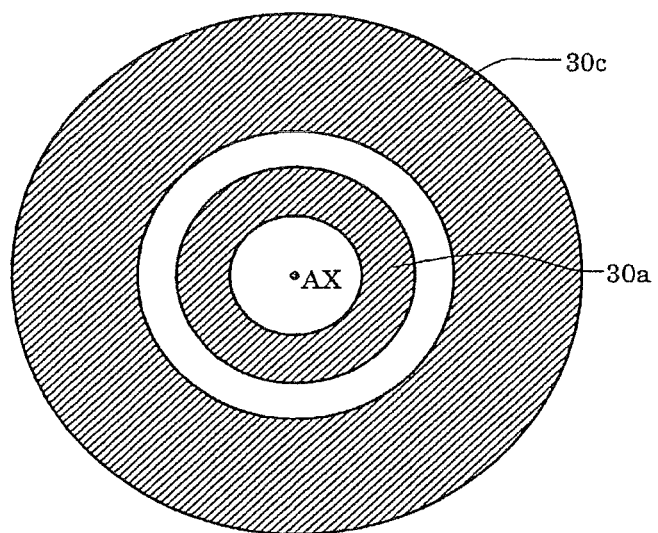
FIG. 5 is an illustration to illustrate the action of a zoom lens on the secondary light source of the annular shape.

FIG. 5 is an illustration to illustrate the action of the zoom lens on the secondary light source of the annular shape. With reference to FIG. 5, the secondary light source 30a of the annular shape formed in the standard state is changed into secondary light source 30c of an annular shape whose entire shape is similarly enlarged by increasing the focal length of the zoom lens 11 from the minimum to a predetermined value. In other words, the width and size (outside diameter) both vary through the action of zoom lens 11, without change in the annular ratio of the secondary light source of the annular shape.

Figure 6:
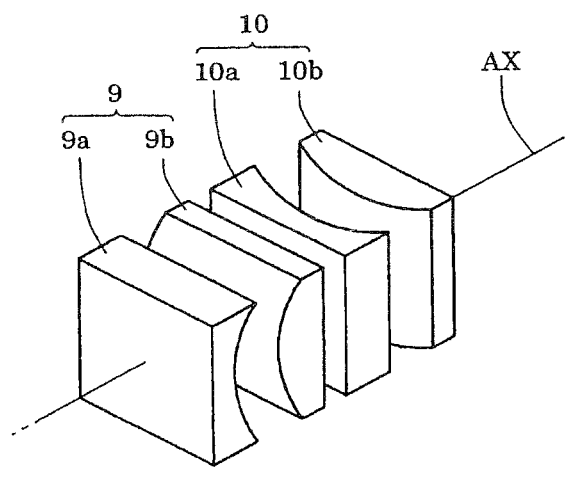
FIG. 6 is an illustration schematically showing a first cylindrical lens pair and a second cylindrical lens pair disposed in an optical path between the front lens unit and the rear lens unit of the afocal lens in FIG. 1.

FIG. 6 is an illustration schematically showing the configuration of the first cylindrical lens pair and the second cylindrical lens pair disposed in the optical path between the front lens unit and the rear lens unit of the afocal lens in FIG. 1. In FIG. 6, the first cylindrical lens pair 9 and the second cylindrical lens pair 10 are arranged in order from the light source side. The first cylindrical lens pair 9 is composed, for example, of a first cylindrical negative lens 9a with a negative refracting power in the YZ plane and with no refracting power in the XY plane, and a first cylindrical positive lens 9b with a positive refracting power in the YZ plane and with no refracting power in the XY plane, which are arranged in order from the light source side.

On the other hand, the second cylindrical lens pair 10 is composed, for example, of a second cylindrical negative lens 10a with a negative refracting power in the XY plane and with no refracting power in the YZ plane, and a second cylindrical positive lens 10b with a positive refracting power in the XY plane and with no refracting power in the YZ plane, which are arranged in order from the light source side. The first cylindrical negative lens 9a and the first cylindrical positive lens 9b are arranged so as to integrally rotate around the optical axis AX. Similarly, the second cylindrical negative lens 10a and the second cylindrical positive lens 10b are arranged so as to integrally rotate around the optical axis AX.

In the state shown in FIG. 6, the first cylindrical lens pair 9 functions as a beam expander having a power in the Z-direction, and the second cylindrical lens pair 10 as a beam expander having a power in the X-direction. The power of the first cylindrical lens pair 9 and the power of the second cylindrical lens pair 10 are set to be equal to each other.

Figure 7:
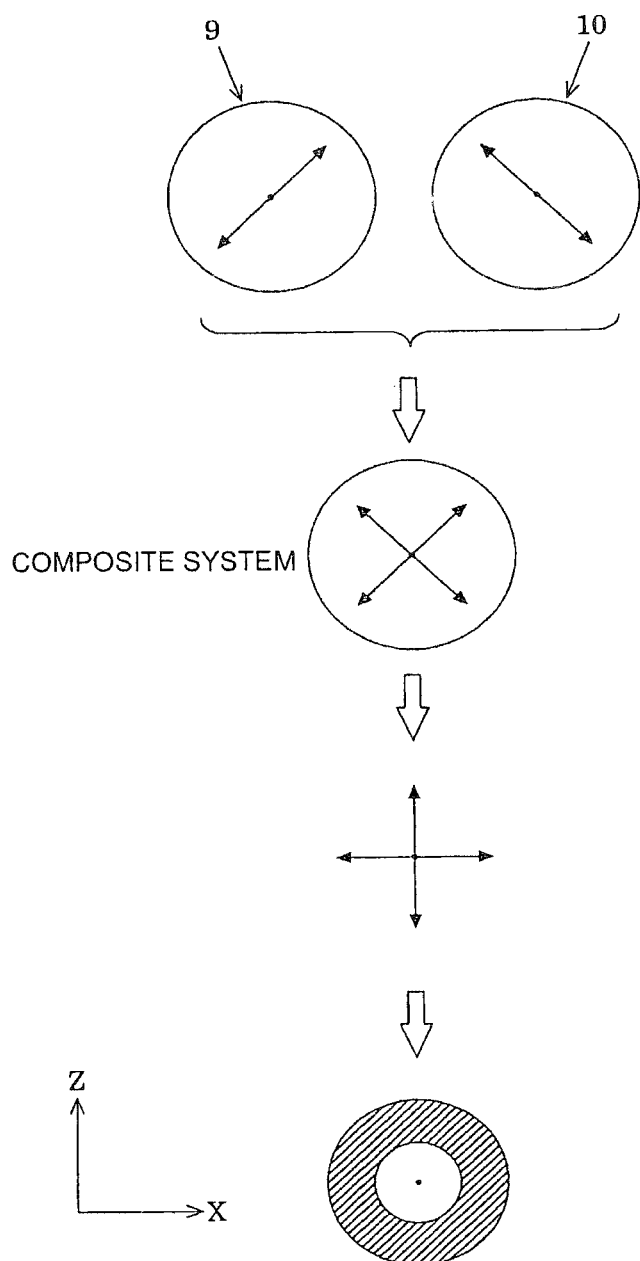
FIG. 7 is a first drawing to illustrate the action of the first cylindrical lens pair and the second cylindrical lens pair on the secondary light source of the annular shape.
Figure 8:
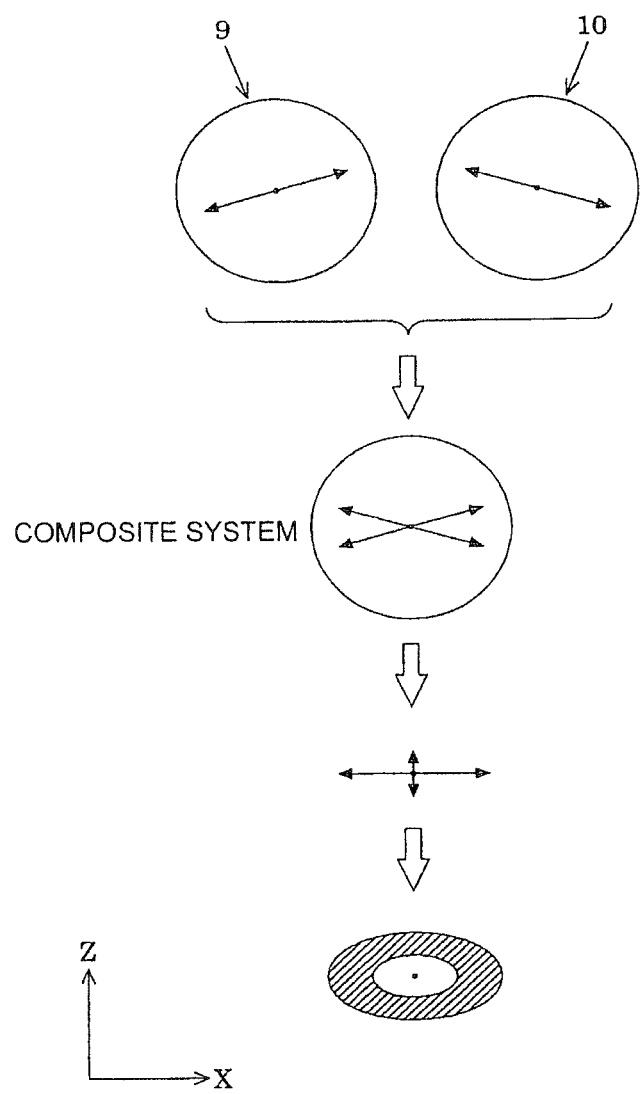
FIG. 8 is a second drawing to illustrate the action of the first cylindrical lens pair and the second cylindrical lens pair on the secondary light source of the annular shape.
Figure 9:
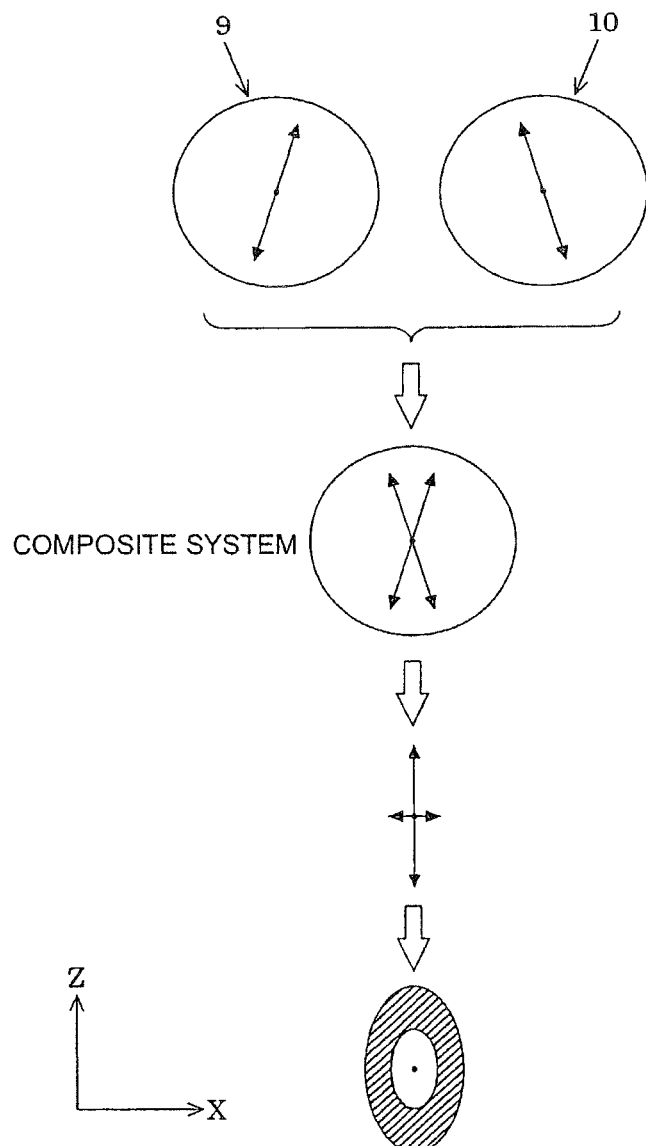
FIG. 9 is a third drawing to illustrate the action of the first cylindrical lens pair and the second cylindrical lens pair on the secondary light source of the annular shape.

FIGS. 7 to 9 are illustrations to illustrate the action of the first cylindrical lens pair and the second cylindrical lens pair on the secondary light source of the annular shape. FIG. 7 shows such a setting that the direction of the power of the first cylindrical lens pair 9 makes the angle of +45° around the optical axis AX relative to the Z-axis and that the direction of the power of the second cylindrical lens pair 10 makes the angle of −45° around the optical axis AX relative to the Z-axis.

Therefore, the direction of the power of the first cylindrical lens pair 9 is perpendicular to the direction of the power of the second cylindrical lens pair 10, and the composite system of the first cylindrical lens pair 9 and the second cylindrical lens pair 10 has the Z-directional power and the X-directional power identical to each other. As a result, in a perfect circle state shown in FIG. 7, a beam passing through the composite system of the first cylindrical lens pair 9 and the second cylindrical lens pair 10 is subject to enlargement at the same power in the Z-direction and in the X-direction to form the secondary light source of a perfect-circle annular shape on the illumination pupil.

In contrast to it, FIG. 8 shows such a setting that the direction of the power of the first cylindrical lens pair 9 makes, for example, the angle of +80° around the optical axis AX relative to the Z-axis and that the direction of the power of the second cylindrical lens pair 10 makes, for example, the angle of −80° around the optical axis AX relative to the Z-axis. Therefore, the power in the X-direction is greater than the power in the Z-direction in the composite system of the first cylindrical lens pair 9 and the second cylindrical lens pair 10. As a result, in a horizontally elliptic state shown in FIG. 8, the beam passing through the composite system of the first cylindrical lens pair 9 and the second cylindrical lens pair 10 is subject to enlargement at the power greater in the X-direction than in the Z-direction, whereby the secondary light source of a horizontally long annular shape elongated in the X-direction is formed on the illumination pupil.

On the other hand, FIG. 9 shows such a setting that the direction of the power of the first cylindrical lens pair 9 makes, for example, the angle of +10° around the optical axis AX relative to the Z-axis and that the direction of the power of the second cylindrical lens pair 10 makes, for example, the angle of −10° around the optical axis AX relative to the Z-axis. Therefore, the power in the Z-direction is greater than the power in the X-direction in the composite system of the first cylindrical lens pair 9 and the second cylindrical lens pair 10. As a result, in a vertically elliptical state shown in FIG. 9, the beam passing through the composite system of the first cylindrical lens pair 9 and the second cylindrical lens pair 10 is subject to enlargement at the power greater in the Z-direction than in the X-direction, whereby the secondary light source of a vertically long annular shape elongated in the Z-direction is formed on the illumination pupil.

Furthermore, by setting the first cylindrical lens pair 9 and the second cylindrical lens pair 10 in an arbitrary state between the perfect circle state shown in FIG. 7 and the horizontally elliptical state shown in FIG. 8, the secondary light source can be formed in a horizontally long annular shape according to any one of various aspect ratios. By setting the first cylindrical lens pair 9 and the second cylindrical lens pair 10 in an arbitrary state between the perfect circle state shown in FIG. 7 and the vertically elliptical state shown in FIG. 9, the secondary light source can be formed in a vertically long annular shape according to any one of various aspect ratios.

Figure 10:
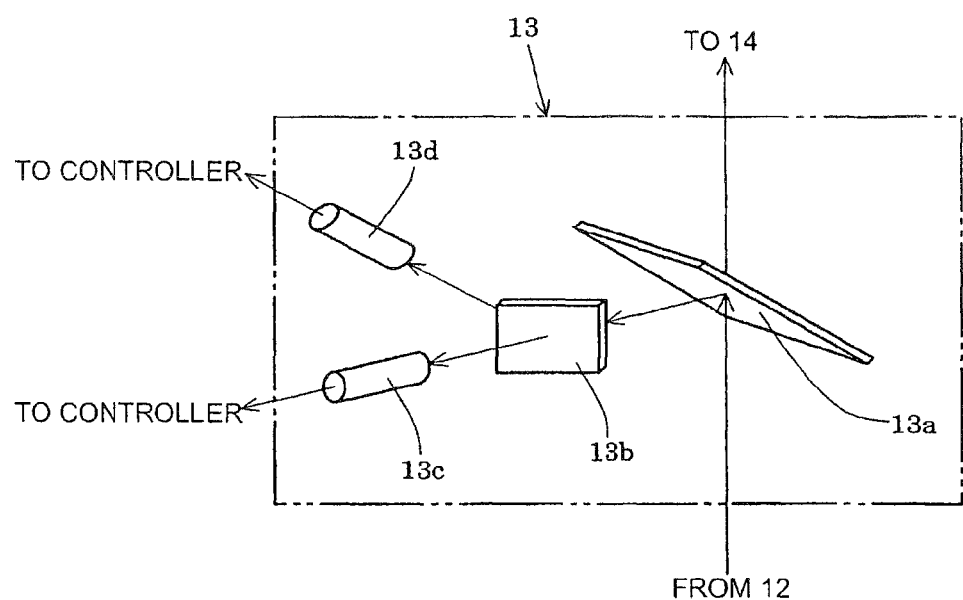
FIG. 10 is a perspective view schematically showing an internal configuration of a polarization monitor in FIG. 1.

FIG. 10 is a perspective view schematically showing the internal configuration of the polarization monitor shown in FIG. 1. With reference to FIG. 10, the polarization monitor 10 is provided with a first beam splitter 13a disposed in the optical path between the micro fly's eye lens 12 and the condenser optical system 14. The first beam splitter 13a has, for example, the form of a non-coated plane-parallel plate made of quartz glass (i.e., raw glass), and has a function of taking reflected light in a polarization state different from a polarization state of incident light, out of the optical path.

The light taken out of the optical path by the first beam splitter 13a is incident to a second beam splitter 13b. The second beam splitter 13b has, for example, the form of a non-coated plane-parallel plate made of quartz glass as the first beam splitter 13a does, and has a function of generating reflected light in a polarization state different from the polarization state of incident light. The polarization monitor is so set that the P-polarized light for the first beam splitter 13a becomes the S-polarized light for the second beam splitter 13b and that the S-polarized light for the first beam splitter 13a becomes the P-polarized light for the second beam splitter 13b.

Light transmitted by the second beam splitter 13b is detected by first light intensity detector 13c, while light reflected by the second beam splitter 13b is detected by second light intensity detector 13d. Outputs from the first light intensity detector 13c and from the second light intensity detector 13d are supplied each to a controller (not shown). The controller drives the quarter wave plate 4a, half wave plate 4b, and depolarizer 4c constituting the polarization state converter 4, according to need.

As described above, the reflectance for the P-polarized light and the reflectance for the S-polarized light are substantially different in the first beam splitter 13a and in the second beam splitter 13b. In the polarization monitor 13, therefore, the reflected light from the first beam splitter 13a includes the S-polarization component (i.e., the S-polarization component for the first beam splitter 13a and P-polarization component for the second beam splitter 13b), for example, which is approximately 10% of the incident light to the first beam splitter 13a, and the P-polarization component (i.e., the P-polarization component for the first beam splitter 13a and S-polarization component for the second beam splitter 13b), for example, which is approximately 1% of the incident light to the first beam splitter 13a.

The reflected light from the second beam splitter 13b includes the P-polarization component (i.e., the P-polarization component for the first beam splitter 13a and S-polarization component for the second beam splitter 13b), for example, which is approximately 10%×1%=0.1% of the incident light to the first beam splitter 13a, and the S-polarization component (i.e., the S-polarization component for the first beam splitter 13a and P-polarization component for the second beam splitter 13b), for example, which is approximately 1%×10%=0.1% of the incident light to the first beam splitter 13a.

In the polarization monitor 13, as described above, the first beam splitter 13a has the function of extracting the reflected light in the polarization state different from the polarization state of the incident light out of the optical path in accordance with its reflection characteristic. As a result, though there is slight influence of variation of polarization due to the polarization characteristic of the second beam splitter 13b, it is feasible to detect the polarization state (degree of polarization) of the incident light to the first beam splitter 13a and, therefore, the polarization state of the illumination light to the mask M, based on the output from the first light intensity detector 13c (information about the intensity of transmitted light from the second beam splitter 13b, i.e., information about the intensity of light virtually in the same polarization state as that of the reflected light from the first beam splitter 13a).

The polarization monitor 13 is so set that the P-polarized light for the first beam splitter 13a becomes the S-polarized light for the second beam splitter 13b and that the S-polarized light for the first beam splitter 13a becomes the P-polarized light for the second beam splitter 13b. As a result, it is feasible to detect the light quantity (intensity) of the incident light to the first beam splitter 13a and, therefore, the light quantity of the illumination light to the mask M, with no substantial effect of change in the polarization state of the incident light to the first beam splitter 13a, based on the output from the second light intensity detector 13d (information about the intensity of light successively reflected by the first beam splitter 13a and the second beam splitter 13b).

In this manner, it is feasible to detect the polarization state of the incident light to the first beam splitter 13a and, therefore, to determine whether the illumination light to the mask M is in the desired unpolarized state or linearly polarized state, using the polarization monitor 13. When the controller determines that the illumination light to the mask M (eventually, to the wafer W) is not in the desired unpolarized state or linearly polarized state, based on the detection result of the polarization monitor 13, it drives and adjusts the quarter wave plate 4a, half wave plate 4b, and depolarizer 4c constituting the polarization state converter 4 so that the state of the illumination light to the mask M can be adjusted into the desired unpolarized state or linearly polarized state.

Quadrupole illumination can be implemented by setting a diffractive optical element for quadrupole illumination (not shown) in the illumination optical path, instead of the diffractive optical element 5 for annular illumination. The diffractive optical element for quadrupole illumination has such a function that when a parallel beam having a rectangular cross section is incident thereto, it forms a light intensity distribution of a quadrupole shape in the far field thereof. Therefore, the beam passing through the diffractive optical element for quadrupole illumination forms an illumination field of a quadrupole shape consisting of four circular illumination fields centered around the optical axis AX, for example, on the entrance surface of the micro fly's eye lens 12. As a result, the secondary light source of the same quadrupole shape as the illumination field formed on the entrance surface is also formed on the rear focal plane of the micro fly's eye lens 12.

In addition, ordinary circular illumination can be implemented by setting a diffractive optical element for circular illumination (not shown) in the illumination optical path, instead of the diffractive optical element 5 for annular illumination. The diffractive optical element for circular illumination has such a function that when a parallel beam having a rectangular cross section is incident thereto, it forms a light intensity distribution of a circular shape in the far field. Therefore, a beam passing through the diffraction optical element for circular illumination forms a circular illumination field centered around the optical axis AX, for example, on the entrance plane of the micro fly's eye lens 12. As a result, the secondary light source of the same circular shape as the illumination field formed on the entrance surface is also formed on the rear focal plane of the micro fly's eye lens 12.

Furthermore, a variety of multipole illuminations (dipole illumination, octapole illumination, etc.) can be implemented by setting other diffractive optical elements for multipole illuminations (not shown), instead of the diffractive optical element 5 for annular illumination. Likewise, modified illuminations in various forms can be implemented by setting diffractive optical elements with appropriate characteristics (not shown) in the illumination optical path, instead of the diffractive optical element 5 for annular illumination.

Figure 11:
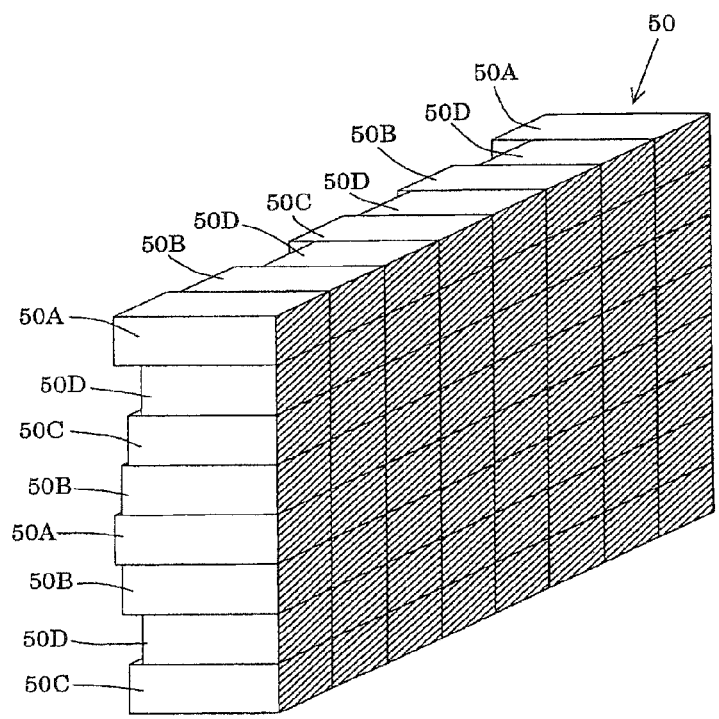
FIG. 11 is an illustration schematically showing a configuration of a diffractive optical element for azimuthally polarized annular illumination according to an embodiment of the present invention.
Figure 12:
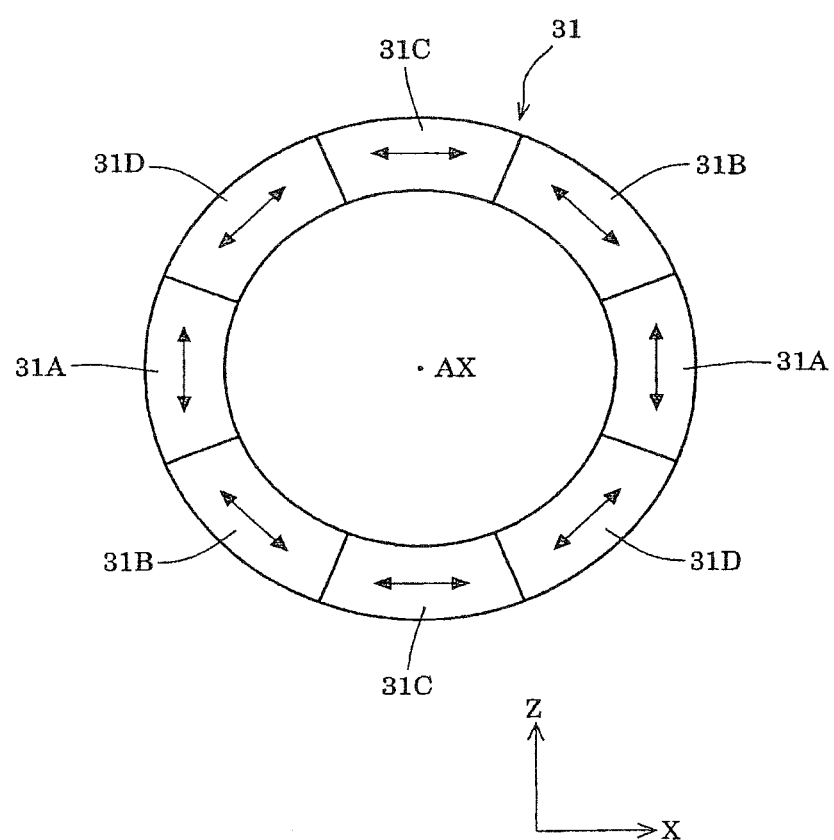
FIG. 12 is an illustration schematically showing a secondary light source of an annular shape set in the azimuthal polarization state.

In the present embodiment, a diffractive optical element 50 for so-called azimuthally polarized annular illumination can be set, instead of the diffractive optical element 5 for annular illumination, in the illumination optical path, so as to implement the modified illumination in which the beam passing through the secondary light source of the annular shape is set in the azimuthal polarization state, i.e., the azimuthally polarized annular illumination. FIG. 11 is an illustration schematically showing the configuration of the diffractive optical element for azimuthally polarized annular illumination according to the present embodiment. FIG. 12 is an illustration schematically showing the secondary light source of the annular shape set in the azimuthal polarization state.

With reference to FIGS. 11 and 12, the diffractive optical element 50 for azimuthally polarized annular illumination according to the present embodiment is constructed in such an arrangement that four types of basic elements 50A-50D having the same cross section of a rectangular shape and having their respective thicknesses different from each other along the direction of transmission of light (Y-direction) (i.e., lengths in the direction of the optical axis) are arranged lengthwise and breadthwise and densely. The thicknesses are set as follows: the thickness of the first basic elements 50A is the largest, the thickness of the fourth basic elements 50D the smallest, and the thickness of the second basic elements 50B is greater than the thickness of the third basic elements 50C.

The diffractive optical element 50 includes an approximately equal number of first basic elements 50A, second basic elements 50B, third basic elements 50C, and fourth basic elements 50D, and the four types of basic elements 50A-50D are arranged substantially at random. Furthermore, a diffracting surface (indicated by hatching in the drawing) is formed on the mask side of each basic element 50A-50D, and the diffracting surfaces of the respective basic elements 50A-50D are arrayed along one plane perpendicular to the optical axis AX (not shown in FIG. 11). As a result, the mask-side surface of the diffractive optical element 50 is planar, while the light-source-side surface of the diffractive optical element 50 is uneven due to the differences among the thicknesses of the respective basic elements 50A-SOD.

Figure 13:
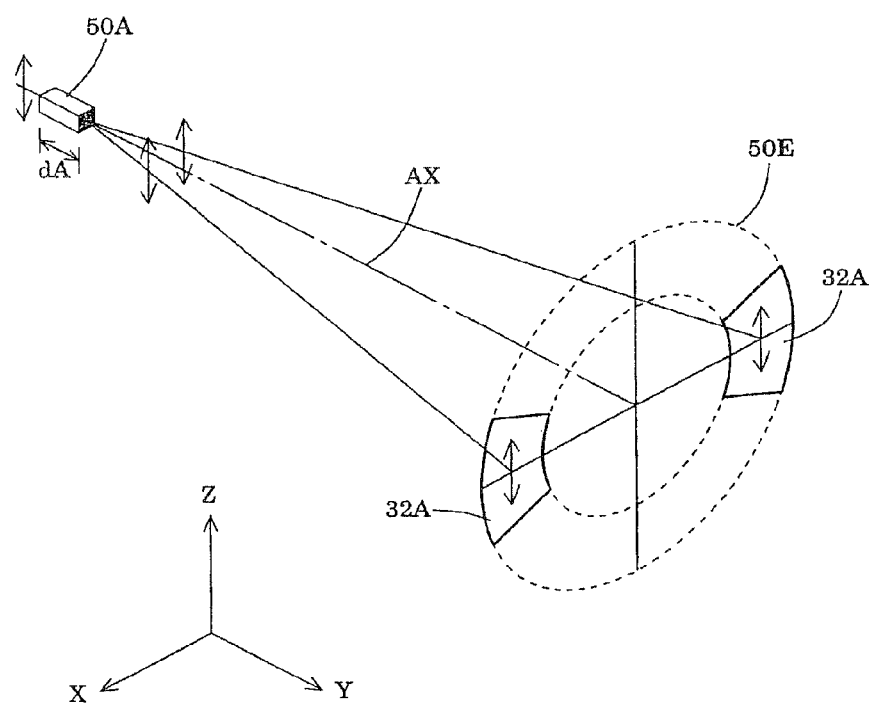
FIG. 13 is an illustration to illustrate the action of a first basic element.

The diffracting surface of each first basic element 50A is arranged to form a pair of arc regions (bow shape) 31A symmetric with respect to an axis line of the Z-direction passing the optical axis AX, in the secondary light source 31 of the annular shape shown in FIG. 12. Namely, as shown in FIG. 13, each first basic element 50A has a function of forming a pair of arc (bow shape) light intensity distributions 32A symmetric with respect to the axis line of the Z-direction passing the optical axis AX (corresponding to a pair of arc regions 31A) in the far field 50E of the diffractive optical element 50 (i.e., in the far field of each basic element 50A-50D).

Figure 14:
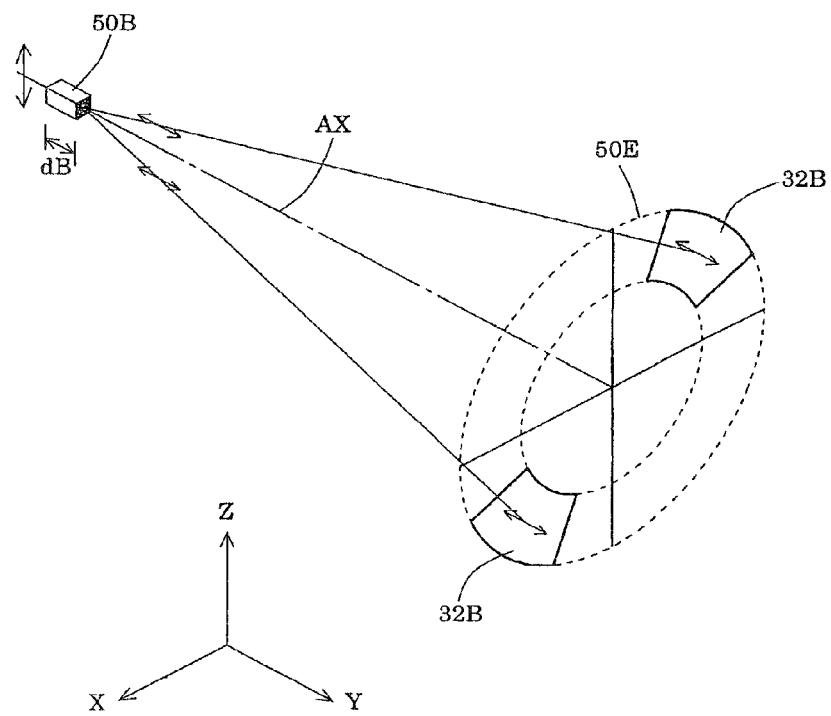
FIG. 14 is an illustration to illustrate the action of a second basic element.

The diffracting surface of each second basic element 50B is arranged so as to form a pair of arc (bow shape) regions 31B symmetric with respect to an axis line obtained by rotating the axis line of the Z-direction passing the optical axis AX, by −45° around the Y-axis (or obtained by rotating it by 45° counterclockwise in FIG. 12). Namely, as shown in FIG. 14, each second basic element SOB has a function of forming a pair of arc (bow shape) light intensity distributions 32B symmetric with respect to the axis line resulting from the −45° rotation around the Y-axis, of the axis line of the Z-direction passing the optical axis AX (corresponding to a pair of arc regions 31B), in the far field 50E.

Figure 15:
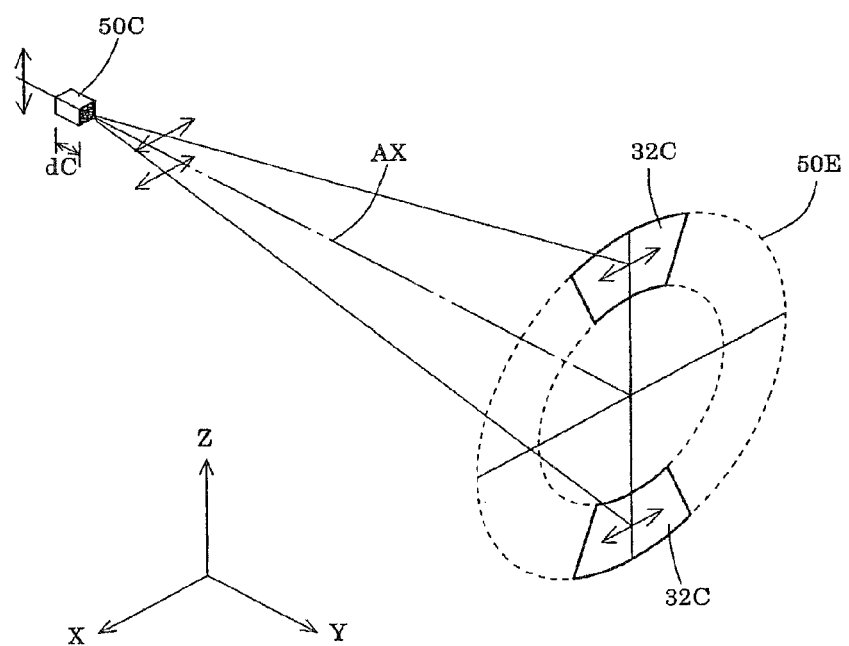
FIG. 15 is an illustration to illustrate the action of a third basic element.

The diffracting surface of each third basic element 50C is arranged to form a pair of arc (bow shape) regions 31C symmetric with respect to an axis line of the X-direction passing the optical axis AX. Namely, as shown in FIG. 15, each third basic element 50C has a function of forming a pair of arc (bow shape) light intensity distributions 32C symmetric with respect to the axis line of the X-direction passing the optical axis AX (corresponding to a pair of arc regions 31C), in the far field 50E.

Figure 16:
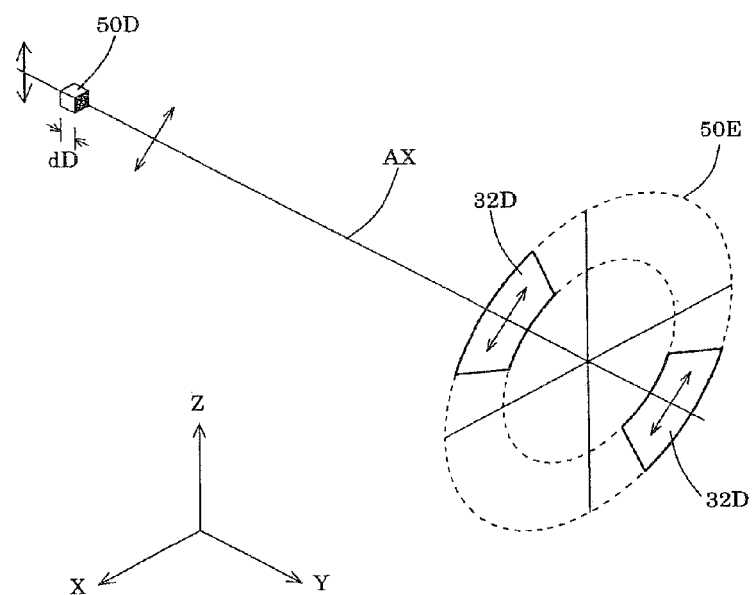
FIG. 16 is an illustration to illustrate the action of a fourth basic element.

The diffracting surface of each fourth basic element 50D is arranged so as to form a pair of arc (bow shape) regions 31D symmetric with respect to an axis line obtained by rotating the axis of the Z-direction passing the optical axis AX by +45° around the Y-axis (i.e., obtained by rotating it by 45° clockwise in FIG. 12). Namely, as shown in FIG. 16, each fourth basic element 50D has a function of forming a pair of arc (bow shape) light intensity distributions 32D symmetric with respect to the axis line resulting from the +45° rotation around the Y-axis, of the axis line of the Z-direction passing the optical axis AX (corresponding to a pair of arc regions 31D), in the far field 50E. The sizes of the respective arc regions 31A-31D are approximately equal to each other, and they form the secondary light source 31 of the annular shape centered around the optical axis AX, while the eight arc regions 31A-31D are not overlapping with each other and not spaced from each other.

Figure 17:
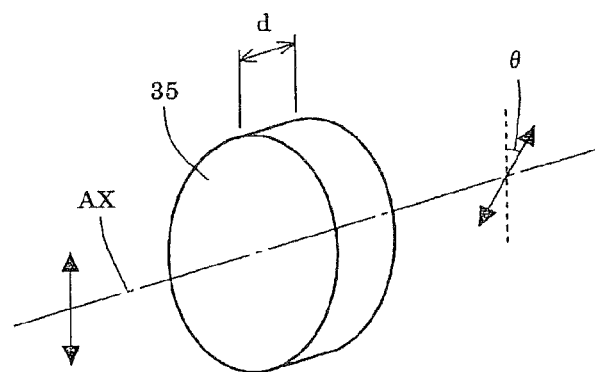
FIG. 17 is an illustration to illustrate the optical activity of crystalline quartz.

In the present embodiment, each basic element 50A-50D is made of crystalline quartz being an optical material with optical activity, and the crystallographic axis of each basic element 50A-50D is set approximately to coincide with the optical axis AX. The optical activity of crystalline quartz will be briefly described below with reference to FIG. 17. With reference to FIG. 17, an optical member 35 of a plane-parallel plate shape made of crystalline quartz and in a thickness d is arranged so that its crystallographic axis coincides with the optical axis AX. In this case, by virtue of the optical activity of the optical member 35, incident, linearly polarized light emerges in a state in which its polarization direction is rotated by θ around the optical axis AX.

At this time, the angle θ of rotation of the polarization direction due to the optical activity of the optical member 35 is represented by Eq (1) below, using the thickness d of the optical member 35 and the rotatory power ρ of crystalline quartz.

$$\theta = d \cdot \rho \tag{1}$$

In general, the rotatory power ρ of crystalline quartz tends to increase with decrease in the wavelength of used light and, according to the description on page 167 in "Applied Optics II," the rotatory power ρ of crystalline quartz for light having the wavelength of 250.3 nm is 153.9°/mm.

In the present embodiment the first basic elements 50A are designed in such a thickness dA that when light of linear polarization having the direction of polarization along the Z-direction is incident thereto, they output light of linear polarization having the polarization direction along a direction resulting from +180° rotation of the Z-direction around the Y-axis, i.e., along the Z-direction, as shown in FIG. 13. As a result, the polarization direction of beams passing through a pair of arc light intensity distributions 32A formed in the far field 50E is also the Z-direction, and the polarization direction of beams passing through a pair of arc regions 31A shown in FIG. 12 is also the Z-direction.

The second basic elements 50B are designed in such a thickness dB that when light of linear polarization having the polarization direction along the Z-direction is incident thereto, they output light of linear polarization having the polarization direction along a direction resulting from +135° rotation of the Z-direction around the Y-axis, i.e., along a direction resulting from −45° rotation of the Z-direction around the Y-axis, as shown in FIG. 14. As a result, the polarization direction of beams passing through a pair of arc light intensity distributions 32B formed in the far field 50E is also the direction obtained by rotating the Z-direction by −45° around the Y-axis, and the polarization direction of beams passing through a pair of arc regions 31A shown in FIG. 12 is also the direction obtained by rotating the Z-direction by −45° around the Y-axis.

The third basic elements 50C are designed in such a thickness dC that when light of linear polarization having the polarization direction along the Z-direction is incident thereto, they output light of linear polarization having the polarization direction along a direction resulting from +90° rotation of the Z-direction around the Y-axis, i.e., along the X-direction, as shown in FIG. 15. As a result, the polarization direction of beams passing through a pair of arc light intensity distributions 32C formed in the far field 50E is also the X-direction, and the polarization direction of beams passing through a pair of arc regions 31C shown in FIG. 12 is also the X-direction.

The fourth basic elements 50D are designed in such a thickness dD that when light of linear polarization having the polarization direction along the Z-direction is incident thereto, they output light of linear polarization having the polarization direction along a direction resulting from +45° rotation of the Z-direction around the Y-axis, as shown in FIG. 16. As a result, the polarization direction of beams passing through a pair of arc light intensity distributions 32D formed in the far field 50E is also the direction obtained by rotating the Z-direction by +45° around the Y-axis, and the polarization direction of beams passing through a pair of arc regions 31D shown in FIG. 12 is also the direction obtained by rotating the Z-direction by +45° around the Y-axis.

In the present embodiment, the diffractive optical element 50 for azimuthally polarized annular illumination is set in the illumination optical system on the occasion of effecting the azimuthally polarized annular illumination, whereby the light of linear polarization having the polarization direction along the Z-direction is made incident to the diffractive optical element 50. As a result, the secondary light source of the annular shape (illumination pupil distribution of annular shape) 31 is formed on the rear focal plane of the micro fly's eye lens 12 (i.e., on or near the illumination pupil), as shown in FIG. 12, and the beams passing through the secondary light source 31 of the annular shape are set in the azimuthal polarization state.

In the azimuthal polarization state, the beams passing through the respective arc regions 31A-31D constituting the secondary light source 31 of the annular shape turn into the linearly polarized state having the polarization direction substantially coincident with a tangent line to a circle centered around the optical axis AX, at the central position along the circumferential direction of each arc region 31A-31D.

In the present embodiment, as described above, the beam transforming element 50 for forming the predetermined light intensity distribution on the predetermined surface on the basis of the incident beam comprises the first basic element 50A made of the optical material with optical activity, for forming the first region distribution 32A of the predetermined light intensity distribution on the basis of the incident beam; and the second basic element 50B made of the optical material with optical activity, for forming the second region distribution 32B of the predetermined light intensity distribution on the basis of the incident beam, and the first basic element 50A and the second basic element 50B have their respective thicknesses different from each other along the direction of transmission of light.

Thanks to this configuration, the present embodiment is able to form the secondary light source 31 of the annular shape in the azimuthal polarization state, with no substantial loss of light quantity, through the diffracting action and optical rotating action of the diffractive optical element 50 as the beam transforming element, different from the conventional technology giving rise to the large loss of light quantity at the aperture stop.

In a preferred form of the present embodiment, the thickness of the first basic element 50A and the thickness of the second basic element 50B are so set that with incidence of linearly polarized light the polarization direction of the linearly polarized light forming the first region distribution 32A is different from the polarization direction of the linearly polarized light forming the second region distribution 32B. Preferably, the first region distribution 32A and the second region distribution 32B are positioned in at least a part of a predetermined annular region, which is a predetermined annular region centered around a predetermined point on the predetermined surface, and the beams passing through the first region distribution 32A and through the second region distribution 32B have a polarization state in which a principal component is linearly polarized light having the polarization direction along the circumferential direction of the predetermined annular region.

In this case, preferably, the predetermined light intensity distribution has a contour of virtually the same shape as the predetermined annular region, the polarization state of the beam passing through the first region distribution 32A has a linear polarization component substantially coincident with a tangential direction to a circle centered around a predetermined point at the central position along the circumferential direction of the first region distribution 32A, and the polarization state of the beam passing through the second region distribution 32B has a linear polarization component substantially coincident with a tangential direction to a circle centered around a predetermined point at the central position along the circumferential direction of the second region distribution 32B. In another preferred configuration, the predetermined light intensity distribution is a distribution of a multipole shape in the predetermined annular region, the polarization state of the beam passing through the first region distribution has a linear polarization component substantially coincident with a tangential direction to a circle centered around a predetermined point at the central position along the circumferential direction of the first region distribution, and the polarization state of the beam passing through the second region distribution has a linear polarization component substantially coincident with a tangential direction to a circle centered around a predetermined point at the central position along the circumferential direction of the second region distribution.

In a preferred form of the present embodiment, the first basic element and the second basic element are made of an optical material with an optical rotatory power of not less than 100°/mm for light of a wavelength used. Preferably, the first basic element and the second basic element are made of crystalline quartz. The beam transforming element preferably includes virtually the same number of first basic elements and second basic elements. The first basic element and the second basic element preferably have diffracting action or refracting action.

In another preferred form of the present embodiment, preferably, the first basic element forms at least two first region distributions on the predetermined surface on the basis of the incident beam, and the second basic element forms at least two second region distributions on the predetermined surface on the basis of the incident beam. In addition, preferably, the beam transforming element further comprises the third basic element 50C made of the optical material with optical activity, for forming the third region distribution 32C of the predetermined light intensity distribution on the basis of the incident beam, and the fourth basic element SOD made of the optical material with optical activity, for forming the fourth region distribution 32D of the predetermined light intensity distribution on the basis of the incident beam.

In the present embodiment, the beam transforming element 50 for forming the predetermined light intensity distribution of the shape different from the sectional shape of the incident beam, on the predetermined surface, has the diffracting surface or refracting surface for forming the predetermined light intensity distribution on the predetermined surface, the predetermined light intensity distribution is a distribution in at least a part of a predetermined annular region, which is a predetermined annular region centered around a predetermined point on the predetermined surface, and the beam from the beam transforming element passing through the predetermined annular region has a polarization state in which a principal component is linearly polarized light having the direction of polarization along the circumferential direction of the predetermined annular region.

In the configuration as described above, the present embodiment, different from the conventional technology giving rise to the large loss of light quantity at the aperture stop, is able to form the secondary light source 31 of the annular shape in the azimuthal polarization state, with no substantial loss of light quantity, through the diffracting action and optical rotating action of the diffractive optical element 50 as the beam transforming element.

In a preferred form of the present embodiment, the predetermined light intensity distribution has a contour of a multipole shape or annular shape. The beam transforming element is preferably made of an optical material with optical activity.

The illumination optical apparatus of the present embodiment is the illumination optical apparatus for illuminating the surface to be illuminated, based on the beam from the light source, and comprises the above-described beam transforming element for transforming the beam from the light source in order to form the illumination pupil distribution on or near the illumination pupil of the illumination optical apparatus. In this configuration, the illumination optical apparatus of the present embodiment is able to form the illumination pupil distribution of the annular shape in the azimuthal polarization state while well suppressing the loss of light quantity.

Here the beam transforming element is preferably arranged to be replaceable with another beam transforming element having a different characteristic. Preferably, the apparatus further comprises the wavefront splitting optical integrator disposed in the optical path between the beam transforming element and the surface to be illuminated, and the beam transforming element forms the predetermined light intensity distribution on the entrance surface of the optical integrator on the basis of the incident beam.

In a preferred form of the illumination optical apparatus of the present embodiment, at least one of the light intensity distribution on the predetermined surface and the polarization state of the beam from the beam transforming element passing through the predetermined annular region is set in consideration of the influence of an optical member disposed in the optical path between the light source and the surface to be illuminated. Preferably, the polarization state of the beam from the beam transforming element is so set that the light illuminating the surface to be illuminated is in a polarization state in which a principal component is S-polarized light.

The exposure apparatus of the present embodiment comprises the above-described illumination optical apparatus for illuminating the mask, and projects the pattern of the mask onto the photosensitive substrate. Preferably, at least one of the light intensity distribution on the predetermined surface and the polarization state of the beam from the beam transforming element passing through the predetermined annular region is set in consideration of the influence of an optical member disposed in the optical path between the light source and the photosensitive substrate. Preferably, the polarization state of the beam from the beam transforming element is so set that the light illuminating the photosensitive substrate is in a polarization state in which a principal component is S-polarized light.

The exposure method of the present embodiment comprises the illumination step of illuminating the mask by use of the above-described illumination optical apparatus, and the exposure step of projecting the pattern of the mask onto the photosensitive substrate. Preferably, at least one of the light intensity distribution on the predetermined surface and the polarization state of the beam from the beam transforming element passing through the predetermined annular region is set in consideration of the influence of an optical member disposed in the optical path between the light source and the photosensitive substrate. Preferably, the polarization state of the beam from the beam transforming element is so set that the light illuminating the photosensitive substrate is in a polarization state in which a principal component is S-polarized light.

In other words, the illumination optical apparatus of the present embodiment is able to form the illumination pupil distribution of the annular shape in the azimuthal polarization state while well suppressing the loss of light quantity. As a result, the exposure apparatus of the present embodiment is able to transcribe the microscopic pattern in an arbitrary direction under an appropriate illumination condition faithfully and with high throughput because it uses the illumination optical apparatus capable of forming the illumination pupil distribution of the annular shape in the azimuthal polarization state while well suppressing the loss of light quantity.

In the azimuthally polarized annular illumination based on the illumination pupil distribution of the annular shape in the azimuthal polarization state, the light illuminating the wafer W as a surface to be illuminated is in the polarization state in which the principal component is the S-polarized light. Here the S-polarized light is linearly polarized light having the direction of polarization along a direction normal to a plane of incidence (i.e., polarized light with the electric vector oscillating in the direction normal to the plane of incidence). The plane of incidence herein is defined as the following plane: when light arrives at a boundary surface of a medium (a surface to be illuminated: surface of wafer W), the plane includes the normal to the boundary plane at the arrival point and the direction of incidence of light.

In the above-described embodiment, the diffractive optical element 50 for azimuthally polarized annular illumination is constructed by randomly arranging virtually the same number of four types of basic elements 50A-50D with the same rectangular cross section lengthwise and breadthwise and densely. However, without having to be limited to this, a variety of modification examples can be contemplated as to the number of basic elements of each type, the sectional shape, the number of types, the arrangement, and so on.

In the above-described embodiment, the secondary light source 31 of the annular shape centered around the optical axis AX is composed of the eight arc regions 31A-31D arrayed without overlapping with each other and without being spaced from each other, using the diffractive optical element 50 consisting of the four types of basic elements 50A-50D. However, without having to be limited to this, a variety of modification examples can be contemplated as to the number of regions forming the secondary light source of the annular shape, the shape, the arrangement, and so on.

Figure 18A:
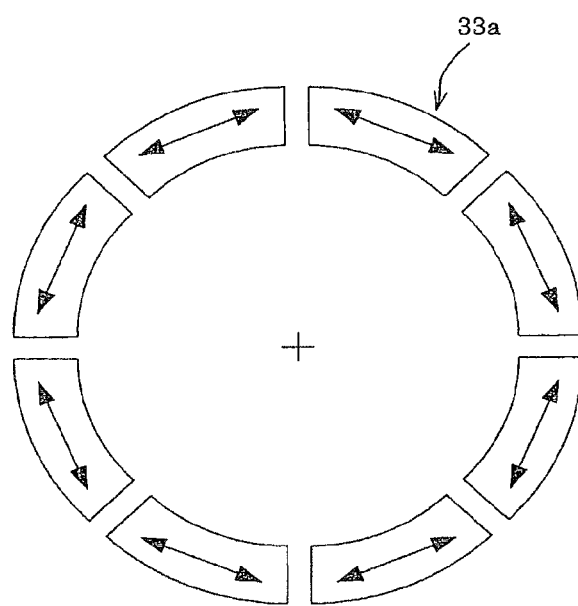
FIGS. 18A and 18B are illustrations showing octapole secondary light sources in the azimuthal polarization state consisting of eight arc regions spaced from each other along the circumferential direction and a quadrupole secondary light source in the azimuthal polarization state consisting of four arc regions spaced from each other along the circumferential direction.
Figure 18B:
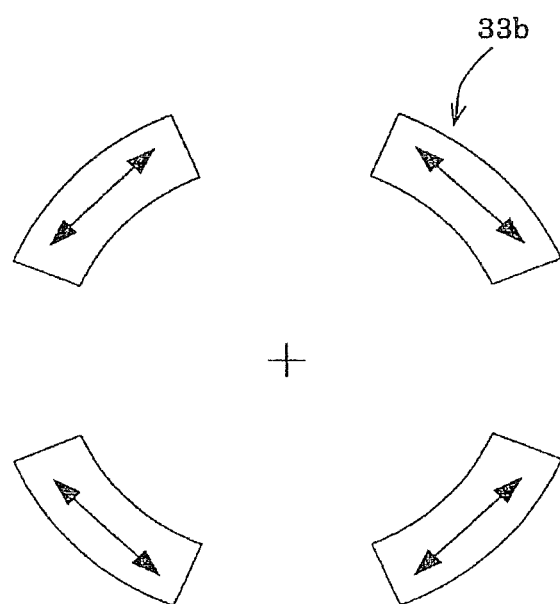
Figure 19:
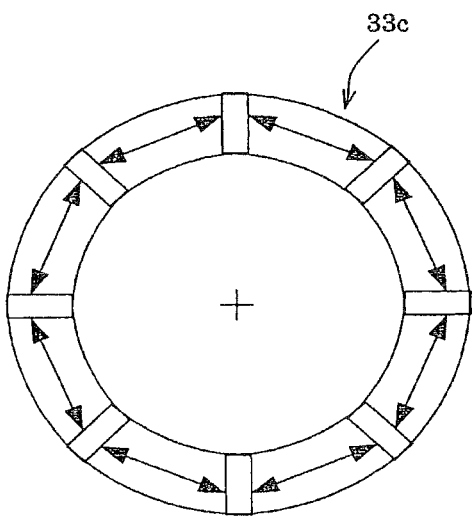
FIG. 19 is an illustration showing a secondary light source of an annular shape in the azimuthal polarization state consisting of eight arc regions overlapping with each other along the circumferential direction.

Specifically, as shown in FIG. 18A, it is also possible to form a secondary light source 33a of an octapole shape in the azimuthal polarization state consisting of eight arc (bow shape) regions spaced from each other along the circumferential direction, for example, using the diffractive optical element consisting of four types of basic elements. In addition, as shown in FIG. 18B, it is also possible to form a secondary light source 33b of a quadrupole shape in the azimuthal polarization state consisting of four arc (bow shape) regions spaced from each other along the circumferential direction, for example, using the diffractive optical element consisting of four types of basic elements. In the secondary light source of the octapole shape or the secondary light source of the quadrupole shape, the shape of each region is not limited to the arc shape, but it may be, for example, circular, elliptical, or sectorial. Furthermore, as shown in FIG. 19, it is also possible to form a secondary light source 33c of an annular shape in the azimuthal polarization state consisting of eight arc regions overlapping with each other along the circumferential direction, for example, using the diffractive optical element consisting of four types of basic elements.

Figure 20A:
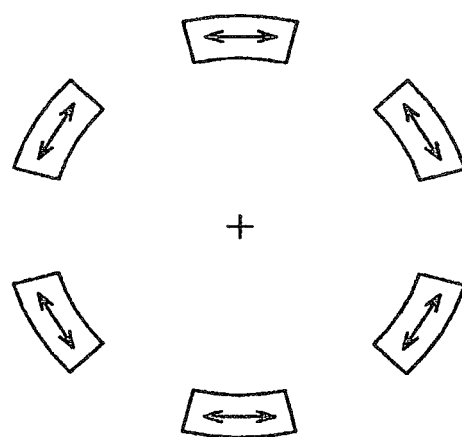
FIGS. 20A and 20B are illustrations showing hexapole secondary light sources in the azimuthal polarization state consisting of six arc regions spaced from each other along the circumferential direction and a secondary light source in the azimuthal polarization state having a plurality of regions spaced from each other along the circumferential direction and a region on the optical axis.
Figure 20B:
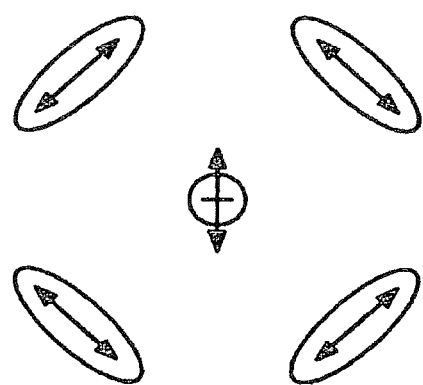

In addition to the quadrupole or octapole secondary light source in the azimuthal polarization state consisting of the four or eight regions spaced from each other along the circumferential direction, the secondary light source may be formed in a hexapole shape in the azimuthal polarization state and of six regions spaced from each other along the circumferential direction, as shown in FIG. 20A. In addition, as shown in FIG. 20B, the secondary light source may be formed as one having secondary light source of a multipole shape in the azimuthal polarization state consisting of a plurality of regions spaced from each other along the circumferential direction, and a secondary light source on the center pole in the unpolarized state or linearly polarized state consisting of a region on the optical axis. Furthermore, the secondary light source may also be formed in a dipole shape in the azimuthal polarization state and of two regions spaced from each other along the circumferential direction.

In the aforementioned embodiment, as shown in FIG. 11, the four types of basic elements 50A-50D are individually formed, and the diffractive optical element 50 is constructed by combining these elements. However, without having to be limited to this, the diffractive optical element 50 can also be integrally constructed in such a manner that a crystalline quartz substrate is subjected, for example, to etching to form the exit-side diffracting surfaces and the entrance-side uneven surfaces of the respective basic elements 50A-50D.

In the aforementioned embodiment each basic element 50A-50D (therefore, the diffractive optical element 50) is made of crystalline quartz. However, without having to be limited to this, each basic element can also be made of another appropriate optical material with optical activity. In this case, it is preferable to use an optical material with an optical rotatory power of not less than 100°/mm for light of a wavelength used. Specifically, use of an optical material with a low rotatory power is undesirable because the thickness necessary for achieving the required rotation angle of the polarization direction becomes too large, so as to cause the loss of light quantity.

The aforementioned embodiment is arranged to form the illumination pupil distribution of the annular shape (secondary light source), but, without having to be limited to this, the illumination pupil distribution of a circular shape can also be formed on or near the illumination pupil. In addition to the illumination pupil distribution of the annular shape and the illumination pupil distribution of the multipole shape, it is also possible to implement a so-called annular illumination with the center pole and a multipole illumination with the center pole, for example, by forming a center region distribution including the optical axis.

In the aforementioned embodiment, the illumination pupil distribution in the azimuthal polarization state is formed on or near the illumination pupil. However, the polarization direction can vary because of polarization aberration (retardation) of an optical system (the illumination optical system or the projection optical system) closer to the wafer than the diffractive optical element as the beam transforming element. In this case, it is necessary to properly set the polarization state of the beam passing through the illumination pupil distribution formed on or near the illumination pupil, with consideration to the influence of polarization aberration of these optical systems.

In connection with the foregoing polarization aberration, reflected light can have a phase difference in each polarization direction because of a polarization characteristic of a reflecting member disposed in the optical system (the illumination optical system or the projection optical system) closer to the wafer than the beam transforming element. In this case, it is also necessary to properly set the polarization state of the beam passing through the illumination pupil distribution formed on or near the illumination pupil, with consideration to the influence of the phase difference due to the polarization characteristic of the reflecting member.

The reflectance in the reflecting member can vary depending upon the polarization direction, because of a polarization characteristic of a reflecting member disposed in the optical system (the illumination optical system or the projection optical system) closer to the wafer than the beam transforming element. In this case, it is desirable to provide offsets on the light intensity distribution formed on or near the illumination pupil, i.e. to provide a distribution of numbers of respective basic elements, in consideration of the reflectance in each polarization direction. The same technique can also be similarly applied to cases where the transmittance in the optical system closer to the wafer than the beam transforming element varies depending upon the polarization direction.

Figure 21:
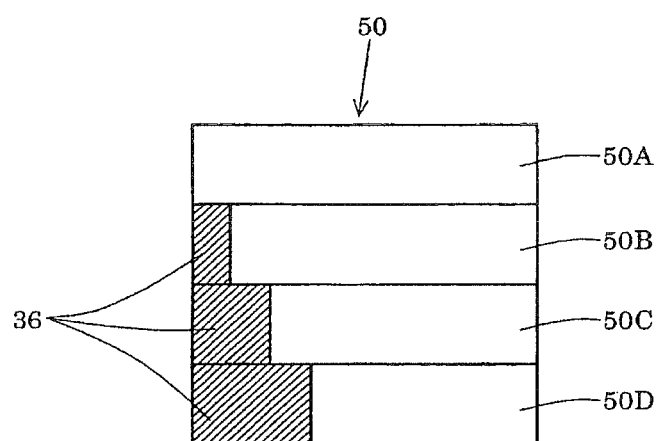
FIG. 21 is an illustration showing an example in which an entrance-side surface of a diffractive optical element for azimuthally polarized annular illumination is planar.

In the foregoing embodiment, the light-source-side surface of the diffractive optical element 50 is of the uneven shape with level differences according to the differences among the thicknesses of respective basic elements 50A-50D. Then the surface on the light source side (entrance side) of the diffractive optical element 50 can also be formed in a planar shape, as shown in FIG. 21, by adding a compensation member 36 on the entrance side of the basic elements except for the first basic elements 50A with the largest thickness, i.e., on the entrance side of the second basic elements 50B, third basic elements 50C, and fourth basic elements 50D. In this case, the compensation member 36 is made of an optical material without optical activity.

The aforementioned embodiment shows the example wherein the beam passing through the illumination pupil distribution formed on or near the illumination pupil has only the linear polarization component along the circumferential direction. However, without having to be limited to this, the expected effect of the present invention can be achieved as long as the polarization state of the beam passing through the illumination pupil distribution is a state in which the principal component is linearly polarized light having the polarization direction along the circumferential direction.

The foregoing embodiment uses the diffractive optical element consisting of the plural types of basic elements having the diffracting action, as the beam transforming element for forming the light intensity distribution of the shape different from the sectional shape of the incident beam, on the predetermined plane, based on the incident beam. However, without having to be limited to this, it is also possible to use as the beam transforming element a refracting optical element, for example, consisting of plural types of basic elements having refracting surfaces virtually optically equivalent to the diffracting surfaces of the respective basic elements, i.e., consisting of plural types of basic elements having the refracting action.

The exposure apparatus according to the foregoing embodiment is able to produce microdevices (semiconductor elements, image pickup elements, liquid crystal display elements, thin-film magnetic heads, etc.) by illuminating a mask (reticle) by the illumination optical apparatus (illumination step) and projecting a pattern for transcription formed on the mask, onto a photosensitive substrate by use of the projection optical system (exposure step). The following will describe an example of a procedure of producing semiconductor devices as microdevices by forming a predetermined circuit pattern on a wafer or the like as a photosensitive substrate by means of the exposure apparatus of the foregoing embodiment, with reference to the flowchart of FIG. 22.

Figure 22:
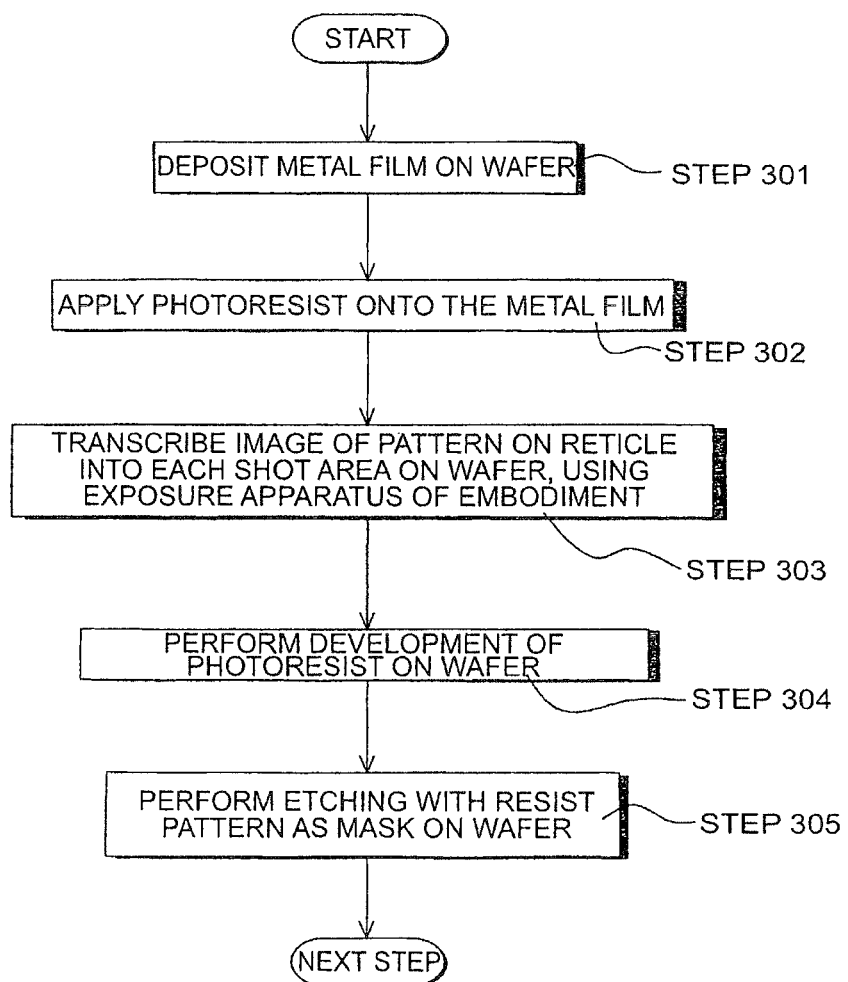
FIG. 22 is a flowchart of a procedure of obtaining semiconductor devices as microdevices.

The first step 301 in FIG. 22 is to deposit a metal film on each of wafers in one lot. The next step 302 is to apply a photoresist onto the metal film on each wafer in the lot. Thereafter, step 303 is to sequentially transcribe an image of a pattern on a mask into each shot area on each wafer in the lot, through the projection optical system by use of the exposure apparatus of the foregoing embodiment. Subsequently, step 304 is to perform development of the photoresist on each wafer in the lot, and step 305 thereafter is to perform etching with the resist pattern as a mask on each wafer in the lot, thereby forming a circuit pattern corresponding to the pattern on the mask, in each shot area on each wafer. Thereafter, devices such as semiconductor elements are produced through execution of formation of circuit patterns in upper layers and others. The semiconductor device production method as described above permits us to produce the semiconductor devices with extremely fine circuit patterns at high throughput.

Figure 23:
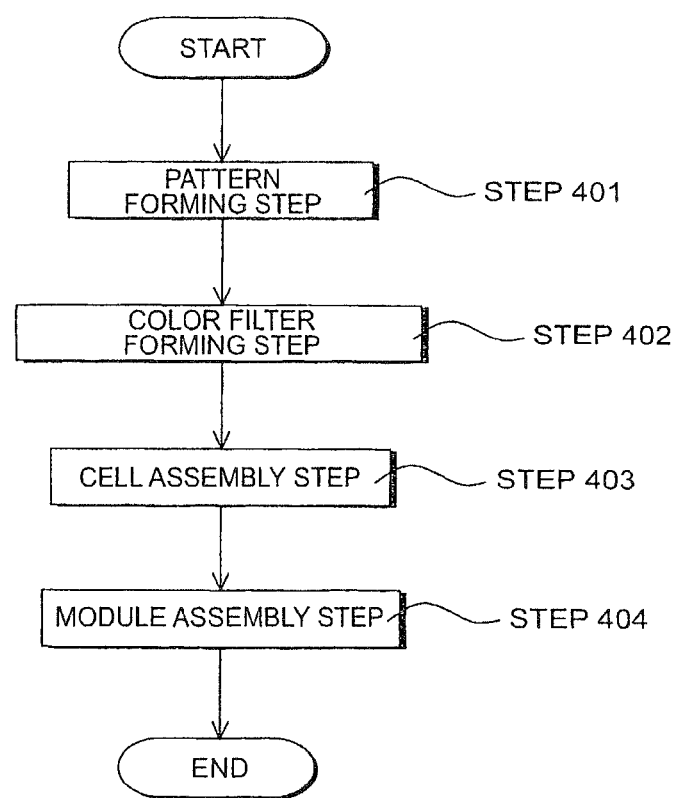
FIG. 23 is a flowchart of a procedure of obtaining a liquid crystal display element as a microdevice.

The exposure apparatus of the foregoing embodiment can also be applied to production of a liquid crystal display element as a microdevice in such a manner that predetermined patterns (a circuit pattern, an electrode pattern, etc.) are formed on a plate (glass substrate). An example of a procedure of this production will be described below with reference to the flowchart of FIG. 23. In FIG. 23, pattern forming step 401 is to execute a so-called photolithography step of transcribing a pattern on a mask onto a photosensitive substrate (a glass substrate coated with a resist or the like) by use of the exposure apparatus of the foregoing embodiment. In this photolithography step, the predetermined patterns including a number of electrodes and others are formed on the photosensitive substrate. Thereafter, the exposed substrate is subjected to steps such as a development step, an etching step, a resist removing step, etc., to form the predetermined patterns on the substrate, followed by next color filter forming step 402.

The next color filter forming step 402 is to form a color filter in which a number of sets of three dots corresponding to R (Red), G (Green), and B (Blue) are arrayed in a matrix, or in which a plurality of sets of filters of three stripes of R, G and B are arrayed in the direction of horizontal scan lines. After the color filter forming step 402, cell assembly step 403 is carried out. The cell assembly step 403 is to assemble a liquid crystal panel (liquid crystal cell), using the substrate with the predetermined patterns obtained in the pattern forming step 401, the color filter obtained in the color filter forming step 402, and so on.

In the cell assembly step 403, for example, a liquid crystal is poured into the space between the substrate with the predetermined patterns obtained in the pattern forming step 401 and the color filter obtained in the color filter forming step 402 to produce the liquid crystal panel (liquid crystal cell). Thereafter, module assembly step 404 is carried out to attach such components as an electric circuit, a backlight, and so on for implementing the display operation of the assembled liquid crystal panel (liquid crystal cell), to complete the liquid crystal display element. The production method of the liquid crystal display element described above permits us to produce the liquid crystal display elements with extremely fine circuit patterns at high throughput.

The foregoing embodiment is arranged to use the KrF excimer laser light (wavelength: 248 nm) or the ArF excimer laser light (wavelength: 193 nm) as the exposure light, but, without having to be limited to this, the present invention can also be applied to other appropriate laser light sources, e.g., an $F_2$ laser light source for supplying laser light of the wavelength of 157 nm. Furthermore, the foregoing embodiment described the present invention, using the exposure apparatus with the illumination optical apparatus as an example, but it is apparent that the present invention can be applied to ordinary illumination optical apparatus for illuminating the surface to be illuminated, except for the mask and wafer.

Figure 1B:
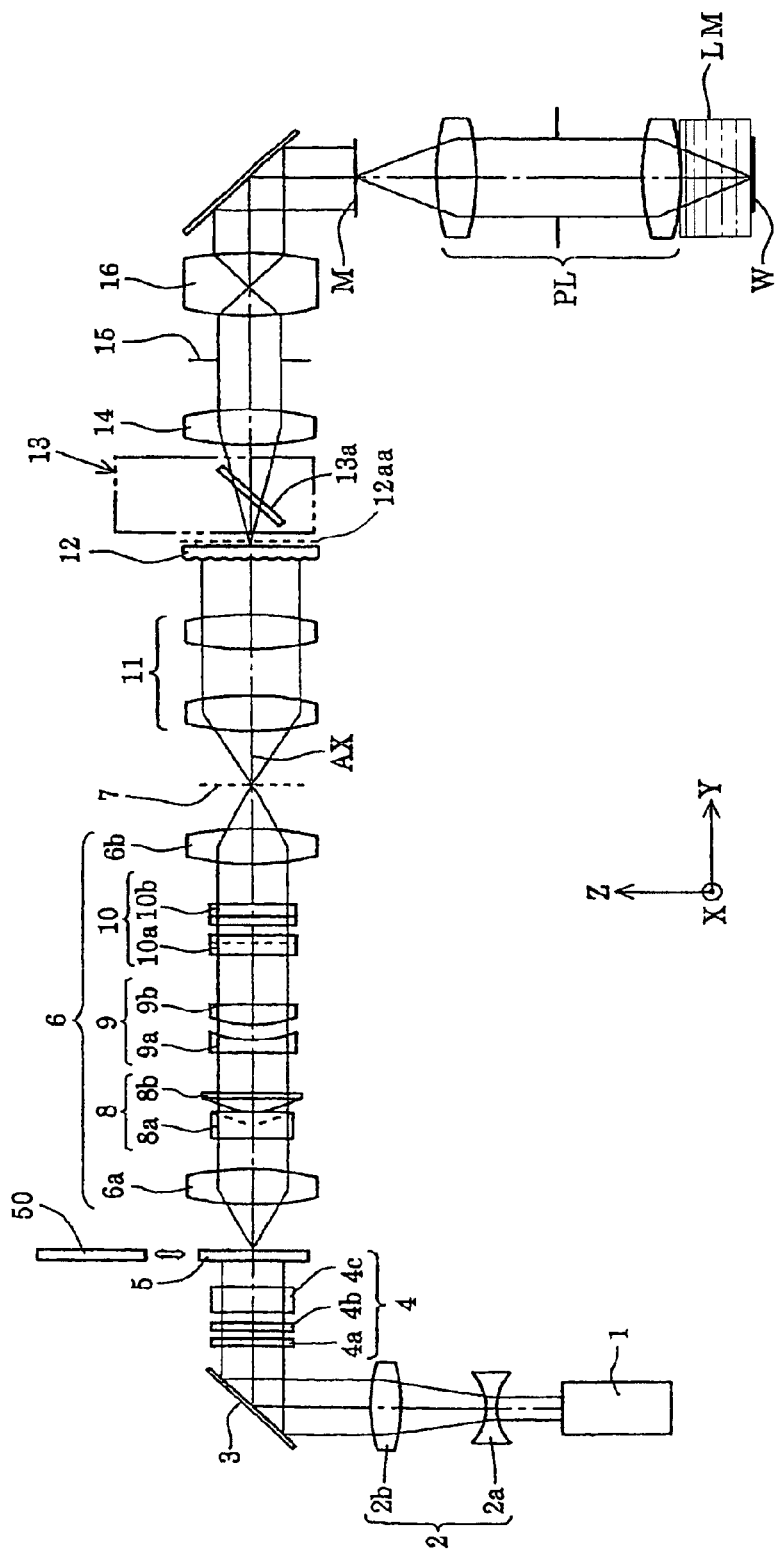
FIG. 1(b) is an illustration schematically showing a configuration of an exposure apparatus with an illumination optical apparatus that includes a liquid LM in the optical path between the projection optical system and the photosensitive substrate according to an embodiment of the present invention.

In the foregoing embodiment, it is also possible to apply the so-called liquid immersion method, which is a technique of filling a medium (typically, a liquid LM) with a refractive index larger than 1.1 in the optical path between the projection optical system and the photosensitive substrate, as shown in FIG. 1(b). In this case, the technique of filling the liquid in the optical path between the projection optical system and the photosensitive substrate can be selected from the technique of locally filling the liquid as disclosed in PCT International Publication No. WO99/49504, the technique of moving a stage holding a substrate as an exposure target in a liquid bath as disclosed in Japanese Patent Application Laid-Open No. 6-124873, the technique of forming a liquid bath in a predetermined depth on a stage and holding the substrate therein as disclosed in Japanese Patent Application Laid-Open No. 10-303114, and so on. The PCT International Publication No. WO99/49504, Japanese Patent Application Laid-Open No. 6-124873, and Japanese Patent Application Laid-Open No. 10-303114 are incorporated herein by reference.

The liquid is preferably one that is transparent to the exposure light, that has the refractive index as high as possible, and that is stable against the projection optical system and the photoresist applied to the surface of the substrate; for example, where the exposure light is the KrF excimer laser light or the ArF excimer laser light, pure water or deionized water can be used as the liquid. Where the $F_2$ laser light is used as the exposure light, the liquid can be a fluorinated liquid capable of transmitting the $F_2$ laser light, e.g., fluorinated oil or perfluoropolyether (PFPE).

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

What is claimed is:

1. An illumination optical apparatus which illuminates a pattern on a mask with illumination light, the illumination optical apparatus comprising:
    an optical integrator arranged in an optical path of the illumination light; and
    a polarization member made of optical material with optical rotatory power, which is arranged in the optical path on an incidence side of the optical integrator, and which rotates a polarization direction of the illumination light in a state of substantially a linear polarization,
    wherein a pupil plane of the illumination optical apparatus is substantially located at a rear focal plane of the optical integrator,
    wherein the illumination light from the polarization member is irradiated onto the pattern through the pupil plane of the illumination optical apparatus, and
    wherein a direction of an optic axis of the optical material is arranged substantially coincident with a direction of an optical axis of the illumination optical apparatus at a location where the optical material is arranged so that the polarization member rotates the polarization direction of the illumination light on the basis of the optical rotatory power.

2. The illumination optical apparatus according to claim 1, wherein the illumination light from the pupil plane is irradiated onto the pattern in a polarization state in which a principal component is S-polarized light.

3. The illumination optical apparatus according to claim 1, wherein the polarization member changes a polarization state of the illumination light, distributed in a region on the pupil plane away from the optical axis, so that a polarization direction of the illumination light in the region is substantially coincident with a circumferential direction about the optical axis.

4. The illumination optical apparatus according to claim 3, wherein a first thickness of the polarization member in an optical path of a first light of the illumination light is different from a second thickness of the polarization member in an optical path of a second light of the illumination light, and
    the first light passes through a first position in the region on the pupil plane, and the second light passes through a second position in the region different from the first position on the pupil plane.

5. The illumination optical apparatus according to claim 4, further comprising a polarization changing member which is arranged in the optical path on an incidence side of the polarization member, and which changes a polarization state of the illumination light from a first polarization state, in which a principal component is a substantially single polarization light, into a second polarization state different from the first polarization state.

6. The illumination optical apparatus according to claim 5, wherein a principal component of the second polarization state is linearly polarized light polarized in a substantially single direction.

7. The illumination optical apparatus according to claim 5, wherein the substantially single polarization light is linearly polarized light or elliptically polarized light.

8. The illumination optical apparatus according to claim 5, wherein the polarization changing member comprises at least one of a half wavelength plate and a quarter wavelength plate.

9. The illumination optical apparatus according to claim 4, wherein the region on the pupil plane is an annular region about the optical axis.

10. The illumination optical apparatus according to claim 5, wherein the region on the pupil plane comprises a plurality of substantially discrete regions within an annular region about the optical axis.

11. The illumination optical apparatus according to claim 4, wherein the region on the pupil plane comprises a plurality of substantially discrete regions which are aligned along a circumference about the optical axis.

12. The illumination optical apparatus according to claim 11, wherein the plurality of the regions on the pupil plane comprises a pair of regions which is arranged symmetrically with respect to the optical axis.

13. The illumination optical apparatus according to claim 4, wherein the optical integrator comprises a fly's eye lens, and a surface of an exit side of the fly's eye lens is arranged at a position substantially equivalent to the pupil plane.

14. The illumination optical apparatus according to claim 3, further comprising a polarization changing member which is arranged in the optical path on an incidence side of the polarization member, and which changes a polarization state of the illumination light from a first polarization state, in which a principal component is a substantially single polarization light, into a second polarization state different from the first polarization state.

15. The illumination optical apparatus according to claim 14, wherein a principal component of the second polarization state is linearly polarized light polarized in a substantially single direction.

16. The illumination optical apparatus according to claim 14, wherein the substantially single polarization light is linearly polarized light or elliptically polarized light.

17. The illumination optical apparatus according to claim 14, wherein the polarization changing member comprises at least one of a half wavelength plate and a quarter wavelength plate.

18. The illumination optical apparatus according to claim 3, wherein the region on the pupil plane is an annular region about the optical axis.

19. The illumination optical apparatus according to claim 3, wherein the region on the pupil plane comprises a plurality of substantially discrete regions within an annular region about the optical axis.

20. The illumination optical apparatus according to claim 3, wherein the region on the pupil plane comprises a plurality of substantially discrete regions which are aligned along a circumference about the optical axis.

21. The illumination optical apparatus according to claim 20, wherein the plurality of substantially discrete regions on the pupil plane comprises a pair of regions which is arranged symmetrically with respect to the optical axis.

22. The illumination optical apparatus according to claim 3, wherein the optical integrator comprises a fly's eye lens, and a surface of an exit side of the fly's eye lens is arranged at a position substantially equivalent to the pupil plane.

23. An exposure apparatus which exposes a substrate with light from a pattern on a mask, the exposure apparatus comprising:
 a stage which holds the substrate;
 the illumination optical apparatus as defined in Claim 1 which illuminates the pattern; and
 a projection optical system which projects an image of the pattern, illuminated by the illumination optical apparatus, onto the substrate.

24. The exposure apparatus according to claim 23, wherein the image of the pattern is projected onto the substrate through a liquid disposed in an optical path between the projection optical system and the substrate.

25. The exposure apparatus according to claim 23, wherein the illumination light from the pupil plane is irradiated onto the pattern in a polarization state in which a principal component is S-polarized light.

26. The exposure apparatus according to claim 23, wherein the polarization member changes a polarization state of the illumination light, distributed in a region on the pupil plane away from the optical axis, so that a polarization direction of the illumination light in the region is substantially coincident with a circumferential direction about the optical axis.

27. The exposure apparatus according to claim 26, wherein a first thickness of the polarization member in an optical path of a first light of the illumination light is different from a second thickness of the polarization member in an optical path of a second light of the illumination light, and
 the first light passes through a first position in the region on the pupil plane, and the second light passes through a second position in the region different from the first position on the pupil plane.

28. The exposure apparatus according to claim 27, further comprising a polarization changing member which is arranged in the optical path on an incidence side of the polarization member, and which changes a polarization state of the illumination light from a first polarization state, in which a principal component is a substantially single polarization light, into a second polarization state different from the first polarization state.

29. The exposure apparatus according to claim 28, wherein a principal component of the second polarization state is linearly polarized light polarized in a substantially single direction.

30. The exposure apparatus according to claim 28, wherein the substantially single polarization light is linearly polarized light or elliptically polarized light.

31. The exposure apparatus according to claim 28, wherein the polarization changing member comprises at least one of a half wavelength plate and a quarter wavelength plate.

32. The exposure apparatus according to claim 27, wherein the region on the pupil plane is an annular region about the optical axis.

33. The exposure apparatus according to claim 27, wherein the region on the pupil plane comprises a plurality of substantially discrete regions within an annular region about the optical axis.

34. The exposure apparatus according to claim 27, wherein the region on the pupil plane comprises a plurality of substantially discrete regions which are aligned along a circumference about the optical axis.

35. The exposure apparatus according to claim 34, wherein the plurality of substantially discrete regions on the pupil plane comprises a pair of regions which is arranged symmetrically with respect to the optical axis.

36. The exposure apparatus according to claim 27, wherein the optical integrator comprises a fly's eye lens, and a surface of an exit side of the fly's eye lens is arranged at a position substantially equivalent to the pupil plane.

37. The exposure apparatus according to claim 26, further comprising a polarization changing member which is arranged in the optical path on an incidence side of the polarization member, and which changes a polarization state of the illumination light from a first polarization state, in which a principal component is a substantially single polarization light, into a second polarization state different from the first polarization state.

38. The exposure apparatus according to claim 37, wherein a principal component of the second polarization state is linearly polarized light polarized in a substantially single direction.

39. The exposure apparatus according to claim 37, wherein the substantially single polarization light is linearly polarized light or elliptically polarized light.

40. The exposure apparatus according to claim 37, wherein the polarization changing member comprises at least one of a half wavelength plate and a quarter wavelength plate.

41. The exposure apparatus according to claim 26, wherein the region on the pupil plane is an annular region about the optical axis.

42. The exposure apparatus according to claim 26, wherein the region on the pupil plane comprises a plurality of substantially discrete regions within an annular region about the optical axis.

43. The exposure apparatus according to claim 26, wherein the region on the pupil plane comprises a plurality of substantially discrete regions which are aligned along a circumference about the optical axis.

44. The exposure apparatus according to claim 43, wherein the plurality of substantially discrete regions on the pupil plane comprises a pair of regions which is arranged symmetrically with respect to the optical axis.

45. The exposure apparatus according to claim 26, wherein the optical integrator comprises a fly's eye lens, and a surface of an exit side of the fly's eye lens is arranged at a position substantially equivalent to the pupil plane.

46. A device manufacturing method, comprising:
transferring a pattern to a substrate by using the exposure apparatus as defined in claim 23; and
developing the substrate to which the pattern is transferred.

47. An exposure method for exposing a substrate with light from a pattern on a mask, the exposure method comprising:
holding the substrate by a stage;
illuminating the pattern by using the illumination optical apparatus as defined in claim 1; and
projecting an image of the pattern, illuminated by the illumination optical apparatus, onto the substrate.

48. The exposure method according to claim 47, wherein the image of the pattern is projected onto the substrate through a liquid disposed in an optical path between the projection optical system and the substrate.

49. A device manufacturing method, comprising:
transferring a pattern to a substrate by using the exposure method as defined in claim 47; and
developing the substrate to which the pattern is transferred.

* * * * *